US011823921B2

(12) United States Patent
Iwao et al.

(10) Patent No.: US 11,823,921 B2
(45) Date of Patent: Nov. 21, 2023

(54) SUBSTRATE PROCESSING DEVICE AND SUBSTRATE PROCESSING METHOD

(71) Applicant: SCREEN Holdings Co., Ltd., Kyoto (JP)

(72) Inventors: Michinori Iwao, Kyoto (JP); Shuichi Yasuda, Kyoto (JP); Kazuhiro Fujita, Kyoto (JP); Noriyuki Kikumoto, Kyoto (JP); Takahiro Yamaguchi, Kyoto (JP)

(73) Assignee: SCREEN Holdings Co., Ltd.

( * ) Notice: Subject to any disclaimer, the term of this patent is extended or adjusted under 35 U.S.C. 154(b) by 701 days.

(21) Appl. No.: 16/626,674

(22) PCT Filed: Jun. 28, 2018

(86) PCT No.: PCT/JP2018/024699
§ 371 (c)(1),
(2) Date: Dec. 26, 2019

(87) PCT Pub. No.: WO2019/004390
PCT Pub. Date: Jan. 3, 2019

(65) Prior Publication Data
US 2020/0227285 A1 Jul. 16, 2020

(30) Foreign Application Priority Data

Jun. 30, 2017 (JP) .................................. 2017-129539
Jun. 15, 2018 (JP) ................................ 2018-114922
Jun. 15, 2018 (JP) ................................ 2018-114923

(51) Int. Cl.
*A01G 25/09* (2006.01)
*B05B 17/00* (2006.01)
*H01L 21/67* (2006.01)

(52) U.S. Cl.
CPC .... *H01L 21/6715* (2013.01); *H01L 21/67253* (2013.01)

(58) Field of Classification Search
CPC .......... H01L 21/6715; H01L 21/67253; H01L 21/67017; H01L 21/67028; H01L 21/306;
(Continued)

(56) References Cited

U.S. PATENT DOCUMENTS

2006/0233952 A1 10/2006 Nakashima et al. .......... 427/240
2011/0240067 A1 10/2011 Kishimoto et al. ............. 134/33
(Continued)

FOREIGN PATENT DOCUMENTS

CN 102208329 A 10/2011
JP 2002-170803 A 6/2002
(Continued)

OTHER PUBLICATIONS

International Search Report dated Aug. 21, 2018 in corresponding PCT International Application No. PCT/JP2018/024699.
(Continued)

*Primary Examiner* — Ismail A Muse
(74) *Attorney, Agent, or Firm* — OSTROLENK FABER LLP

(57) ABSTRACT

A substrate processing apparatus includes a suctioning unit for suctioning a processing liquid existing inside a processing liquid pipe that communicates with a discharge port, and a controller. In the suctioning step, the controller executes a suctioning step of suctioning the processing liquid existing inside the processing liquid pipe by the suctioning unit. The controller selectively executes a first suctioning step of retracting a leading end surface of the processing liquid and disposing the leading end surface of the processing liquid after suctioning in a preliminarily set standby position inside the processing liquid pipe, and a second suctioning step of retracting the leading end surface of the processing liquid further back than the standby position. After the second suctioning step, the controller further executes a standby
(Continued)

position disposing step of supplying the processing liquid to the processing liquid pipe by the processing liquid supplying unit and disposing the leading end surface of the processing liquid in the standby position.

30 Claims, 23 Drawing Sheets

(58) Field of Classification Search
CPC ............. H01L 21/304; H01L 21/67051; H01L 21/6708
See application file for complete search history.

(56) References Cited

U.S. PATENT DOCUMENTS

| | | | |
|---|---|---|---|
| 2015/0114432 A1* | 4/2015 | Iwata | ........................ B08B 3/02 134/28 |
| 2015/0159642 A1 | 6/2015 | Sasa et al. | |
| 2016/0045938 A1 | 2/2016 | Aomatsu et al. | |
| 2017/0256426 A1 | 9/2017 | Iwao | |

FOREIGN PATENT DOCUMENTS

| | | |
|---|---|---|
| JP | 2002-205022 A | 7/2002 |
| JP | 2006-302934 A | 11/2006 |
| JP | 2009-188113 A | 8/2009 |
| JP | 2014-022495 A | 2/2014 |
| JP | 2015-109335 A | 6/2015 |
| JP | 2015-135843 A | 7/2015 |
| JP | 2016-042517 A | 3/2016 |
| JP | 2016-072337 A | 5/2016 |
| TW | 201334875 A | 9/2013 |
| TW | 201540377 A | 11/2015 |
| TW | 201613012 A | 4/2016 |

OTHER PUBLICATIONS

Written Opinion dated Aug. 21, 2018 in corresponding PCT International Application No. PCT/JP2018/024699.

International Preliminary Report on Patentability (Chapter I) dated Jan. 9, 2020 with a Notification from the International Bureau (Form PCT/IB/326) in corresponding PCT International Application No. PCT/JP2018/024699 in Japanese.

English translation of the International Preliminary Report on Patentability(Chapter I) dated Jan. 9, 2020 with a Notification from the International Bureau (Form PCT/IB/338) in corresponding PCT International Application No. PCT/JP2018/024699.

* cited by examiner

FIG. 7B

| | Chemical liquid valve 36 | Rinse liquid valve 38 | Hydrophobizing agent supply valve 60, 61 | Organic solvent supply valve 90 |
|---|---|---|---|---|
| First guard opposing state | ○ | ○ | × | × |
| Second guard opposing state | × | × | ○ | × |
| Third guard opposing state | × | × | × | ○ |

(○ : opening action permitted, × : opening action prohibited)

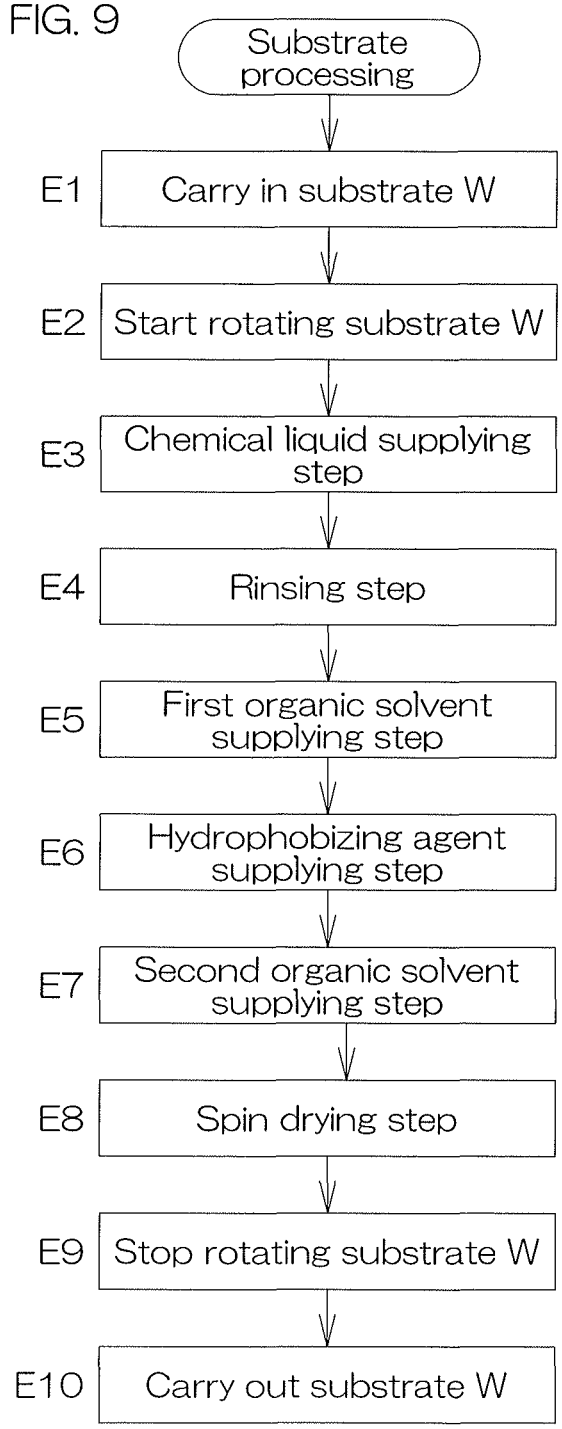

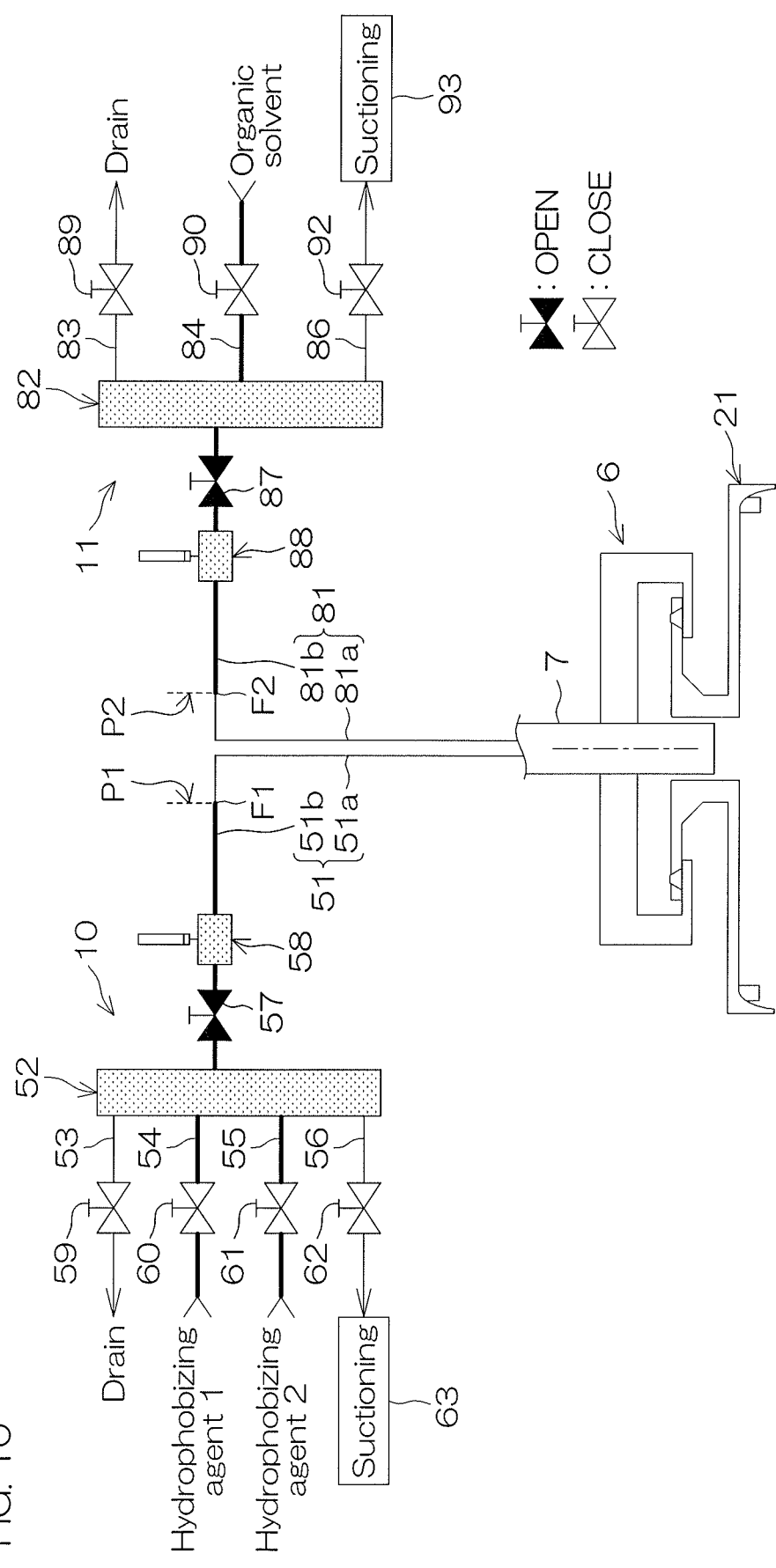

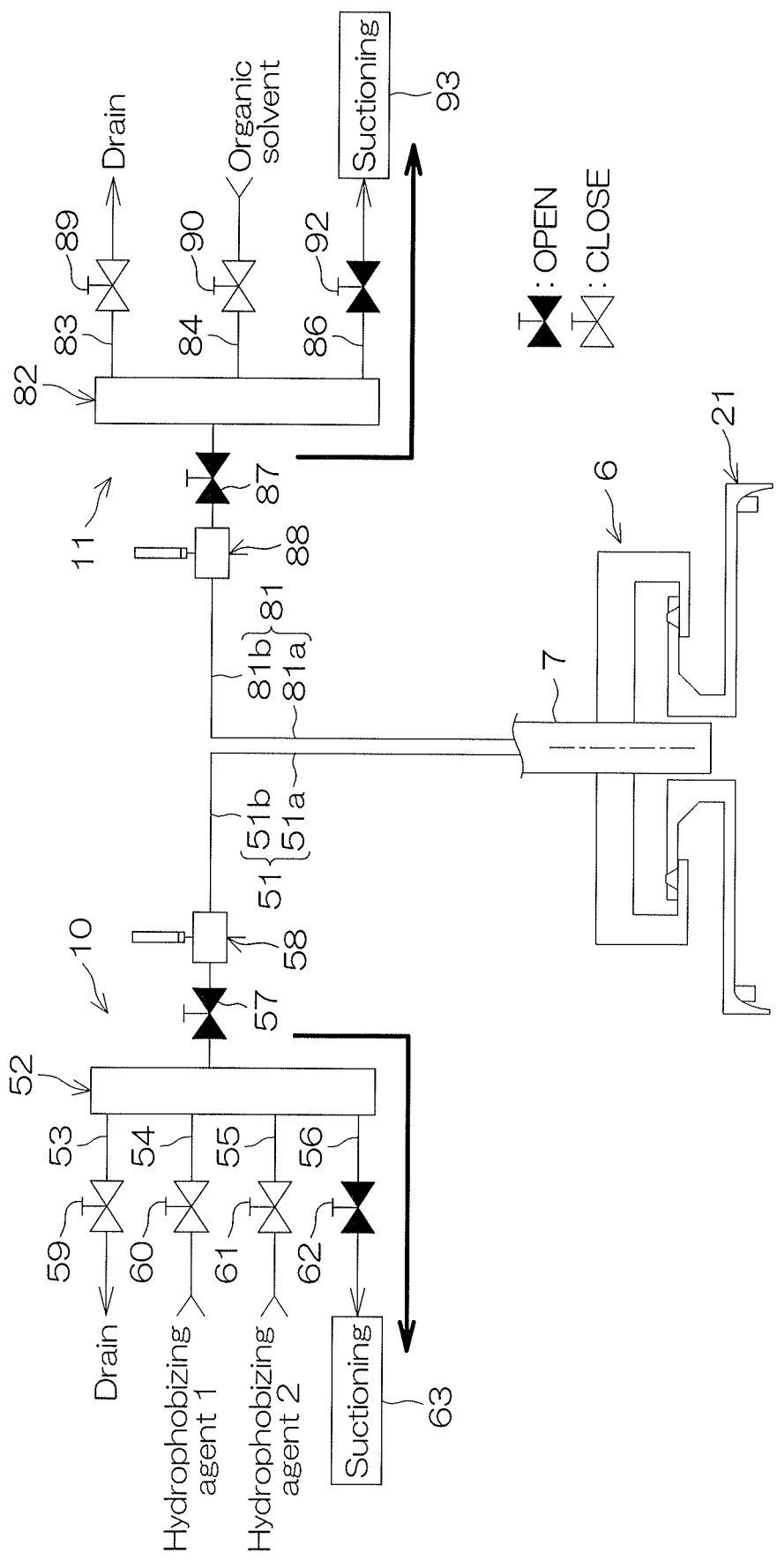

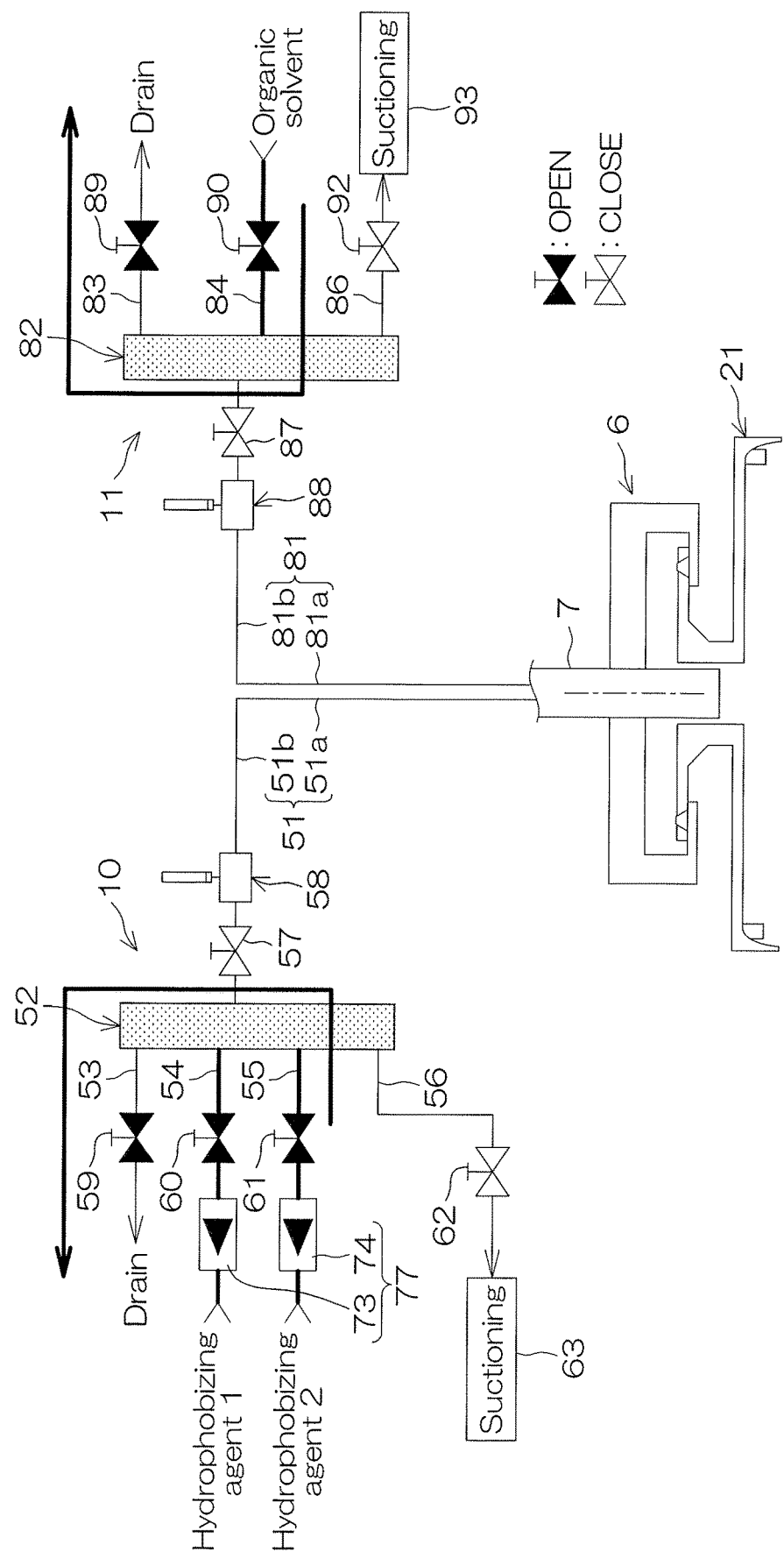

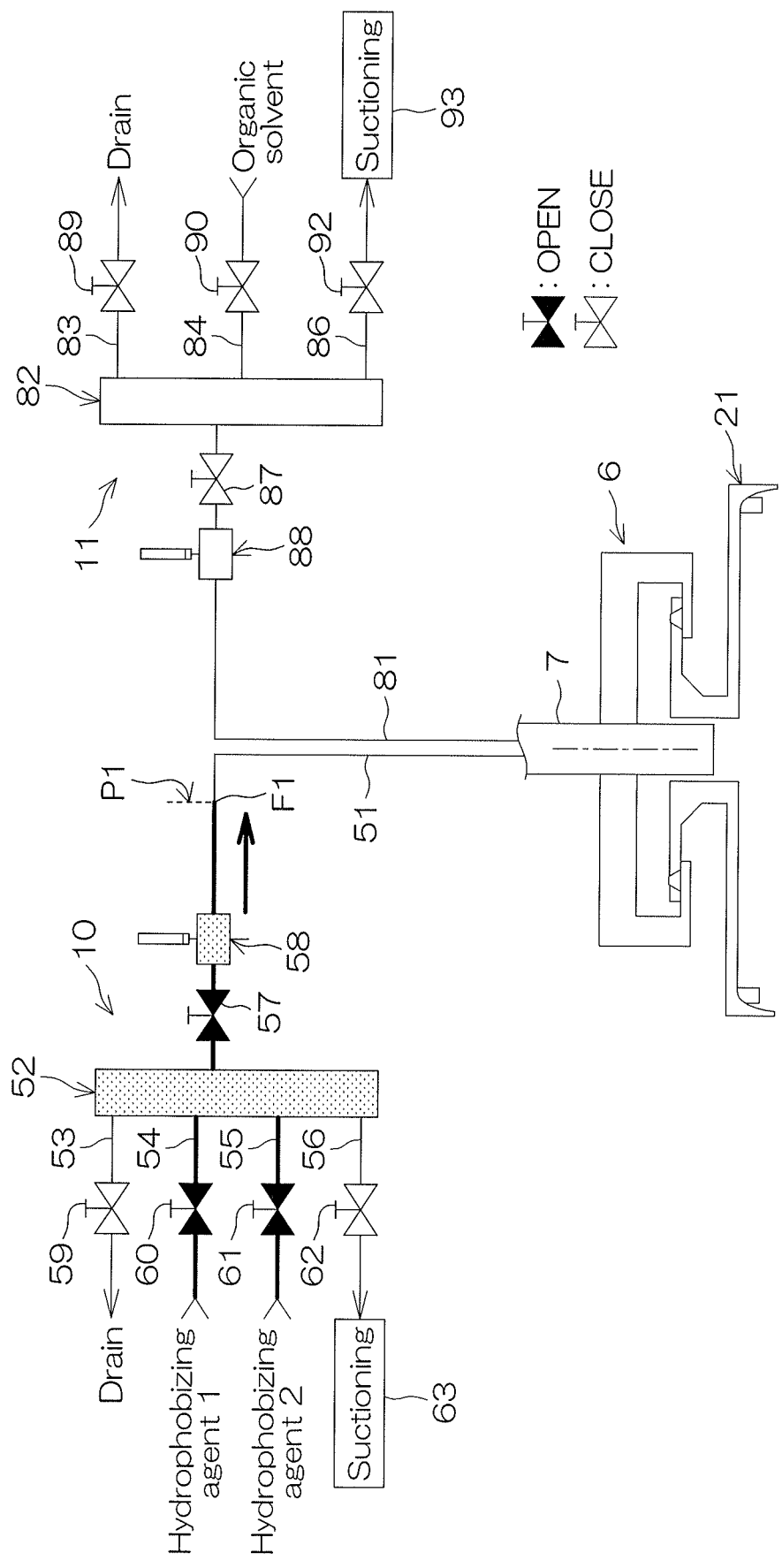
FIG. 12B Charging step (T3)

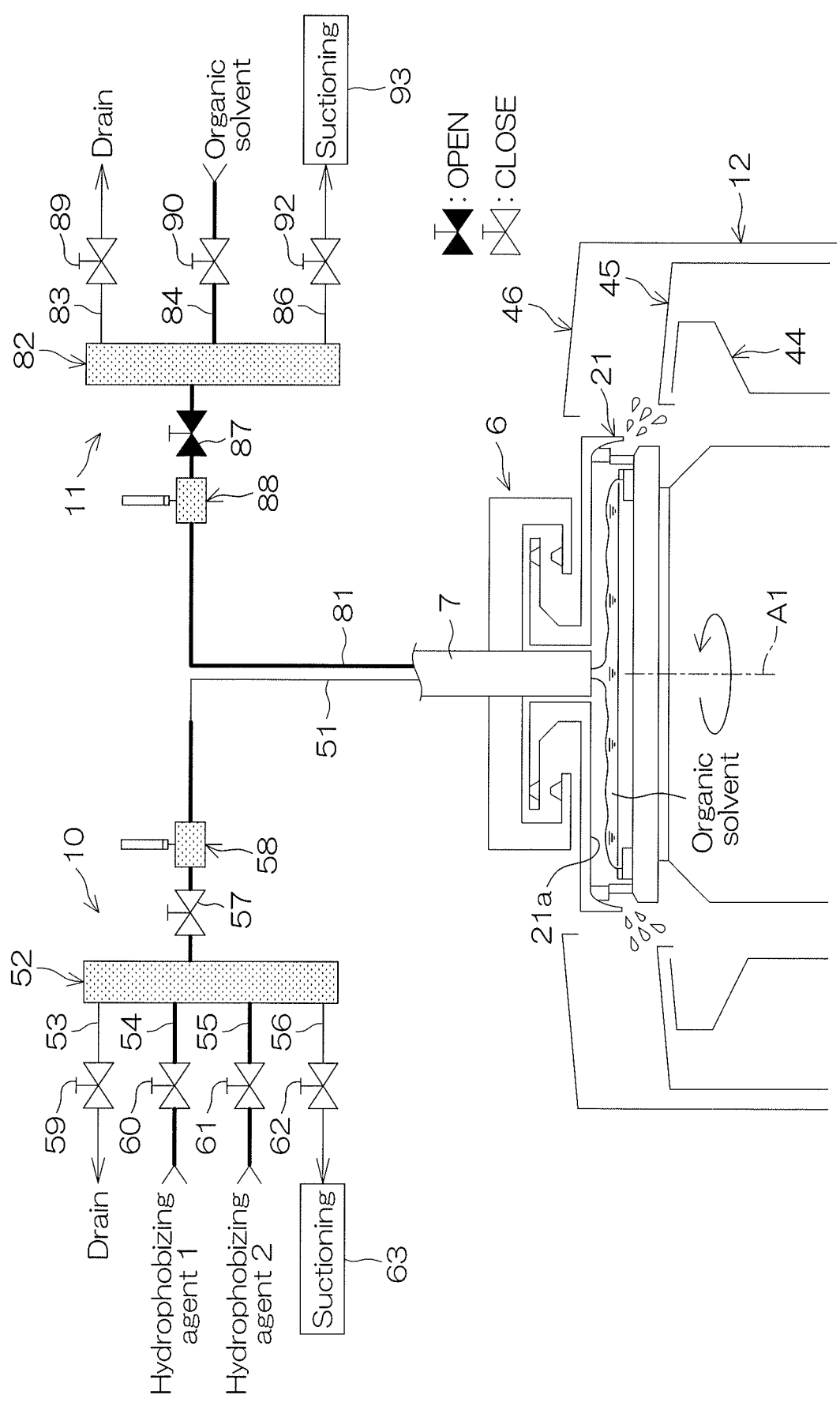
FIG. 13 First organic solvent supplying step (E5)

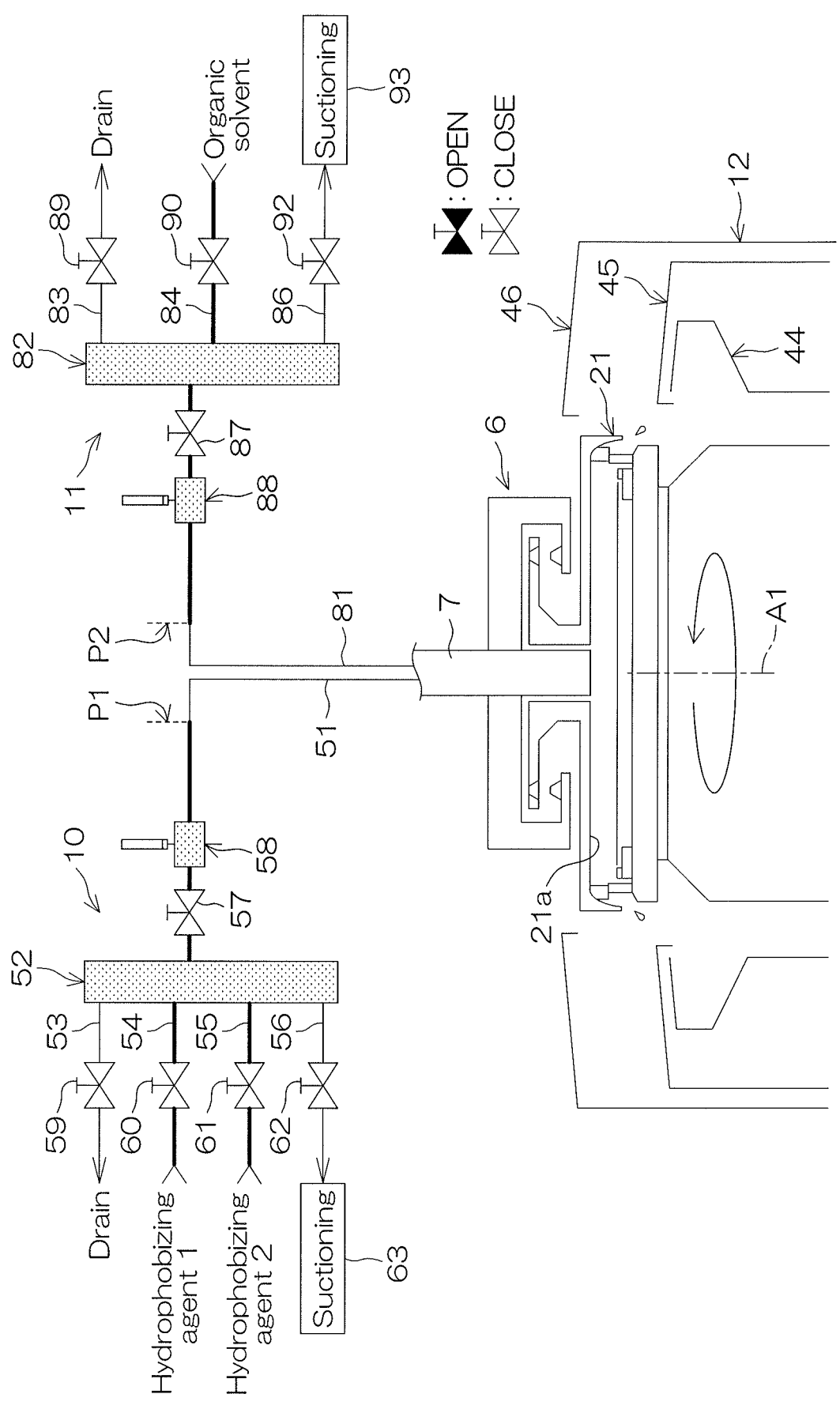
FIG. 14 Spinning-off step

FIG. 15 Hydrophobizing agent supplying step (E6)
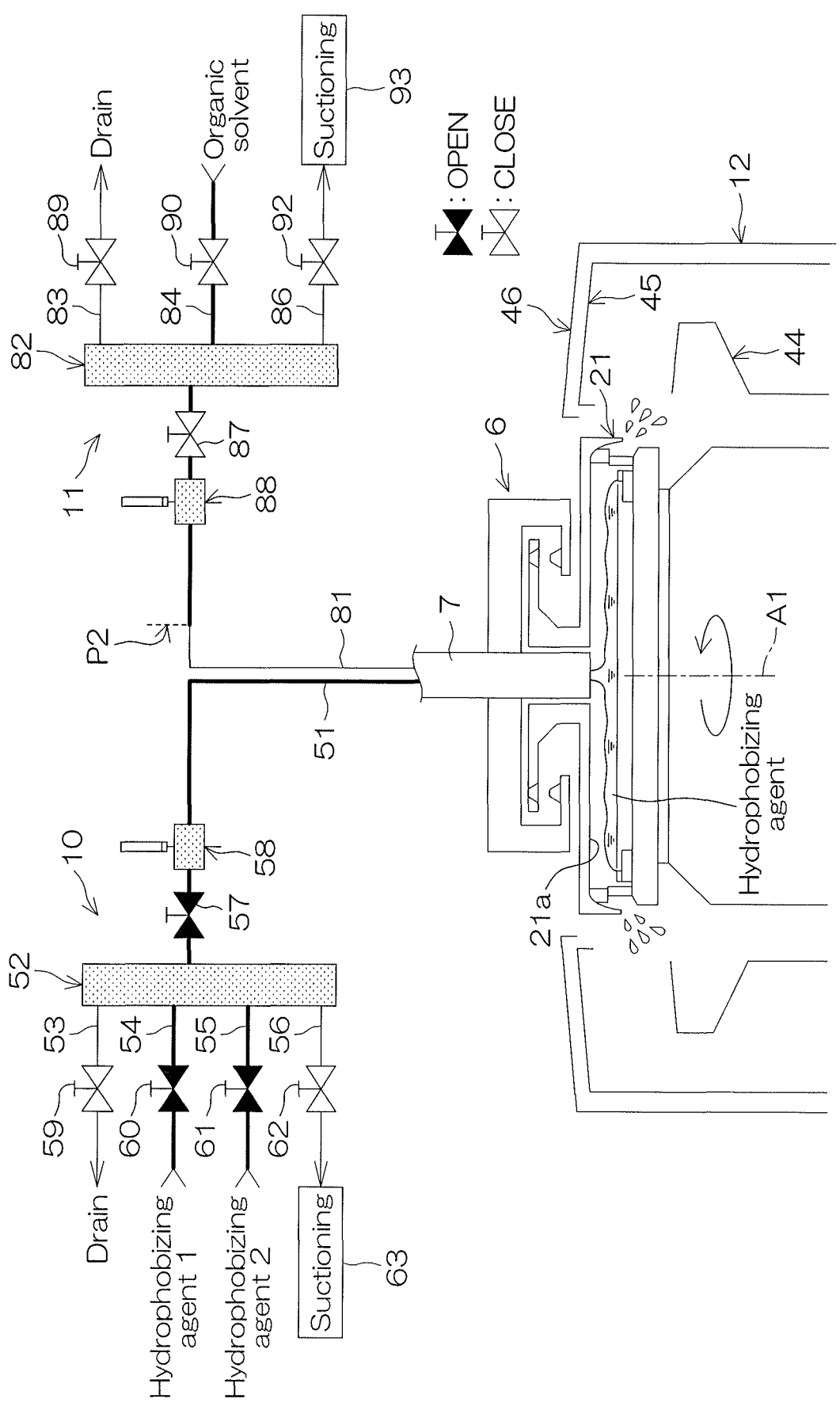

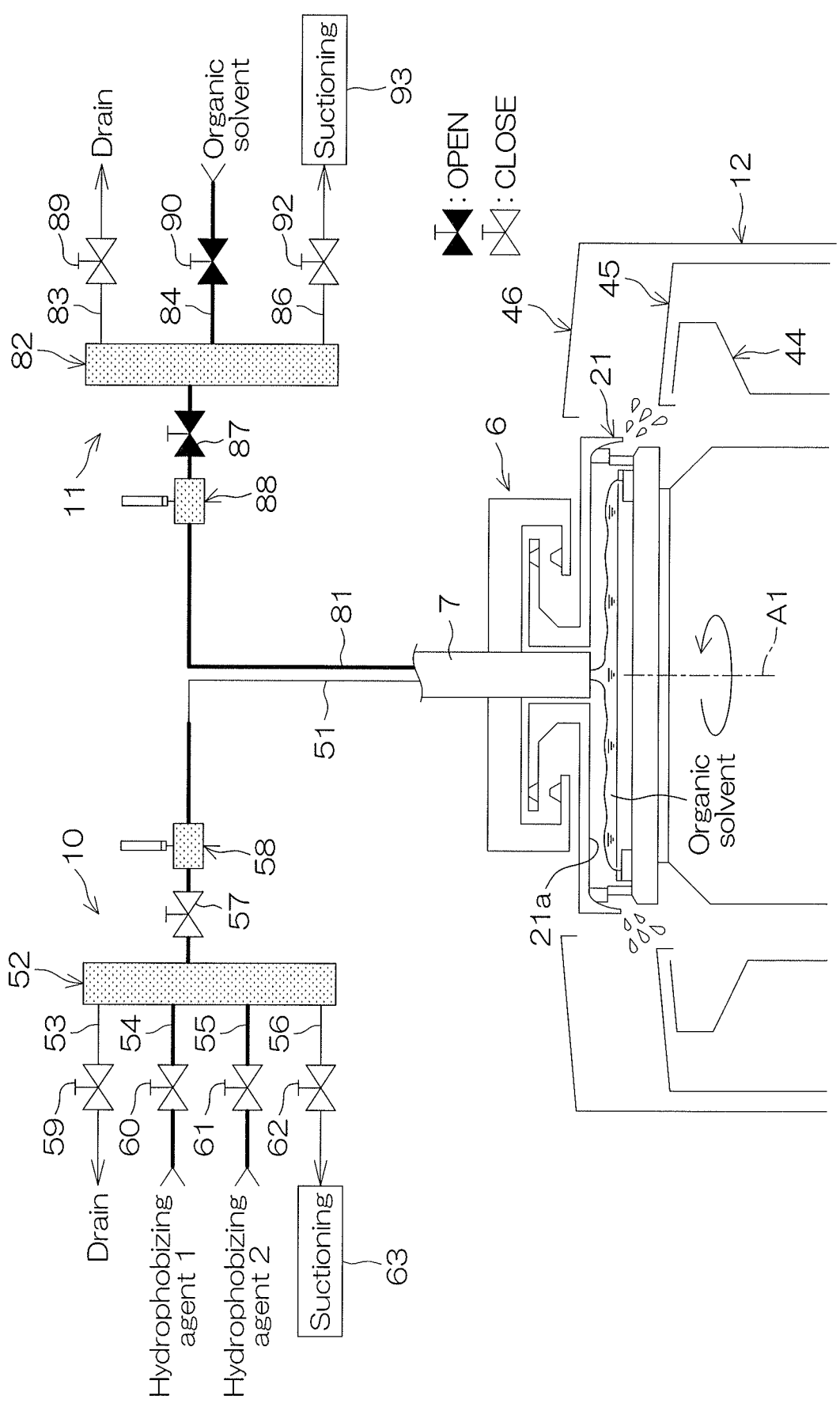
FIG. 16 Second organic solvent supplying step (E7)

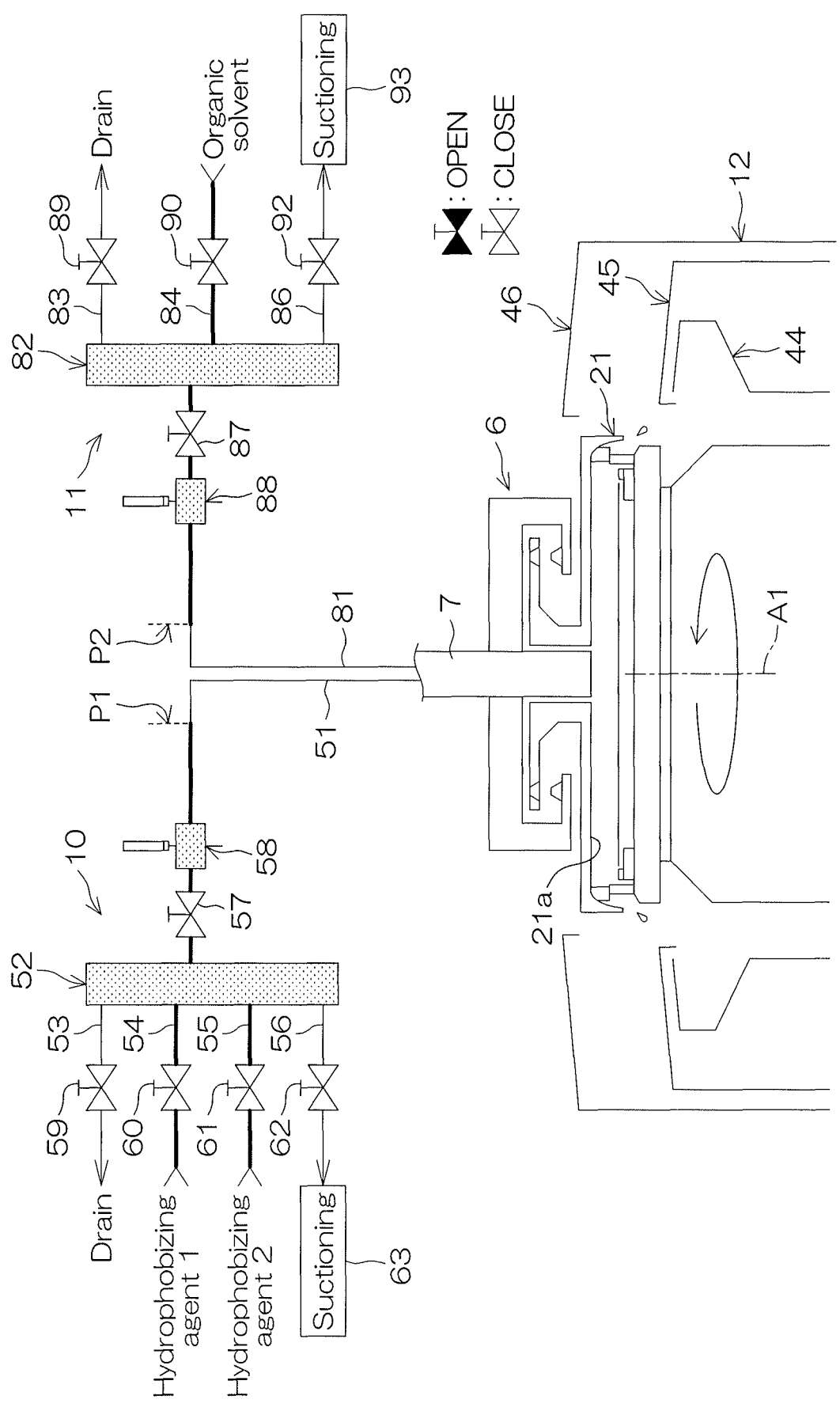

SUBSTRATE PROCESSING DEVICE AND SUBSTRATE PROCESSING METHOD

CROSS-REFERENCE TO RELATED APPLICATIONS

The present application is a 35 U.S.C. §§ 371 national phase conversion of PCT/JP2018/024699, filed Jun. 28, 2018, which claims priority to Japanese Patent Application No. 2017-129539, 2018-114922 and 2018-114923, filed Jun. 30, 2017, Jun. 15, 2018 and Jun. 15, 2018, respectively, the contents of both of which are incorporated herein by reference. The PCT International Application was published in the Japanese language.

TECHNICAL FIELD

The present invention relates to a substrate processing apparatus and a substrate processing method. Examples of substrates to be processed include semiconductor wafers, substrates for liquid crystal display devices, substrates for FPDs (flat panel displays) such as organic EL (electroluminescence) displays, etc., substrates for optical disks, substrates for magnetic disks, substrates for magneto-optical disks, substrates for photomasks, ceramic substrates, substrates for solar cells, etc.

BACKGROUND ART

In a manufacturing process for a semiconductor device, a liquid crystal display device, etc., a substrate processing apparatus arranged to process substrates such as semiconductor wafers, glass substrates for liquid crystal display devices is used. A single substrate processing type substrate processing apparatus that processes substrates one by one includes, for example, a spin chuck that horizontally holds and rotates a substrate, a processing liquid supplying unit that supplies a processing liquid to the substrate held by the spin chuck, an opposing member that opposes the substrate held by the spin chuck from the upper side, a central axis nozzle housed in a center opening which is formed in a central portion of the opposing member, a processing liquid pipe through which the processing liquid is supplied to the central axis nozzle, and a suctioning device that suctions the processing liquid inside the processing liquid pipe. The opposing member is a member arranged to be brought close to an upper surface of the substrate to shield the upper surface of the substrate from a peripheral space thereof. It is known that after discharge of the processing liquid from the central axis nozzle, the processing liquid is suctioned and a leading end surface of the processing liquid in the processing liquid pipe is retracted.

CITATION LIST

Patent Literature

Patent Literature 1: Japanese Patent Application Publication No. 2015-135843

SUMMARY OF INVENTION

Technical Problem

In a case where the processing liquid in the processing liquid pipe is used as it is for next substrate processing, it is only required to retract the leading end surface of the processing liquid to an extent that the processing liquid will not drip from a discharge port. Meanwhile, in a case where the processing liquid in the processing liquid pipe cannot be used for next substrate processing (for example, in a case where the processing liquid in the processing liquid pipe is deactivated or a temperature of the processing liquid is lowered), prior to the next substrate processing, there is a need for discharging all the processing liquid in the processing liquid pipe out of the pipe by suctioning.

The inventors of the present invention focused on such a difference in the need for suctioning, and examined that two suctioning methods with which a position of the leading end surface after suctioning differs are adopted for one processing liquid pipe. However, in this case, since the leading end surface is different each other after suctioning, a time period from opening of a processing liquid valve to discharge of the processing liquid from the discharge port is different each other. A processing time is set with reference to an opening timing of the processing liquid valve. Thus, when the time period from the opening of the processing liquid valve to the discharge of the processing liquid from the discharge port is different each other, an actual processing liquid supply time varies depending on each substrate. As a result, there is a concern that processing may vary depending on each substrate.

Therefore, an object of the present invention is to provide a substrate processing apparatus and a substrate processing method with which a processing liquid can be discharged from a discharge port at a common timing regardless of a difference in the suctioning method of a processing liquid pipe, and thereby, uniform processing can be performed on a substrate.

Solution to Problem

The present invention provides a substrate processing apparatus including a substrate holding unit that holds a substrate, a processing liquid pipe that communicates with a discharge port for discharging a processing liquid toward a major surface of the substrate held by the substrate holding unit, a processing liquid supplying unit for supplying the processing liquid to the processing liquid pipe, a suctioning unit for suctioning the processing liquid existing inside the processing liquid pipe, and a controller that controls the processing liquid supplying unit and the suctioning unit, wherein the controller executes a processing liquid supplying step of supplying the processing liquid to the processing liquid pipe by the processing liquid supplying unit in order to discharge the processing liquid from the discharge port, and a suctioning step of suctioning the processing liquid existing inside the processing liquid pipe by the suctioning unit, in the suctioning step, the controller selectively executes a first suctioning step of retracting a leading end surface of the processing liquid and disposing the leading end surface of the processing liquid after suctioning in a preliminarily set standby position inside the processing liquid pipe, and a second suctioning step of retracting the leading end surface of the processing liquid further back than the standby position, and after the second suctioning step, the controller further executes a standby position disposing step of supplying the processing liquid to the processing liquid pipe by the processing liquid supplying unit and disposing the leading end surface of the processing liquid in the standby position.

With the present arrangement, in the suctioning step, the processing liquid existing inside the processing liquid pipe is suctioned and the leading end surface of the processing liquid is retracted. The suctioning step includes the first suctioning step of disposing the leading end surface of the processing liquid in the standby position and the second suctioning step of retracting the leading end surface of the processing liquid further back than the standby position. By supplying the processing liquid to the processing liquid pipe in the standby position disposing step performed after the second suctioning step, the leading end surface of the processing liquid is brought forward and the leading end surface of the processing liquid is disposed in the standby position. Therefore, even in a case where either of the first suctioning step and the second suctioning step is executed, it is possible to dispose the leading end surface of the processing liquid in the common standby position before next discharge of the processing liquid. Thereby, regardless of the type of the suctioning step of suctioning the inside of the processing liquid pipe, it is possible to discharge the processing liquid from the discharge port at a common timing. Therefore, it is possible to perform uniform processing on the substrate.

In a preferred embodiment of the present invention, the substrate processing apparatus further includes a connection pipe connected to the processing liquid pipe. The suctioning unit may include a suction pipe connected to the connection pipe, and a suctioning device connected to the suction pipe. In the second suctioning step, the controller may execute a step of retracting the leading end surface of the processing liquid to the suctioning device side with respect to the connection position of the suction pipe in the connection pipe by the suctioning device.

With the present arrangement, in the second suctioning step, it is possible to retract the leading end surface of the processing liquid to the suctioning device side with respect to the connection position of the suction pipe in the connection pipe. Thereby, it is possible to empty the processing liquid pipe and the connection pipe. Therefore, it is possible to effectively suppress or prevent the processing liquid from being deteriorating or lowering in temperature in the processing liquid piping and the connection piping. In a case where the processing liquid is discharged from the discharge port after the second suctioning step, the leading end surface of the processing liquid existing in the processing liquid pipe is in the standby position. Even in a case where the leading end surface of the processing liquid is retracted from the connection pipe in the second suction step, it is possible to make a timing at which the processing liquid is discharged from the discharge port after opening a processing liquid valve the same timing as a timing at which the processing liquid is discharged from the discharge port after the first suctioning step.

In a preferred embodiment of the present invention, the discharge port is immovable in the direction along the major surface of the substrate held by the substrate holding unit.

With the present arrangement, the discharge port is provided to be immovable in the direction along the major surface of the substrate.

In a case where the processing liquid inside the processing liquid pipe is deteriorated or a temperature of the processing liquid is lowered, prior to start of the next substrate processing, there is a need for discharging all the processing liquid in the processing liquid pipe out of the pipe. However, in a case where the discharge port is provided to be immovable in the direction along the major surface of the substrate held by the substrate holding unit, it is not possible to discharge the processing liquid by a method of discharging the processing liquid from the discharge port. Therefore, there is a need for discharging the processing liquid remaining inside the processing liquid pipe by using suctioning. In a case where the discharge port opposes the major surface of the substrate, in order to prevent the processing liquid from dripping from the discharge port (so-called dripping), there is a need for suctioning the inside of the processing liquid pipe after discharging the processing liquid from the discharge port and retracting the leading end surface of the processing liquid. These two types of suctioning have different purposes of suctioning. Thus, the leading end surface is different after suctioning.

In a case where the suctioning step includes the first suctioning step of disposing the leading end surface of the processing liquid in the standby position and the second suctioning step of retracting the leading end surface of the processing liquid further back than the standby position, and even in a case where either of the first suctioning step and the second suctioning step is executed, it is possible to dispose the leading end surface of the processing liquid in the standby position before next discharge of the processing liquid. Therefore, in a case where the suctioning for preventing the dripping (first suctioning step) and the suctioning for discharging the processing liquid (second suctioning step) are performed, and even in a case where either of the suctioning for preventing the dripping and the suctioning for discharging the processing liquid is executed, it is possible to dispose the leading end surface of the processing liquid in the standby position before next discharge of the processing liquid.

Thereby, regardless of the type of the suctioning step of suctioning the inside of the processing liquid pipe (the type of suctioning for preventing dripping or suctioning for discharging the processing liquid), it is possible to discharge the processing liquid from the discharge port at a common timing.

In a preferred embodiment of the present invention, the substrate processing apparatus further includes an opposing member having a substrate opposing surface that opposes the major surface of the substrate held by the substrate holding unit and is immovable in the direction along the major surface of the substrate. The discharge port may be formed in the substrate opposing surface.

With the present arrangement, in a case where the discharge port is formed in the immovable substrate opposing surface, it is not possible to move the discharge port in the direction along the major surface of the substrate held by the substrate holding unit. In this case, regardless of the type of the suctioning step of suctioning the inside of the processing liquid pipe (the type of suctioning for preventing dripping or suctioning for discharging the processing liquid), it is possible to discharge the processing liquid from the discharge port at a common timing.

In a preferred embodiment of the present invention, the substrate processing apparatus further includes a sensor for detecting the processing liquid existing in the processing liquid pipe. The controller may further execute a determining step of determining whether or not the leading end surface of the processing liquid after the standby position disposing step is disposed in the standby position by a detection result by the sensor.

With the present arrangement, since the determination is based on the a detection result by the sensor, it is possible to accurately determine whether or not the leading end surface of the processing liquid after the standby position disposing step is disposed in the standby position.

In a preferred embodiment of the present invention, the substrate processing apparatus further includes a first sensor for detecting the leading end surface of the processing liquid existing in the processing liquid pipe. In the determining step, the controller may execute a first determining step of determining whether or not the leading end surface of the processing liquid is in the standby position based on a detection result by the first sensor in parallel to the standby position disposing step.

With the present arrangement, whether or not the leading end surface of the processing liquid is disposed in the standby position is determined by the first sensor in parallel to the standby position disposing step. By actually detecting the position of the leading end surface of the processing liquid in parallel to the standby position disposing step, it is possible to accurately dispose the leading end surface of the processing liquid in the standby position after the standby position disposing step.

In a preferred embodiment of the present invention, the standby position is an area between a first position and a second position which are determined at a predetermined distance in a flow direction of the processing liquid in the processing liquid pipe, the second position disposed on the discharge port side with respect to the first position. The first sensor may include a first existence/non-existence sensor for detecting whether or not there is the processing liquid at the first position of the standby position, and a second existence/non-existence sensor for detecting whether or not there is the processing liquid at the second position of the standby position. In the first determining step, the controller may determine that the leading end surface of the processing liquid is disposed in the standby position in a case where existence of the processing liquid at the first position is detected by the first existence/non-existence sensor and non-existence of the processing liquid at the second position is detected by the second existence/non-existence sensor.

With the present arrangement, in a case where the existence of the processing liquid at the first position of the standby position is detected by the first existence/non-existence sensor and the non-existence of the processing liquid at the second position of the standby position is detected by the second existence/non-existence sensor, it is determined that the leading end surface of the processing liquid is disposed in the standby position. Thereby, it is possible to accurately detect that the leading end surface of the processing liquid is disposed in the standby position.

In another preferred embodiment of the present invention, the first sensor includes a camera for taking an image of the leading end surface of the processing liquid existing in the processing liquid pipe. In the first determining step, the controller may execute a step of making determination based on an imaging result by the camera.

With the present arrangement, the image of the leading end surface of the processing liquid is taken by the camera. By the imaging result by the camera, whether or not the leading end surface of the processing liquid is in the standby position is determined. Thereby, it is possible to accurately detect that the leading end surface of the processing liquid is disposed in the standby position.

In a preferred embodiment of the present invention, the substrate processing apparatus further includes a second sensor for detecting a flow rate of the processing liquid flowing through the processing liquid pipe in the standby position disposing step. The controller may further execute a second determining step of determining whether or not the leading end surface of the processing liquid after the standby position disposing step is disposed in the standby position based on a detection result of the second sensor.

With the present arrangement, the second sensor for detecting the flow rate of the processing liquid supplied to the processing liquid pipe in the standby position disposing step is provided. Based on the detection result of the second sensor, whether or not the leading end surface of the processing liquid after the standby position disposing step is disposed in the standby position is determined. When it is possible to accurately grasp the flow rate of the processing liquid in the standby position disposing step, by managing a processing liquid supply time in the standby position disposing step, it is possible to accurately control the leading end surface of the processing liquid after the standby position disposing step. Thereby, it is possible to accurately detect whether or not the leading end surface of the processing liquid after the standby position disposing step is in the standby position.

In another preferred embodiment of the present invention, the processing liquid supplying unit includes a processing liquid supply pipe through which the processing liquid is supplied to the processing liquid pipe, a processing liquid drain pipe to which the processing liquid from the processing liquid supply pipe is supplied selectively with respect to the processing liquid pipe, and a pipe width adjusting unit for adjusting a width of the processing liquid pipe and/or the processing liquid drain pipe so that a pressure loss of a liquid at the time of flowing through the processing liquid pipe and a pressure loss of the liquid at the time of flowing through the processing liquid drain pipe are in a fixed relationship. The second sensor may be arranged to detect a flow rate of the processing liquid flowing through the processing liquid supply pipe. In the second determining step, the controller may execute a flow rate acquiring step of, while guiding out the processing liquid from the processing liquid supply pipe not to the processing liquid pipe but to the processing liquid drain pipe, detecting a flow rate of the processing liquid flowing through the processing liquid supply pipe by the second sensor, and acquiring the flow rate of the processing liquid flowing through the processing liquid pipe in the standby position disposing step.

With the present arrangement, adjustment is made so that the pressure loss of the liquid at the time of flowing through the processing liquid pipe and the pressure loss of the liquid at the time of flowing through the processing liquid drain pipe are in a fixed relationship. Thus, by detecting the flow rate of the processing liquid guided from the processing liquid supply pipe to the processing liquid drain pipe by the second sensor, it is possible to accurately acquire the flow rate of the processing liquid flowing through the processing liquid supply pipe in the standby position disposing step. Thereby, it is possible to accurately acquire the flow rate of the processing liquid in the standby position disposing step without supplying the processing liquid to the processing liquid pipe.

In another preferred embodiment of the present invention, the pipe width adjusting unit includes a unit for adjusting the width of the processing liquid pipe and/or the processing liquid drain pipe so that the pressure loss of the liquid at the time of flowing through the processing liquid pipe matches the pressure loss of the liquid at the time of flowing through the processing liquid drain pipe.

With the present arrangement, adjustment is made so that the pressure loss of the liquid at the time of flowing through the processing liquid pipe matches the pressure loss of the liquid at the time of flowing through the processing liquid drain pipe. Thus, by detecting the flow rate of the processing liquid guided from the processing liquid supply pipe to the processing liquid drain pipe by the second sensor, it is possible to accurately acquire the flow rate of the processing liquid supplied to the processing liquid supply pipe in the standby position disposing step. Thereby, it is possible to accurately acquire the flow rate of the processing liquid in the standby position disposing step without supplying the processing liquid to the processing liquid pipe.

The pipe width adjusting unit may include an orifice.

The pipe width adjusting unit may include a motor needle.

The pipe width adjusting unit may include a fixed needle.

In a preferred embodiment of the present invention, the controller further executes an error notifying step of notifying of an error in a case where in the determining step, it is determined that the leading end surface of the processing liquid is not disposed in the standby position after the standby position disposing step.

With the present arrangement, when the leading end surface of the processing liquid is not disposed in the standby position after the standby position disposing step, an actual processing liquid supply time varies depending on each substrate. As a result, there is a concern that processing may vary depending on each substrate. When it is determined that the leading end surface of the processing liquid is not disposed in the standby position after the standby position disposing step, an error is notified. Thus, an operator can recognize the occurrence of such a situation. Thereby, it is possible to prevent variation of the processing in advance.

In a preferred embodiment of the present invention, the controller further executes a step of not executing the standby position disposing step or suspending the standby position disposing step that has already been executed in a case where in the determining step, it is determined that the leading end surface of the processing liquid is not disposed in the standby position after the standby position disposing step.

With the present arrangement, when the leading end surface of the processing liquid is not disposed in the standby position after the standby position disposing step, an actual processing liquid supply time varies depending on each substrate. As a result, there is a concern that processing may vary depending on each substrate. When it is determined that the leading end surface of the processing liquid is not disposed in the standby position after the standby position disposing step, the standby position disposing step is not executed or the standby position disposing step that is already being executed is suspended. Thus, it is possible to prevent the variation of the processing in advance.

In another preferred embodiment of the present invention, the substrate processing apparatus further includes a first liquid surface sensor for detecting that the leading end surface of the processing liquid reaches a predetermined first detection position in the processing liquid pipe, and a speed detecting unit that detects speed of the processing liquid passing through the processing liquid pipe. In the standby position disposing step, the controller acquires a passing through timing at which the leading end surface of the processing liquid has passed through the first detection position based on an output of the first liquid surface sensor, and acquires the speed of the leading end surface of the processing liquid detected by the speed detecting unit, and disposes the leading end surface of the processing liquid in the standby position based on the passing through timing and the speed of the processing liquid.

With the present arrangement, the timing of the leading end surface of the processing liquid passing through the first detection position and the speed of the leading end surface of the processing liquid passing through the processing liquid pipe are detected. Based on the detected timing of passing and the detected speed, the leading end surface of the processing liquid is disposed in the standby position. Therefore, it is possible to accurately dispose the leading end surface of the processing liquid in the standby position. Thus, it is possible to optimize the amount of the processing liquid to be supplied to the substrate. Consequently, it is possible to favorably process the substrate by using the processing liquid and suppress the variation of the processing between the substrates.

In another preferred embodiment of the present invention, the speed detecting unit includes a second liquid surface sensor for detecting that the leading end surface of the processing liquid reaches a second detection position set on the downstream side of the first detection position, and the controller detects the speed of the processing liquid passing through the processing liquid pipe based on a first passing through timing at which the leading end surface of the processing liquid has been detected by the first liquid surface sensor, and a second passing through timing at which the leading end surface of the processing liquid has been detected by the second liquid surface sensor.

With the present arrangement, the speed of the leading end surface of the processing liquid passing through the processing liquid pipe is detected based on the first passing through timing and the second passing through timing. Thereby, it is possible to detect the speed of the leading end surface of the processing liquid passing through the processing liquid pipe with a simple arrangement without providing a speed sensor, etc.

In a preferred embodiment of the present invention, the suctioning unit includes a first changeable suctioning unit for suctioning the processing liquid inside the processing liquid pipe with changeable suction force.

With the present arrangement, the first changeable suctioning unit capable of suctioning with changeable suction force is provided. In the first suctioning step of disposing the leading end surface of the processing liquid in the standby position, suctioning is made with relatively weak suction force, and in the second suctioning step of retracting the leading end surface of the processing liquid further back than the standby position, suctioning is made with relatively strong force. Therefore, it does not take too much time for the second suctioning step. Thereby, it is possible to favorably perform both the first suctioning step and the second suctioning step.

In a preferred embodiment of the present invention, the first changeable suctioning unit includes a first suctioning device for suctioning the processing liquid inside the processing liquid pipe by a predetermined suction force, and a second suctioning device for suctioning the processing liquid inside the processing liquid pipe by suction force larger than the suction force of the first suctioning device. Further, the controller may execute a switching step of switching a suction source of the processing liquid pipe between the first suctioning device and the second suctioning device.

With the present arrangement, by switching the suction source of the processing liquid pipe between the first suctioning device that makes suctioning by the predetermined suction force and the second suctioning device that makes suctioning by the suction force larger than the suction force of the first suctioning device, it is possible to realize a change in the suction force in the processing liquid pipe with a relatively simple arrangement.

The first suctioning device may include a diaphragm type suctioning device. In this case, the substrate processing apparatus may further include a suction pipe connected to the processing liquid pipe, the suction pipe in which the diaphragm type suctioning device is interposed, and an on/off valve for opening and closing the suction pipe. A first drive source for driving the diaphragm type suctioning device and a second drive source for driving the on/off valve may be independent of each other.

If the drive source arranged to drive the diaphragm type suctioning device is common to the drive source arranged to drive the on/off valve, suctioning/cancelation of suctioning of the diaphragm type suctioning device is performed in conjunction with opening/closing of the on/off valve.

With the present arrangement, the drive source arranged to drive the diaphragm type suctioning device and the drive source arranged to drive the on/off valve are independent of each other. Thus, it is possible to perform the opening/closing of the on/off valve and the suctioning/cancelation of suctioning of the diaphragm type suctioning device are made respectively at optimal action timings.

The second suctioning device may include an ejector type suctioning device.

The changeable suctioning unit may include an ejector type suctioning device operated by a compressed fluid. The suctioning device may include a depressurized state generator to which the compressed fluid is supplied, and an electropneumatic regulator arranged to steplessly change a supply flow rate of the compressed fluid supplied to the depressurized state generator.

With the present arrangement, by adjusting the supply flow rate of the compressed fluid by the electropneumatic regulator, it is possible to adjust a depressurization degree of the depressurized state generator. Therefore, it is possible to realize the change in the suction force in the processing liquid pipe with a relatively simple arrangement.

In another preferred embodiment of the present invention, the controller may execute a parallel suctioning step of suctioning the inside of the processing liquid pipe by the changeable suctioning unit in parallel to the standby position disposing step.

With the present arrangement, in parallel to supply of the processing liquid to the processing liquid pipe, the inside of the processing liquid pipe is suctioned. The processing liquid supplied to the processing liquid pipe receives predetermined supply pressure. The suction force acts on the processing liquid that moves toward the discharge port in the processing liquid pipe in the opposite direction to the moving direction of the processing liquid. Thereby, it is possible to decelerate the processing liquid that moves through the processing liquid pipe.

In another preferred embodiment of the present invention, in the parallel suctioning step, the controller may control the changeable first suctioning unit so that suction force to suction the processing liquid pipe by the changeable suctioning unit is larger than the suction force by the changeable first suctioning unit in the suctioning step.

With the present arrangement, the suction force to suction the processing liquid in the parallel suctioning step is larger than the suction force to suction the processing liquid in the first suctioning step. Therefore, by letting the suction force act on the processing liquid, it is possible to adjust the speed of the processing liquid flowing through the processing liquid pipe.

In another preferred embodiment of the present invention, in the parallel suctioning step, the controller may control the changeable suctioning unit so that the leading end surface of the processing liquid is stopped in the standby position due to balancing between the suction force acting on the processing liquid that flows in the processing liquid pipe and supply pressure acting on the processing liquid.

With the present arrangement, in a state where the leading end surface of the processing liquid is placed in the standby position, the suction force acting on the processing liquid is balanced with the supply pressure. Thereby, it is possible to automatically stop the leading end surface of the processing liquid in the standby position.

In a preferred embodiment of the present invention, the substrate processing apparatus further includes a processing unit having the substrate holding unit and a chamber that houses the substrate holding unit, the processing unit being connected to the processing liquid pipe to perform substrate processing on the substrate by using the processing liquid. The controller may execute the standby position disposing step in preprocessing executed before the substrate processing in the processing unit. The controller may execute the second suctioning step in preprocessing executed before the substrate processing in the processing unit.

In another preferred embodiment of the present invention, the substrate processing apparatus may include a processing unit having the substrate holding unit and a chamber that houses the substrate holding unit, the processing unit being connected to the processing liquid pipe to perform substrate processing on the substrate by using the processing liquid. The controller may execute the second suctioning step in post processing executed after the substrate processing in the processing unit. The controller may execute the second suctioning step in a case where the substrate processing on a prefixed number of the substrates is ended in the processing unit. In these cases, at the time of not executing the substrate processing, it is possible to empty the processing liquid pipe (and/or the connection pipe). Thereby, it is possible to effectively suppress or prevent deterioration of the processing liquid or lowering of the temperature of the processing liquid in the processing liquid pipe (and/or the connection pipe).

The present invention provides a substrate processing method to be executed in a substrate processing apparatus including a processing liquid pipe that communicates with a discharge port, the substrate processing method includes a processing liquid supplying step of supplying a processing liquid to the processing liquid pipe in order to discharge the processing liquid from the discharge port, and a suctioning step of suctioning the processing liquid existing inside the processing liquid pipe, wherein the suctioning step includes a first suctioning step of retracting a leading end surface of the processing liquid and disposing the leading end surface in a preliminarily set standby position inside the processing liquid pipe, and a second suctioning step of retracting the leading end surface of the processing liquid further back than the standby position, and the first and second suctioning steps are selectively executed, and the substrate processing method further comprises a standby position disposing step of supplying the processing liquid to the processing liquid pipe and disposing the leading end surface of the processing liquid in the standby position after the second suctioning step.

With the present method, in the suctioning step, the processing liquid existing inside the processing liquid pipe is suctioned and the leading end surface of the processing liquid is retracted. The suctioning step includes the first suctioning step of disposing the leading end surface of the processing liquid in the standby position and the second suctioning step of retracting the leading end surface of the processing liquid further back than the standby position. By supplying the processing liquid to the processing liquid pipe in the standby position disposing step performed after the second suctioning step, the leading end surface of the processing liquid is brought forward and the leading end surface of the processing liquid is disposed in the standby position. Therefore, even in a case where either of the first suctioning step and the second suctioning step is executed, it is possible to dispose the leading end surface of the processing liquid in the common standby position before next discharge of the processing liquid. Thereby, regardless of the type of the suctioning step of suctioning the inside of the processing liquid pipe, it is possible to discharge the processing liquid from the discharge port at a common timing. Therefore, it is possible to perform uniform processing on the substrate.

In a preferred embodiment of the present invention, the substrate processing apparatus includes a connection pipe connected to the processing liquid pipe, a suction pipe connected to the connection pipe, and a suctioning device connected to the suction pipe, and the second suctioning step includes a step of retracting the leading end surface of the processing liquid to the suctioning device side with respect to the connection position of the suction pipe in the connection pipe by the suctioning device.

With the present method, in the second suctioning step, it is possible to retract the leading end surface of the processing liquid to the suctioning device side with respect to the connection position of the suction pipe in the connection pipe. Thereby, it is possible to empty the processing liquid pipe and the connection pipe. Therefore, it is possible to effectively suppress or prevent the processing liquid from being deteriorating or lowering in temperature in the processing liquid piping and the connection piping. In a case where the processing liquid is discharged from the discharge port after the second suctioning step, the leading end surface of the processing liquid existing in the processing liquid pipe is in the standby position. Even in a case where the leading end surface of the processing liquid is retracted from the connection pipe in the second suction step, it is possible to make a timing at which the processing liquid is discharged from the discharge port after opening a processing liquid valve the same timing as a timing at which the processing liquid is discharged from the discharge port after the first suctioning step.

In a preferred embodiment of the present invention, the substrate processing method further includes a determining step of determining whether or not the leading end surface of the processing liquid after the standby position disposing step is disposed in the standby position by a detection result by a sensor for detecting the processing liquid existing in the processing liquid pipe.

With the present method, since the determination is based on the a detection result by the sensor, it is possible to accurately determine whether or not the leading end surface of the processing liquid after the standby position disposing step is disposed in the standby position.

In a preferred embodiment of the present invention, the substrate processing method further includes a first determining step of determining whether or not the leading end surface of the processing liquid is in the standby position based on a detection result by a first sensor for detecting the leading end surface of the processing liquid existing in the processing liquid pipe in parallel to the standby position disposing step.

With the present method, whether or not the leading end surface of the processing liquid is disposed in the standby position is determined by the first sensor in parallel to the standby position disposing step. By actually detecting the position of the leading end surface of the processing liquid in parallel to the standby position disposing step, it is possible to accurately dispose the leading end surface of the processing liquid is in the standby position after the standby position disposing step.

In a preferred embodiment of the present invention, the standby position is an area between a first position and a second position which are determined at a predetermined distance in a flow direction of the processing liquid in the processing liquid pipe, the second position disposed on the discharge port side with respect to the first position. The first determining step includes a step of determining that the leading end surface of the processing liquid is disposed in the standby position in a case where existence of the processing liquid at the first position of the standby position is detected by a first existence/non-existence sensor and non-existence of the processing liquid at the second position of the standby position is detected by a second existence/non-existence sensor.

With the present method, in a case where the existence of the processing liquid at the first position of the standby position is detected by the first existence/non-existence sensor and the non-existence of the processing liquid at the second position of the standby position is detected by the second existence/non-existence sensor, it is determined that the leading end surface of the processing liquid is disposed in the standby position. Thereby, it is possible to accurately detect that the leading end surface of the processing liquid is disposed in the standby position.

In another preferred embodiment of the present invention, the first sensor includes a camera for taking an image of the leading end surface of the processing liquid existing in the processing liquid pipe. The first determining step may include a step of making determination based on an imaging result of taking an image of the leading end surface of the processing liquid existing in the processing liquid pipe by the camera.

With the present method, the image of the leading end surface of the processing liquid is taken by the camera. By the imaging result by the camera, whether or not the leading end surface of the processing liquid is in the standby position is determined. Thereby, it is possible to accurately detect that the leading end surface of the processing liquid is disposed in the standby position.

In another preferred embodiment of the present invention, the substrate processing method further includes a second determining step of determining whether or not the leading end surface of the processing liquid after the standby position disposing step is disposed in the standby position based on a detection result of a second sensor for detecting a flow rate of the processing liquid flowing through the processing liquid pipe.

With the present method, the second sensor for detecting the flow rate of the processing liquid supplied to the processing liquid pipe in the standby position disposing step is provided. Based on the detection result of the second sensor, whether or not the leading end surface of the processing liquid after the standby position disposing step is disposed in the standby position is determined. When it is possible to accurately grasp the flow rate of the processing liquid in the standby position disposing step, by managing a processing liquid supply time in the standby position disposing step, it is possible to accurately control the leading end surface of the processing liquid after the standby position disposing step. Thereby, it is possible to accurately detect whether or not the leading end surface of the processing liquid after the standby position disposing step is in the standby position.

In a preferred embodiment of the present invention, the second sensor is arranged to detect a flow rate of the processing liquid flowing through the processing liquid supply pipe. The second determining step may include a flow rate acquiring step of, while guiding out the processing liquid from a processing liquid supply pipe not to the processing liquid pipe but to a processing liquid drain pipe connected to the processing liquid supply pipe, detecting the flow rate of the processing liquid flowing through the processing liquid supply pipe by the second sensor, and acquiring the flow rate of the processing liquid flowing through the processing liquid pipe in the standby position disposing step.

With the present method, adjustment is made so that the pressure loss of the liquid at the time of flowing through the processing liquid pipe and the pressure loss of the liquid at the time of flowing through the processing liquid drain pipe are in a fixed relationship. Thus, by detecting the flow rate of the processing liquid guided from the processing liquid supply pipe to the processing liquid drain pipe by the second sensor, it is possible to accurately acquire the flow rate of the processing liquid flowing through the processing liquid supply pipe in the standby position disposing step. Thereby, it is possible to accurately acquire the flow rate of the processing liquid in the standby position disposing step without supplying the processing liquid to the processing liquid pipe.

In another preferred embodiment of the present invention, the substrate processing method further includes a first liquid surface detecting step of detecting that the leading end surface of the processing liquid has reached a predetermined first detection position in the processing liquid pipe, and a speed detecting step of detecting speed of the processing liquid passing through the processing liquid pipe. The standby position disposing step may include a step of disposing the leading end surface of the processing liquid in the standby position based on a passing through timing of the leading end surface of the processing liquid passing through the first detection position, and the speed of the processing liquid passing through the processing liquid pipe.

With the present method, the timing of the leading end surface of the processing liquid passing through the first detection position and the speed of the leading end surface of the processing liquid passing through the processing liquid pipe are detected. Based on the detected timing of passing and the detected speed, the leading end surface of the processing liquid is disposed in the standby position. Therefore, it is possible to accurately dispose the leading end surface of the processing liquid in the standby position. Thus, it is possible to optimize the amount of the processing liquid to be supplied to the substrate. Consequently, it is possible to favorably process the substrate by using the processing liquid and suppress the variation of the processing between the substrates.

In another preferred embodiment of the present invention, the speed detecting step includes a step of detecting the speed of the processing liquid passing through the processing liquid pipe based on a first passing through timing at which the leading end surface of the processing liquid has passed through the first detection position, and a second passing through timing at which the leading end surface of the processing liquid passing has passed through a second detection position set on the downstream side of the first detection position.

With the present method, the speed of the leading end surface of the processing liquid passing through the processing liquid pipe is detected based on the first passing through timing and the second passing through timing. Thereby, it is possible to detect the speed of the leading end surface of the processing liquid passing through the processing liquid pipe with a simple arrangement without providing a speed sensor, etc.

In a preferred embodiment of the present invention, the substrate processing method further includes an error notifying step of notifying of an error in a case where by the determining step, it is determined that the leading end surface of the processing liquid is not disposed in the standby position after the standby position disposing step.

With the present method, when the leading end surface of the processing liquid is not disposed in the standby position after the standby position disposing step, an actual processing liquid supply time varies depending on each substrate. As a result, there is a concern that processing may vary depending on each substrate. When it is determined that the leading end surface of the processing liquid is not disposed in the standby position after the standby position disposing step, an error is notified. Thus, an operator can recognize the occurrence of such a situation. Thereby, it is possible to prevent variation of the processing in advance.

In a preferred embodiment of the present invention, the substrate processing method further includes a step of not executing the standby position disposing step or suspending the standby position disposing step that has already started in a case where by the determining step, it is determined that the leading end surface of the processing liquid is not disposed in the standby position after the standby position disposing step.

With the present method, when the leading end surface of the processing liquid is not disposed in the standby position after the standby position disposing step, an actual processing liquid supply time varies depending on each substrate. As a result, there is a concern that processing may vary depending on each substrate. When it is determined that the leading end surface of the processing liquid is not disposed in the standby position after the standby position disposing step, the standby position disposing step is not executed or the standby position disposing step that is already being executed is suspended. Thus, it is possible to prevent the variation of the processing in advance.

In a preferred embodiment of the present invention, the first suctioning step includes a step of suctioning the processing liquid inside the processing liquid pipe by a first suctioning device with a predetermined suction force, and the second suctioning step includes a step of suctioning the processing liquid inside the processing liquid pipe by a second suctioning device with suction force larger than the suction force.

With the present method, in the first suctioning step, the processing liquid inside the processing liquid pipe is suctioned with a predetermined suction force. In the second suctioning step, the processing liquid inside the processing liquid pipe is suctioned with suction force larger than the suction force. By switching the suctioning step between the first suctioning step and the second suctioning step, it is possible to realize a change in the suction force in the processing liquid pipe with a relatively simple arrangement.

In another preferred embodiment of the present invention, the substrate processing method further includes a parallel suctioning step of suctioning the inside of the processing liquid pipe in parallel to the standby position disposing step.

With the present method, in parallel to supply of the processing liquid to the processing liquid pipe, the inside of the processing liquid pipe is suctioned. The processing liquid supplied to the processing liquid pipe receives predetermined supply pressure. The suction force acts on the processing liquid that moves toward the discharge port in the processing liquid pipe in the opposite direction to the moving direction of the processing liquid. Thereby, it is possible to decelerate the processing liquid that moves through the processing liquid pipe.

In another embodiment of the present invention, suction force to suction the processing liquid pipe in the parallel suctioning step is larger than suction force to suction the processing liquid pipe in the first suctioning step.

With the present method, the suction force to suction the processing liquid in the parallel suctioning step is larger than the suction force to suction the processing liquid in the first suctioning step. Therefore, by letting the suction force act on the processing liquid, it is possible to adjust the speed of the processing liquid flowing through the processing liquid pipe.

In another embodiment of the present invention, in the parallel suctioning step, the processing liquid pipe is suctioned by such suction force that the leading end surface of the processing liquid is stopped in the standby position due to balancing between suction force acting on the processing liquid that flows in the processing liquid pipe and supply pressure acting on the processing liquid.

With the present method, in a state where the leading end surface of the processing liquid is placed in the standby position, the suction force acting on the processing liquid is balanced with the supply pressure. Thereby, it is possible to automatically stop the leading end surface of the processing liquid in the standby position.

The substrate processing apparatus may further include a processing unit having a substrate holding unit that holds a substrate and a chamber that houses the substrate holding unit, the processing unit being connected to the processing liquid pipe to perform substrate processing on the substrate by using the processing liquid. The processing unit may execute preprocessing before the substrate processing on the substrate by using the processing. The standby position disposing step may be executed in the preprocessing.

The substrate processing apparatus may further include a processing unit having a substrate holding unit that holds a substrate and a chamber that houses the substrate holding unit, the processing unit being connected to the processing liquid pipe to perform substrate processing on the substrate by using the processing liquid. The processing unit may execute preprocessing before the substrate processing on the substrate by using the processing. The second suctioning step may be executed in the preprocessing.

The substrate processing apparatus may further include a processing unit having a substrate holding unit that holds a substrate and a chamber that houses the substrate holding unit, the processing unit being connected to the processing liquid pipe to perform substrate processing on the substrate by using the processing liquid. The processing unit may execute post processing after the substrate processing on the substrate by using the processing. The second suctioning step may be executed in the post processing.

The substrate processing apparatus further may include a processing unit having a substrate holding unit that holds a substrate and a chamber that houses the substrate holding unit. The processing unit may be connected to the processing liquid pipe to perform substrate processing on the substrate by using the processing liquid. The second suctioning step may be executed after the substrate processing is executed on the prefixed number of substrates.

The aforementioned and yet other objects, features, and effects of the present invention will be made clear by the following description of preferred embodiments with reference to the attached drawings.

BRIEF DESCRIPTION OF DRAWINGS

FIG. 7B is a diagram for describing a hard interlock.

FIG. 9 is a flowchart showing a flow of substrate processing executed according to a process recipe in the processing unit.

FIG. 10 is a diagram showing a state of the processing unit before carrying a substrate into the substrate processing apparatus.

FIG. 11 is a diagram for describing a discharge suctioning step shown in FIG. 8B.

FIG. 12A is a diagram for describing a pre-dispensing step shown in FIG. 8B.

FIG. 12B is a diagram for describing a charging step shown in FIG. 8B.

FIG. 13 is a diagram for describing a first organic solvent supplying step shown in FIG. 9.

FIG. 14 is a diagram for describing a spinning-off step executed after the first organic solvent supplying step.

FIG. 15 is a diagram for describing a hydrophobizing agent supplying step shown in FIG. 9.

FIG. 16 is a diagram for describing a second organic solvent supplying step shown in FIG. 9.

FIG. 17 is a diagram for describing a spin drying step shown in FIG. 9.

DESCRIPTION OF EMBODIMENTS

Figure 1:
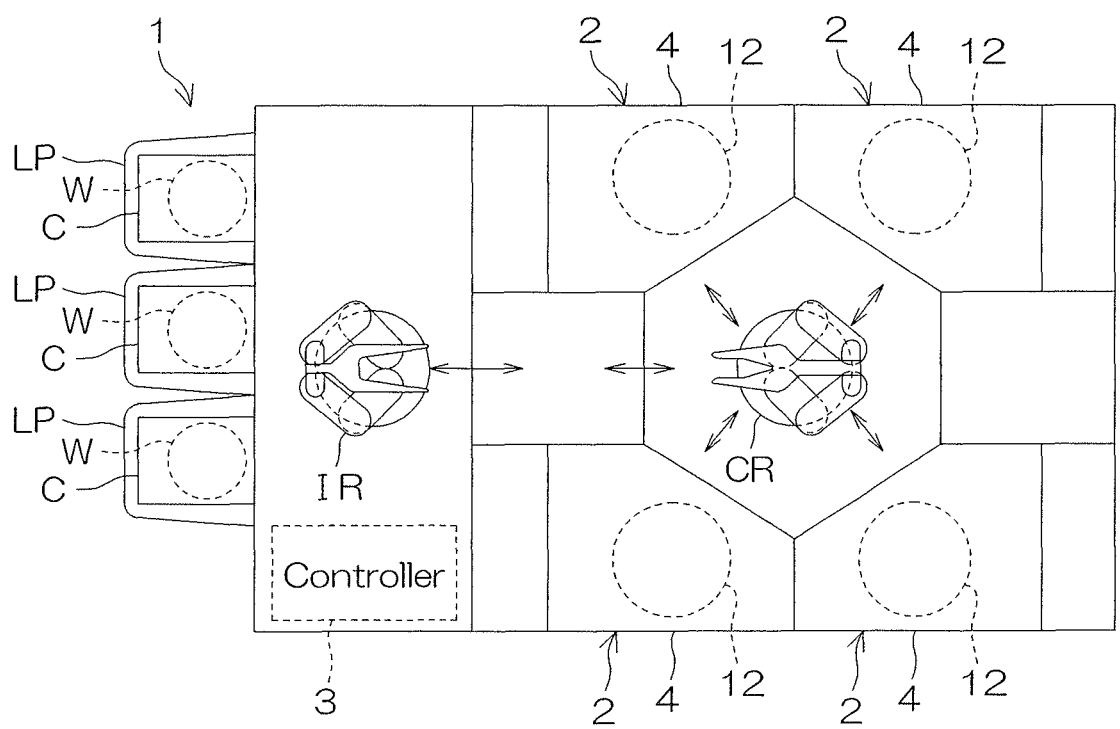
FIG. 1 is an illustrative plan view for describing a layout of an interior of a substrate processing apparatus according to a first preferred embodiment of the present invention.

FIG. 1 is an illustrative plan view for describing a layout of an interior of a substrate processing apparatus 1 according to a first preferred embodiment of the present invention. The substrate processing apparatus 1 is a single substrate processing type apparatus that processes substrates W such as silicon wafers one by one. In the present preferred embodiment, the substrates W are disk-shaped substrates. The substrate processing apparatus 1 includes a plurality of processing units 2 that process the substrates W with processing liquids, load ports LP on each of which a substrate container C that houses a plurality of the substrates W to be processed by the processing units 2 is mounted, transfer robots IR and CR that transfer the substrates W between the load ports LP and the processing units 2, and a controller 3 that controls the substrate processing apparatus 1. The transfer robot IR transfers the substrates W between the substrate containers C and the transfer robot CR. The transfer robot CR transfers the substrates W between the transfer robot IR and the processing units 2. The plurality of processing units 2 have, for example, the same arrangement.

Figure 2:
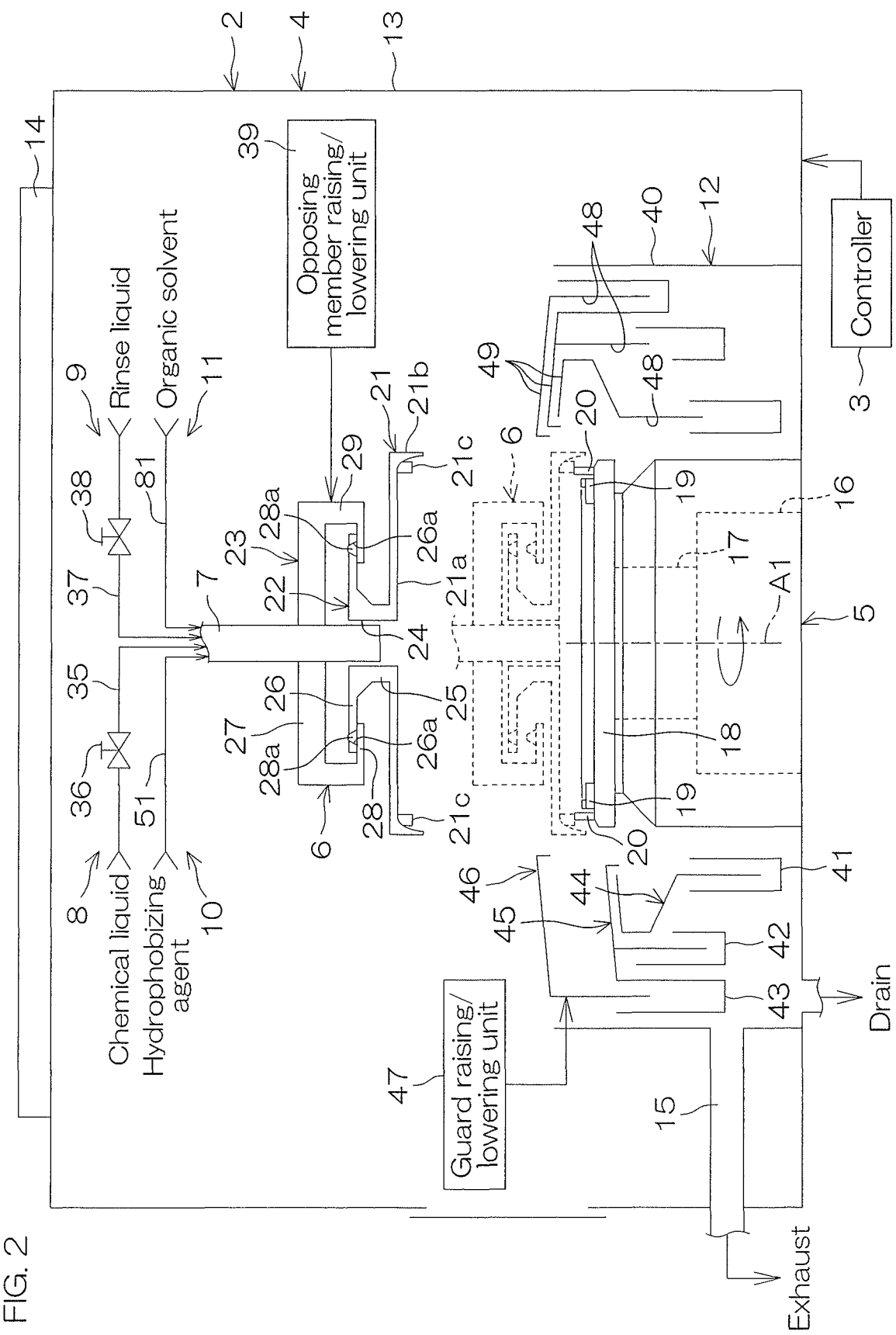
FIG. 2 is an illustrative sectional view for describing an arrangement example of a processing unit shown in FIG. 1.
Figure 3:
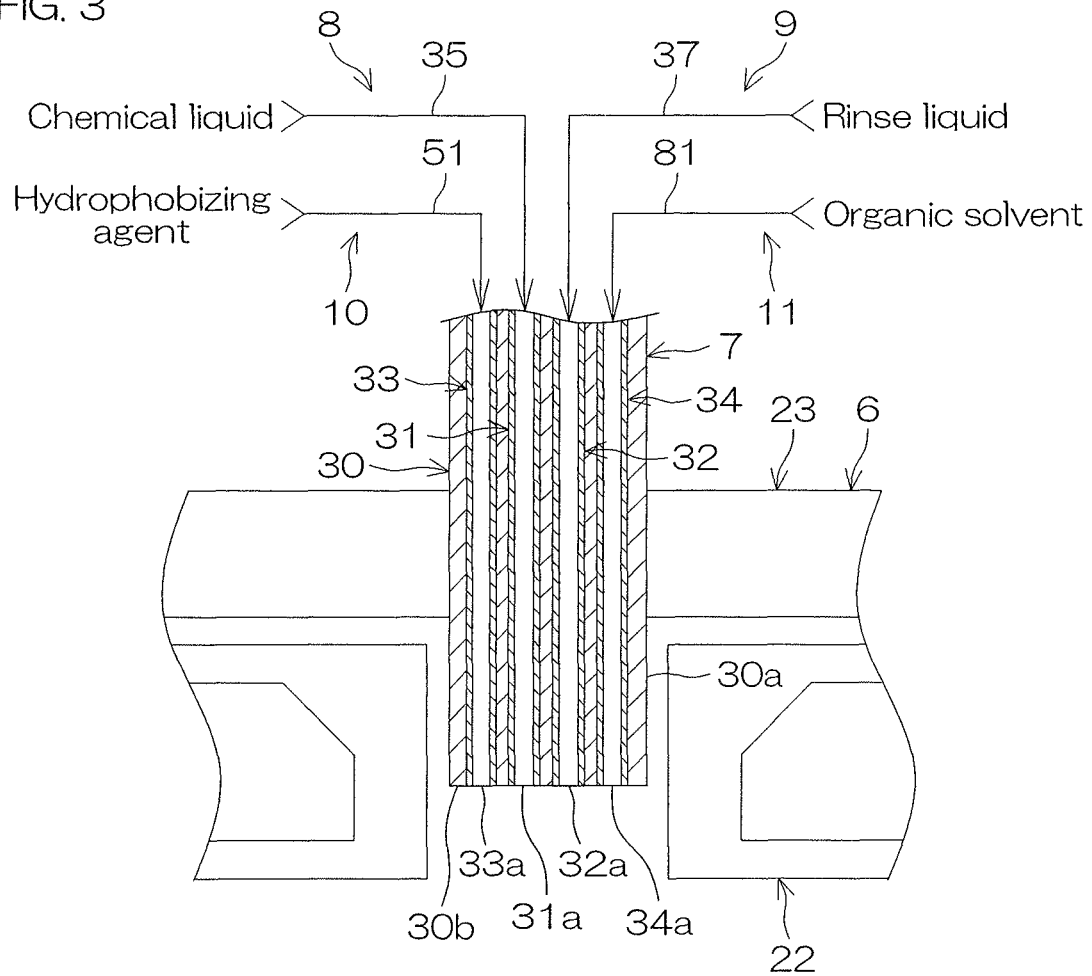
FIG. 3 is a vertically sectional view of a central axis nozzle shown in FIG. 2.
Figure 4:
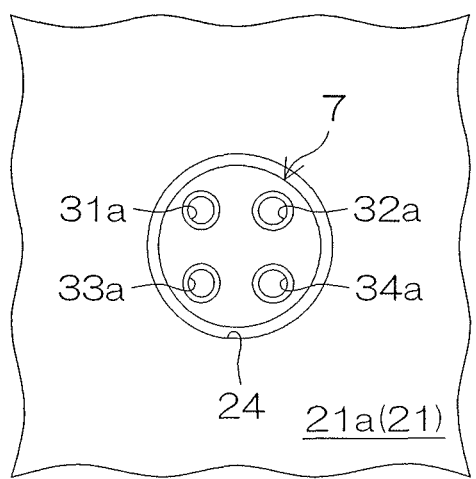
FIG. 4 is a bottom view of the central axis nozzle.

FIG. 2 is an illustrative sectional view for describing an arrangement example of each of the processing units 2. FIG. 3 is a vertically sectional view of a central axis nozzle 7. FIG. 4 is a bottom view of the central axis nozzle 7.

The processing unit 2 includes a box-shaped chamber 4, a spin chuck (substrate holding unit) 5 that holds a single substrate W in a horizontal posture in the chamber 4 and rotates the substrate W around a vertical rotational axis A1 passing through a center of the substrate W, an opposing member 6 that opposes an upper surface of the substrate W held by the spin chuck 5, the central axis nozzle 7 passing through the inside of the opposing member 6 in the up and down direction, the central axis nozzle being arranged to discharge the processing liquids toward a central portion of the upper surface of the substrate W held by the spin chuck 5, a chemical liquid supplying unit 8 arranged to supply a chemical liquid to the central axis nozzle 7, a rinse liquid supplying unit 9 arranged to supply a rinse liquid to the central axis nozzle 7, a hydrophobizing agent supplying unit 10 arranged to supply a hydrophobizing agent to the central axis nozzle 7, an organic solvent supplying unit 11 arranged to supply an organic solvent serving as a low surface tension liquid having greater specific gravity than the air and lower surface tension than water to the central axis nozzle 7, and a cylindrical processing cup 12 surrounding the spin chuck 5.

The chamber 4 includes a box-shaped partition wall 13 that houses the spin chuck 5 and the nozzles, an FFU (fan filter unit) 14 serving as a blower unit that sends clean air (air filtered by a filter) into a space defined by the partition wall 13 from an upper portion of the partition wall 13, and an exhaust duct 15 that exhausts gas in the chamber 4 from a lower portion of the partition wall 13. The FFU 14 is disposed above the partition wall 13 and attached to a ceiling of the partition wall 13. The FFU 14 sends the clean air downward into the chamber 4 from the ceiling of the partition wall 13. The exhaust duct 15 is connected to a bottom portion of the processing cup 12 and guides the gas in the chamber 4 out toward exhaust processing equipment provided in a plant in which the substrate processing apparatus 1 is installed. Therefore, a downflow (downward flow) flowing downward in the chamber 4 is formed by the FFU 14 and the exhaust duct 15. The processing of the substrate W is performed in a state where the downflow is formed in the chamber 4.

As the spin chuck 5, a clamping type chuck that clamps the substrate W in horizontal directions to hold the substrate W horizontally is adopted. Specifically, the spin chuck 5 includes a spin motor 16, a spin shaft 17 integrated with a drive shaft of the spin motor 16, and a disk-shaped spin base 18 substantially horizontally attached to an upper end of the spin shaft 17.

A plurality of (not less than three; for example, six) clamping members 19 are disposed on a peripheral edge portion of an upper surface of the spin base 18. On the upper surface peripheral edge portion of the spin base 18, the plurality of clamping members 19 are disposed at suitable intervals on a circumference corresponding to an outer peripheral shape of the substrate W. On the upper surface of the spin base 18, a plurality of (not less than three) opposing member supporting portions 20 arranged to support the opposing member 6 from the lower side are disposed on a circumference centered at the rotational axis A1. A distance between each of the opposing member supporting portions 20 and the rotational axis A1 is set to be greater than a distance between each of the clamping members 19 and the rotational axis A1.

The spin chuck 5 is not limited to a clamping type but, for example, a vacuum suction type arrangement (vacuum chuck) may be adopted which vacuum-suctions a rear surface of the substrate W to hold the substrate W in a horizontal posture and further performs rotation around a vertical rotational axis in this state to thereby rotate the substrate W held by the spin chuck 5.

The opposing member 6 is a driven type opposing member (shielding member) to be rotated according to the spin chuck 5. That is, the opposing member 6 is supported by the spin chuck 5 integrally rotatably during substrate processing.

The opposing member 6 includes a shielding plate 21, an engaging portion 22 provided to be capable of being raised and lowered in accompaniment with the shielding plate 21, and a supporting portion 23 arranged to be engaged with the engaging portion 22 and support the shielding plate 21 from the upper side.

The shielding plate 21 is formed in a disk shape having a greater diameter than the substrate W. The shielding plate 21 has, at its lower surface, a circular substrate opposing surface 21a that opposes the entire upper surface of the substrate W, a ring-shaped collar portion 21b projecting downward on a peripheral edge portion of the substrate opposing surface 21a, and spin chuck engaging portions 21c provided on the substrate opposing surface 21a and arranged to be engaged with the opposing member supporting portions 20. A through hole 24 passing through the opposing member 6 in the up and down direction is formed in a central portion of the substrate opposing surface 21a. The through hole 24 is defined by a cylindrical inner peripheral surface.

The engaging portion 22 includes a cylindrical portion 25 surrounding a periphery of the through hole 24 on an upper surface of the shielding plate 21, and a flange portion spreading radially outward from an upper end of the cylindrical portion 25. The flange portion 26 is positioned on the upper side of a flange supporting portion 28 included in the supporting portion 23, the flange supporting portion to be described next. A diameter of an outer periphery of the flange portion 26 is greater than an inner periphery of the flange supporting portion 28.

The supporting portion 23 includes a supporting portion main body 27 formed in, for example, a substantially disk shape, the horizontal flange supporting portion 28 centered at a central axis A2, and a connection portion 29 that connects the supporting portion main body 27 and the flange supporting portion 28.

The central axis nozzle 7 extends in the up and down direction along a vertical axis passing through a center of the shielding plate 21 and the substrate W, that is, along the rotational axis A1. The central axis nozzle 7 is disposed above the spin chuck 5 and passes through internal spaces of the shielding plate 21 and the supporting portion 23. The central axis nozzle 7 is raised and lowered together with the shielding plate 21 and the supporting portion 23. As shown in FIG. 2, a lower surface of the central axis nozzle 7 is disposed at a position slightly above the substrate opposing surface 21a of the shielding plate 21. However, the lower surface may be disposed at the substantially same height as the substrate opposing surface 21a.

The central axis nozzle 7 includes a columnar casing 30 extending inside the through hole 24 in the up and down direction, and a first nozzle pipe 31, a second nozzle pipe 32, a third nozzle pipe 33, and a fourth nozzle pipe 34 passing through the inside of the casing 30 in the up and down direction. The casing 30 has a cylindrical outer peripheral surface 30a and an opposing surface 30b provided in a lower end portion of the casing 30, the opposing surface opposing the central portion of the upper surface of the substrate W. Each of the first to fourth nozzle pipes 31 to 34 is an inner tube.

An opposing member raising/lowering unit 39 connected to raise and lower the supporting portion 23 so as to raise and lower the opposing member 6 is combined with the supporting portion 23. The opposing member raising/lowering unit 39 is of an arrangement that includes a servo motor, a ball screw mechanism, etc.

The opposing member raising/lowering unit 39 raises and lowers the opposing member 6 and the first to fourth nozzle pipes 31 to 34 in the vertical direction together with the supporting portion 23. The opposing member raising/lowering unit 39 raises and lowers the shielding plate 21 and the first to fourth nozzle pipes 31 to 34 between a proximity position at which the substrate opposing surface 21a of the shielding plate 21 is brought close to the upper surface of the substrate W held by the spin chuck 5, and a retracted position provided above the proximity position. The opposing member raising/lowering unit 39 is capable of holding the shielding plate 21 at respective positions between the proximity position and the retracted position.

By the opposing member raising/lowering unit 39, the supporting portion 23 can be raised and lowered between a lower position (position indicated by broken lines in FIG. 2) and an upper position (position indicated by solid lines in FIG. 2). Thereby, the shielding plate 21 of the opposing member 6 can be raised and lowered between the proximity position (position indicated by broken lines in FIG. 2) at which the shielding plate is brought close to the upper surface of the substrate W held by the spin chuck 5 and the retracted position (position indicated by solid lines in FIG. 2) at which the shielding plate is retracted largely upward from the spin chuck 5.

Specifically, in a state where the supporting portion 23 is placed at the upper position, by engagement of the flange supporting portion 28 of the supporting portion 23 and the flange portion 26, the engaging portion 22, the shielding plate 21, and the central axis nozzle 7 are supported by the supporting portion 23. That is, the shielding plate 21 is suspended by the supporting portion 23.

In a state where the supporting portion 23 is placed at the upper position, by engagement of projections 28a projected from an upper surface of the flange supporting portion 28 with engaging holes 26a formed in the flange portion 26 at intervals in the circumferential direction, the shielding plate 21 is positioned in the circumferential direction with respect to the supporting portion 23.

When the opposing member raising/lowering unit 39 lowers the supporting portion 23 from the upper position, the shielding plate 21 is also lowered from the retracted position. After that, when the spin chuck engaging portions 21c of the shielding plate 21 are brought into contact with the opposing member supporting portions 20, the shielding plate 21 and the central axis nozzle 7 are received by the opposing member supporting portions 20. When the opposing member raising/lowering unit 39 then lowers the supporting portion 23, the engagement between the flange supporting portion 28 of the supporting portion 23 and the flange portion 26 is canceled, and the engaging portion 22, the shielding plate 21, and the central axis nozzle 7 are separated from the supporting portion 23 and supported by the spin chuck 5. In this state, the shielding plate 21 is rotated in accompaniment with rotation of the spin chuck 5 (spin base 18).

The first nozzle pipe 31 extends in the vertical direction. A lower end of the first nozzle pipe 31 opens to the opposing surface 30b of the casing 30 and forms a first discharge port 31a. The chemical liquid from the chemical liquid supplying unit 8 is supplied to the first nozzle pipe 31. The chemical liquid supplying unit 8 includes a chemical liquid pipe 35 connected to a proximal end side of the first nozzle pipe 31, and a chemical liquid valve 36 interposed in a middle portion of the chemical liquid pipe 35. When the chemical liquid valve 36 is opened, the chemical liquid is discharged downward from the first discharge port 31a. When the chemical liquid valve 36 is closed, discharge of the chemical liquid from the first discharge port 31a is stopped. The chemical liquid may be a liquid containing, for example, at least one of sulfuric acid, acetic acid, nitric acid, hydrochloric acid, hydrofluoric acid, ammonia water, hydrogen peroxide water, an organic acid (for example, citric acid, oxalic acid, etc.), an organic alkali (for example, TMAH: tetramethylammonium hydroxide, etc.), a surfactant, and a corrosion inhibitor.

The second nozzle pipe 32 extends in the vertical direction. A lower end of the second nozzle pipe 32 opens to the opposing surface 30b of the casing 30 and forms a second discharge port 32a. The rinse liquid from the rinse liquid supplying unit 9 is supplied to the second nozzle pipe 32. The rinse liquid supplying unit 9 includes a rinse liquid pipe 37 connected to a proximal end side of the second nozzle pipe 32, and a rinse liquid valve 38 interposed in a middle portion of the rinse liquid pipe 37. When the rinse liquid valve 38 is opened, the rinse liquid is discharged downward from the second discharge port 32a. When the rinse liquid valve 38 is closed, discharge of the rinse liquid from the second discharge port 32a is stopped. The rinse liquid is any of pure water (deionized water), carbonated water, electrolytic ionized water, hydrogen water, ozone water, and ammonia water of dilute concentration (of, for example, approximately 10 to 100 ppm).

The third nozzle pipe 33 extends in the vertical direction. A lower end of the third nozzle pipe 33 opens to the opposing surface 30b of the casing 30 and forms a third discharge port 33a. The liquid hydrophobizing agent from the hydrophobizing agent supplying unit 10 is supplied to the third nozzle pipe 33. The hydrophobizing agent may be a hydrophobizing agent for silicon or may be a hydrophobizing agent for metal.

The hydrophobizing agent for silicon is a hydrophobizing agent that hydrophobizes silicon (Si) itself or a compound containing silicon. The hydrophobizing agent for silicon is, for example, a silane coupling agent. The silane coupling agent includes, for example, at least one of HMDS (hexamethyldisilazane), TMS (tetramethylsilane), fluorinated alkylchlorosilane, alkyldisilazane, and a non-chloro-based hydrophobizing agent. The non-chloro-based hydrophobizing agent includes, for example, at least one of dimethylsilyldimethylamine, dimethylsilyldiethylamine, hexamethyldisilazane, tetramethyldisilazane, bis(dimethylamino)dimethylsilane, N,N-dimethylaminotrimethylsilane, N-(trimethylsilyl) dimethylamine, and an organosilane compound.

The hydrophobizing agent for metal is, for example, a solvent having a high coordinating property, the solvent hydrophobizing a metal mainly by coordination bonds. The hydrophobizing agent includes, for example, at least one of an amine having a hydrophobic group, and an organosilicon compound.

The fourth nozzle pipe 34 extends in the vertical direction. A lower end of the fourth nozzle pipe 34 opens to the opposing surface 30b of the casing 30 and forms a fourth discharge port 34a. The liquid organic solvent from the organic solvent supplying unit 11 is supplied to the fourth nozzle pipe 34. The organic solvent is, for example, IPA (isopropyl alcohol). As such an organic solvent, in addition to IPA, for example, methanol, ethanol, acetone, EG (ethylene glycol), and HFE (hydrofluoroether) can be cited as examples. The organic solvent is not only made of a single component but may also be a liquid mixed with another component. For example, the organic solvent may be a mixed liquid of IPA and acetone or may be a mixed liquid of IPA and methanol.

As shown in FIG. 2, the processing cup 12 is disposed outward from the substrate W held by the spin chuck 5 (in the direction away from the rotational axis A1). The processing cup 12 includes a cylindrical member 40 surrounding a periphery of the spin base 18, a plurality of cups 41 to 43 (first to third cups 41 to 43) disposed between the spin chuck 5 and the cylindrical member 40, a plurality of guards 44 to 46 (first to third guards 44 to 46) that receive the processing liquids (such as the chemical liquid, the rinse liquid, the organic solvent, and the hydrophobizing agent) scattering in a periphery of the substrate W, and a guard raising/lowering unit 47 that raises and lowers the plurality of 1 guards 44 to 46 respectively independently. The processing cup 12 is disposed on the outer side of an outer periphery of the substrate W held by the spin chuck 5 (in the direction away from the rotational axis A1). In FIG. 2, different states of the processing cup 12 are shown on the right side and the left side of the rotational axis A1.

The cups 41 to 43 are each formed in a cylindrical shape and surround the spin chuck 5 between the spin chuck 5 and the cylindrical member 40. The second cup 42 in the second from the inside is disposed on the outer side of the first cup 41, and the outermost third cup 43 is disposed on the outer side of the second cup 42. The third cup 43 is, for example, integrated with the second guard 45 and raised and lowered together with the second guard 45. Each of the cups 41 to 43 forms an annular groove whose top is open. A recovery pipe (not shown) or a drain pipe (not shown) is connected to the groove of each of the cups 41 to 43. The processing liquid guided to a bottom portion of each of the cups 41 to 43 is sent to a recovery unit (not shown) or a drain unit (not shown) through the recovery pipe or the drain pipe. Thereby, the processing liquid discharged from the substrate W is recovered or discarded.

The guards 44 to 46 are each formed in a cylindrical shape and surround the spin chuck 5 between the spin chuck 5 and the cylindrical member 40. Each of the guards 44 to 46 includes a cylindrical guiding portion 48 surrounding a periphery of the spin chuck 5, and a cylindrical taper portion 49 extending obliquely upward from an upper end of the guiding portion 48 to the central side (in the direction toward the rotational axis A1 of the substrate W). Upper end portions of the taper portions 49 form inner peripheral portions of the guards 44 to 46 and each have a greater diameter than the substrate W and the spin base 18. The three taper portions 49 are piled in the up and down direction, and the three guiding portions 48 are disposed coaxially. The three guiding portions 48 (guiding portions 48 of the guards 44 to 46) are capable of respectively coming into and out of the corresponding cups 41 to 43. That is, the processing cup 12 is foldable. By raising and lowering at least one of the three guards 44 to 46 with the guard raising/lowering unit 47, the processing cup 12 is developed and folded. The taper portions 49 may have a straight line shape as shown in FIG. 2 or may, for example, extend while drawing a smooth arc projecting upward.

Supply of the processing liquids (such as the chemical liquid, the rinse liquid, the organic solvent, and the hydrophobizing agent) to the substrate W and drying of the substrate W are performed in a state where any of the guards 44 to 46 opposes a peripheral end surface of the substrate W. For example, in order to realize a state where the outermost third guard 46 opposes the peripheral end surface of the substrate W (state shown in FIG. 13; hereinafter, sometimes referred to as a "third guard opposing state"), the first guard 44 and the second guard 45 are disposed at a lower position, and the third guard 46 is disposed at an upper position. In order to realize a state where the second guard 45 in the second from the inside opposes the peripheral end surface of the substrate W (state shown in FIG. 15; hereinafter, sometimes referred to as a "second guard opposing state"), the first guard 44 is disposed at the lower position, and the second guard 45 and the third guard 46 are disposed at the upper position. In order to realize a state where the innermost first guard 44 opposes the peripheral end surface of the substrate W (state shown in FIG. 2; hereinafter, sometimes referred to as a "first guard opposing state"), all the three guards 44 to 46 are disposed at the upper position.

For example, in a chemical liquid supplying step E3 (see FIG. 9), a rinsing step E4 (see FIG. 9), a first organic solvent supplying step E5 (see FIG. 9), a hydrophobizing agent supplying step E6 (see FIG. 9), and a second organic solvent supplying step E7 (see FIG. 9) to be described later, the supply is performed in a state where any of the three guards 44 to 46 opposes the peripheral end surface of the substrate W. Therefore, the processing liquid scattering in the periphery of the substrate W when the processing liquid is supplied to the substrate W is guided to any of the cups 41 to 43 by any of the first guard 44, the second guard 45, and the third guard 46.

Figure 5:
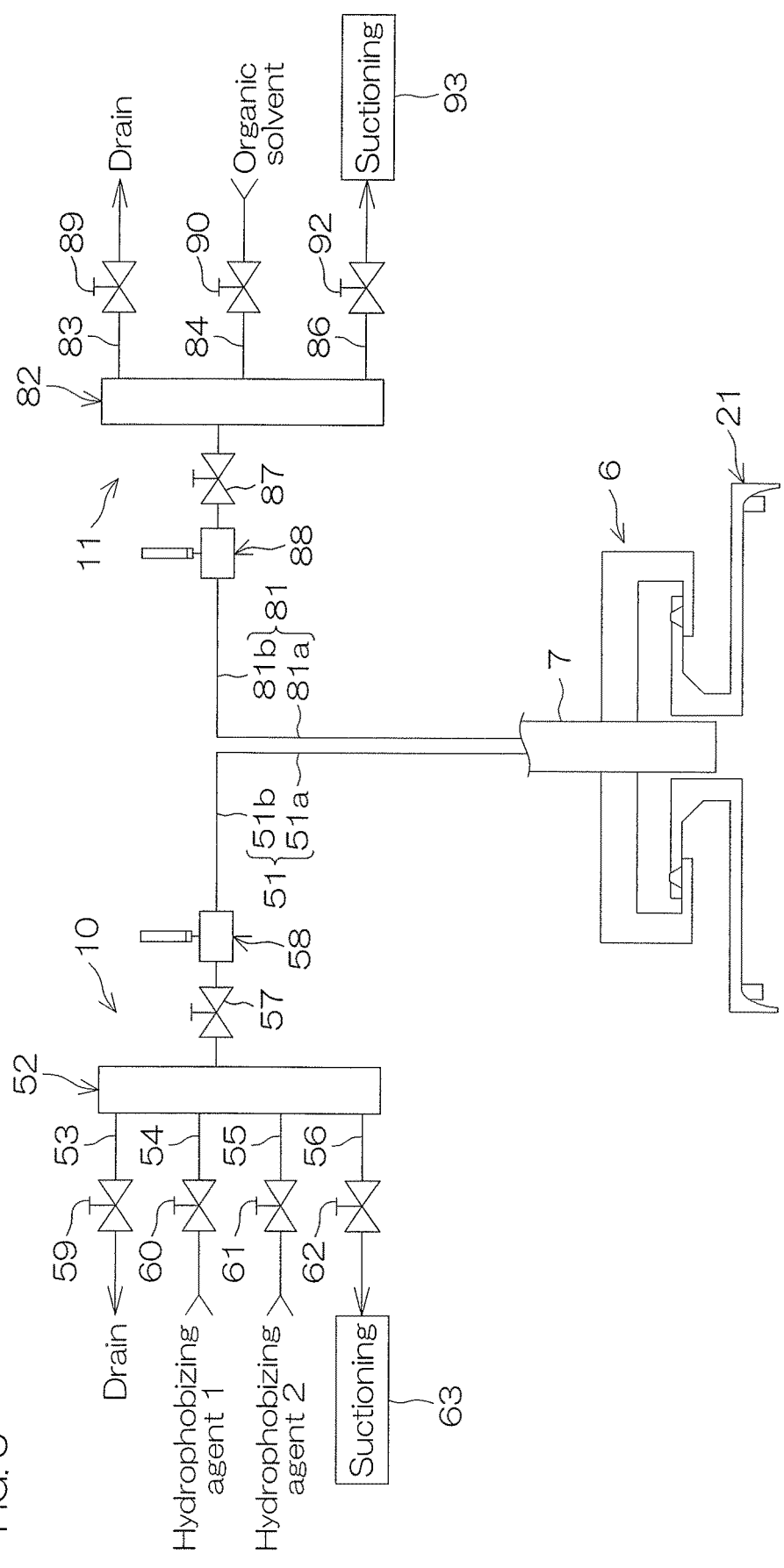
FIG. 5 is a diagram for describing a schematic arrangement of a hydrophobizing agent supplying unit and an organic solvent supplying unit shown in FIG. 2.

FIG. 5 is a diagram for describing a schematic arrangement of the hydrophobizing agent supplying unit 10 and the organic solvent supplying unit 11.

The hydrophobizing agent supplying unit 10 includes a hydrophobizing agent pipe (processing liquid pipe) 51 connected to the third nozzle pipe 33, a first connection pipe 52 connected to the third nozzle pipe 33 via the hydrophobizing agent pipe 51, and a hydrophobizing agent drain pipe 53, a first hydrophobizing agent supply pipe 54, a second hydrophobizing agent supply pipe 55, and a hydrophobizing agent suction pipe 56 respectively connected to the first connection pipe 52.

The first connection pipe 52 is formed in a tubular shape extending in one direction with both ends being closed. The hydrophobizing agent drain pipe 53, the hydrophobizing agent pipe 51, the first hydrophobizing agent supply pipe 54, the second hydrophobizing agent supply pipe 55, and the hydrophobizing agent suction pipe 56 are connected to the first connection pipe 52 in this order from one end side (the upper side shown in FIG. 5) in terms of the longitudinal direction of the first connection pipe 52.

The hydrophobizing agent pipe 51 has a first up/down direction portion 51a and a first right/left direction portion 51b. A downstream end of the first up/down direction portion 51a is connected to an upstream end of the third nozzle pipe 33. A downstream end of the first right/left direction portion 51b is connected to an upstream end of the first up/down direction portion 51a. An upstream end of the first right/left direction portion 51b is connected to the first connection pipe 52. A hydrophobizing agent valve 57 arranged to open and close the hydrophobizing agent pipe 51 is interposed in the first right/left direction portion 51b of the hydrophobizing agent pipe 51.

In the first right/left direction portion 51b of the hydrophobizing agent pipe 51, a first hydrophobizing agent suctioning device (first suctioning device) 58 is interposed on the downstream side of the hydrophobizing agent valve 57. The first hydrophobizing agent suctioning device 58 is a diaphragm type suctioning device. The diaphragm type suctioning device is a suctioning device including a cylindrical head interposed in a middle portion of the hydrophobizing agent pipe 51, and a diaphragm housed in the head, in which a volume of a flow passage formed inside the head is changed by driving the diaphragm (see Japanese Patent Application Publication No. 2016-111306).

A hydrophobizing agent drain valve 59 arranged to open and close the hydrophobizing agent drain pipe 53 is interposed in the hydrophobizing agent drain pipe 53. The other end side of the hydrophobizing agent drain pipe 53 is connected to external drain equipment.

A first hydrophobizing agent supply valve 60 arranged to open and close the first hydrophobizing agent supply pipe 54 is interposed in the first hydrophobizing agent supply pipe 54. A first hydrophobizing agent base liquid (hydrophobizing agent 1) is supplied to the other end side of the first hydrophobizing agent supply pipe 54 from a first hydrophobizing agent supply source.

A second hydrophobizing agent supply valve 61 arranged to open and close the second hydrophobizing agent supply pipe 55 is interposed in the second hydrophobizing agent supply pipe 55. A second hydrophobizing agent base liquid (hydrophobizing agent 2) is supplied to the other end side of the second hydrophobizing agent supply pipe 55 from the second hydrophobizing agent supply source. By mixing of the first hydrophobizing agent base liquid and the second hydrophobizing agent base liquid, the hydrophobizing agent is produced.

A hydrophobizing agent suction valve (suction valve) 62 arranged to open and close the hydrophobizing agent suction pipe 56 is interposed in the hydrophobizing agent suction pipe 56. A second hydrophobizing agent suctioning device (second suctioning device) 63 is connected to a leading end of the hydrophobizing agent suction pipe 56. The second hydrophobizing agent suctioning device 63 is an ejector type suctioning device. The ejector type suctioning device includes a vacuum generator and an aspirator. The ejector type suctioning device has stronger suction force (faster suction speed) and a greater flow rate of liquid that can be suctioned in comparison to the diaphragm type suctioning device or a siphon type suctioning device.

When the first hydrophobizing agent supply valve 60, the second hydrophobizing agent supply valve 61, and the hydrophobizing agent valve 57 are opened in a state where the other valves are closed in the hydrophobizing agent supplying unit 10, the first hydrophobizing agent base liquid from the first hydrophobizing agent supply pipe 54 and the second hydrophobizing agent base liquid from the second hydrophobizing agent supply pipe 55 flow into the first connection pipe 52 and mixed in the first connection pipe 52, so that the hydrophobizing agent is produced. The hydrophobizing agent is supplied to the third nozzle pipe 33 via the hydrophobizing agent pipe 51, and the hydrophobizing agent is discharged downward from the third discharge port 33a.

When the first hydrophobizing agent supply valve 60, the second hydrophobizing agent supply valve 61, and the hydrophobizing agent drain valve 59 are opened in a state where the other valves are closed in the hydrophobizing agent supplying unit 10, the first hydrophobizing agent base liquid from the first hydrophobizing agent supply pipe 54 is supplied to the hydrophobizing agent drain pipe 53. Thereby, it is possible to discharge the first hydrophobizing agent base liquid remaining inside the first hydrophobizing agent supply pipe 54 to the exterior.

When the hydrophobizing agent valve 57 and the hydrophobizing agent suction valve 62 are opened in a state where a function of the second hydrophobizing agent suctioning device 63 is enabled and the other valves are closed, the inside of the hydrophobizing agent pipe 51 is suctioned, and a leading end surface F1 of the hydrophobizing agent (leading end surface of the processing liquid) is retracted inside the hydrophobizing agent pipe 51.

The organic solvent supplying unit 11 includes an organic solvent pipe (processing liquid pipe) 81 connected to the fourth nozzle pipe 34, a second connection pipe 82 connected to the fourth nozzle pipe 34 via the organic solvent pipe 81, and an organic solvent drain pipe 83, an organic solvent supply pipe 84, and an organic solvent suction pipe (suction pipe) 86 respectively connected to the second connection pipe 82.

The second connection pipe 82 is formed in a tubular shape extending in one direction with both ends being closed. The organic solvent drain pipe 83, the organic solvent pipe 81, the organic solvent supply pipe 84, and the organic solvent suction pipe 86 are connected to the second connection pipe 82 in this order from one end side (the upper side shown in FIG. 5) in terms of the longitudinal direction of the second connection pipe 82.

The organic solvent pipe 81 has a second up/down direction portion 81a and a second right/left direction portion 81b. A downstream end of the second up/down direction portion 81a is connected to an upstream end of the fourth nozzle pipe 34. A downstream end of the second right/left direction portion 81b is connected to an upstream end of the second up/down direction portion 81a. An upstream end of the second right/left direction portion 81b is connected to the second connection pipe 82. An organic solvent valve 87 arranged to open and close the organic solvent pipe 81 is interposed in the second right/left direction portion 81b of the organic solvent pipe 81.

In the second right/left direction portion 81b of the organic solvent pipe 81, a first organic solvent suctioning device (first suctioning device) 88 is interposed on the downstream side of the organic solvent valve 87. The first organic solvent suctioning device 88 is a diaphragm type suctioning device.

An organic solvent drain valve 89 arranged to open and close the organic solvent drain pipe 83 is interposed in the organic solvent drain pipe 83. The other end side of the organic solvent drain pipe 83 is connected to external drain equipment.

An organic solvent supply valve 90 arranged to open and close the organic solvent supply pipe 84 is interposed in the organic solvent supply pipe 84. The organic solvent is supplied to the other end side of the organic solvent supply pipe 84 from an organic solvent base liquid supply source.

An organic solvent suction valve (suction valve) 92 arranged to open and close the organic solvent suction pipe 86 is interposed in the organic solvent suction pipe 86. A second organic solvent suctioning device (second suctioning device) 93 is connected to a leading end of the organic solvent suction pipe 86. The second organic solvent suctioning device 93 is an ejector type suctioning device.

When the organic solvent supply valve 90 and the organic solvent valve 87 are opened in a state where the other valves are closed in the organic solvent supplying unit 11, the organic solvent from the organic solvent supply pipe 84 flows into the second connection pipe 82. The organic solvent is supplied to the fourth nozzle pipe 34 via the organic solvent pipe 81, and the organic solvent is discharged downward from the fourth discharge port 34a.

When the organic solvent supply valve 90 and the organic solvent drain valve 89 are opened in a state where the other valves are closed in the organic solvent supplying unit 11, the organic solvent is supplied to the organic solvent drain pipe 83 from the organic solvent supply pipe 84. Thereby, it is possible to discharge the organic solvent remaining inside the organic solvent supply pipe 84 to the exterior.

When the organic solvent valve 87 and the organic solvent suction valve 92 are opened in a state where a function of the second organic solvent suctioning device 93 is enabled and the other valves are closed, the inside of the organic solvent pipe 81 is suctioned, and a leading end surface F2 of the organic solvent (leading end surface of the processing liquid) is retracted inside the organic solvent pipe 81.

Figure 6:
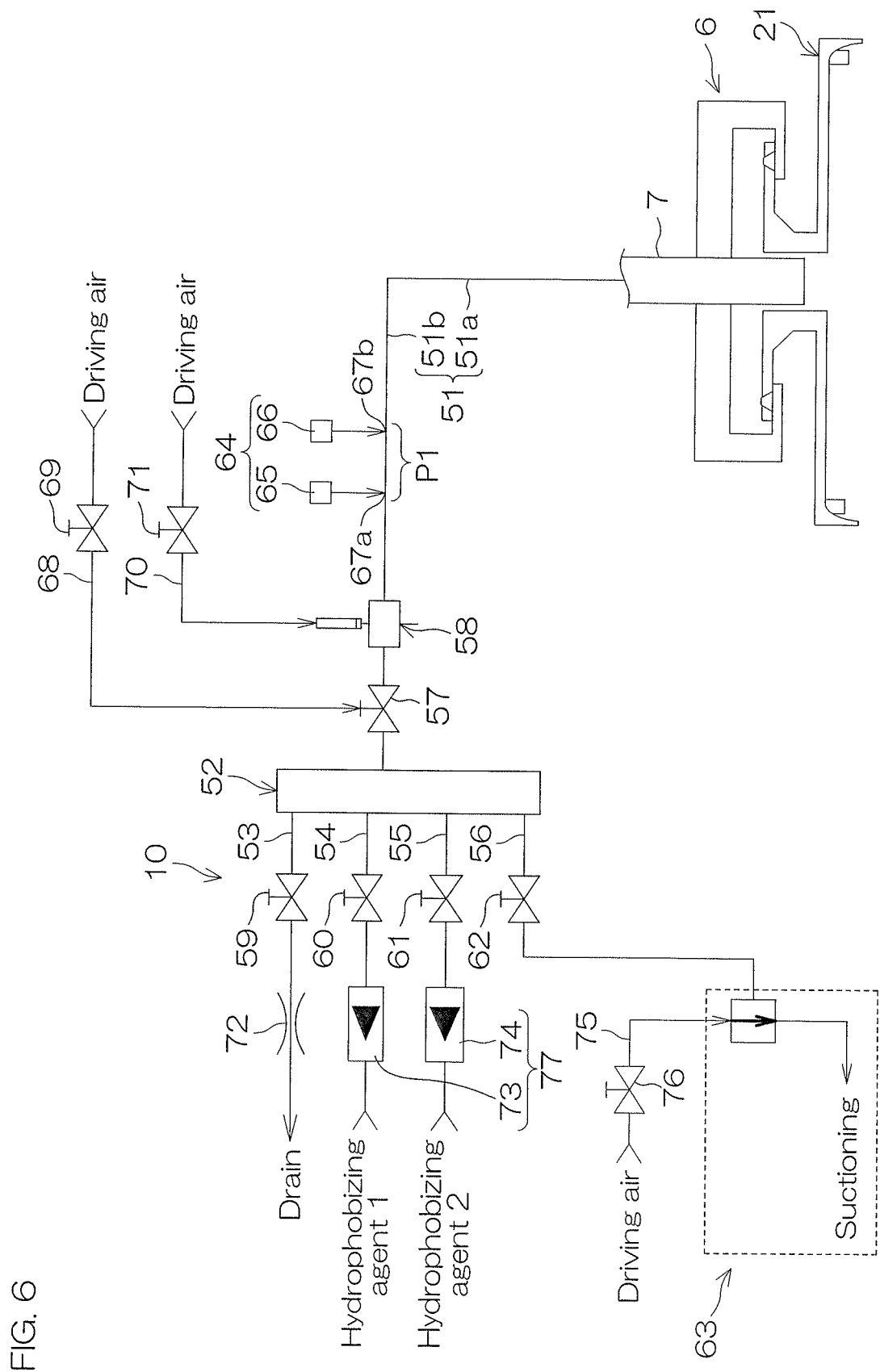
FIG. 6 is a diagram for describing a detailed arrangement of the hydrophobizing agent supplying unit.

FIG. 6 is a diagram for describing a detailed arrangement of the hydrophobizing agent supplying unit 10.

In relation to a pipe wall of the first right/left direction portion 51b of the hydrophobizing agent pipe 51, a first sensor 64 is disposed. The first sensor 64 includes a first existence/non-existence sensor 65 and a second existence/non-existence sensor 66. In the first right/left direction portion 51b of the hydrophobizing agent pipe 51, a predetermined hydrophobizing agent standby position (standby position) P1 is set. The hydrophobizing agent standby position P1 has a predetermined width in the flowing direction of the hydrophobizing agent pipe 51.

The first existence/non-existence sensor 65 detects whether or not there is the hydrophobizing agent at an upper limit position (first position) 67a of the hydrophobizing agent standby position P1. When a leading end of the hydrophobizing agent inside the hydrophobizing agent pipe 51 is brought forward further than the upper limit position 67a (brought closer to the central axis nozzle 7 side), the first existence/non-existence sensor 65 detects the hydrophobizing agent. When the leading end of the hydrophobizing agent inside the hydrophobizing agent pipe 51 is retracted further back than the upper limit position 67a, the first existence/non-existence sensor 65 does not detect the hydrophobizing agent. The first existence/non-existence sensor 65 sends a detection output thereof to the controller 3.

The second existence/non-existence sensor 66 detects whether or not there is the hydrophobizing agent at a lower limit position (second position) 67b of the hydrophobizing agent standby position P1. When the leading end surface F1 of the hydrophobizing agent inside the hydrophobizing agent pipe 51 is brought forward further than the lower limit position 67b (brought closer to the central axis nozzle 7 side), the second existence/non-existence sensor 66 detects the hydrophobizing agent. When the leading end surface F1 of the hydrophobizing agent inside the hydrophobizing agent pipe 51 is retracted further back than the lower limit position 67b, the second existence/non-existence sensor 66 does not detect the hydrophobizing agent. The second existence/non-existence sensor 66 sends a detection output thereof to the controller 3. Therefore, in a case where the leading end surface F1 of the hydrophobizing agent is in the hydrophobizing agent standby position P1, existence of the hydrophobizing agent at the upper limit position 67a is detected by the first existence/non-existence sensor 65 and non-existence of the hydrophobizing agent at the lower limit position 67b is detected by the second existence/non-existence sensor 66 (existence of the hydrophobizing agent is not detected).

The first existence/non-existence sensor 65 and the second existence/non-existence sensor 66 are, for example, fiber sensors for liquid detection, disposed directly attached to or disposed closely to an outer peripheral wall of the hydrophobizing agent pipe 51. The first existence/non-existence sensor 65 and the second existence/non-existence sensor 66 may be formed by, for example, capacitive sensors.

The hydrophobizing agent valve 57 is an air-operated on-off valve. A diaphragm valve, a butterfly valve, a needle valve, etc., can be cited as examples of such an air-operated on-off valve. A first air supply pipe (second drive source) 68 is connected to the hydrophobizing agent valve 57, and a first air supply valve (second drive source) 69 arranged to switch opening/closing of the first air supply pipe 68 is interposed in a middle portion of the first air supply pipe 68. One end of a first leak pipe (not shown) arranged to leak the air to the atmosphere from the hydrophobizing agent valve 57 is connected to a middle portion of the first air supply pipe 68 on the downstream side of the first air supply valve 69. A first leak valve (not shown) is interposed in a middle portion of the first leak pipe.

In a state where the first air supply valve 69 is opened and the first leak valve is closed, the air flowing through the first air supply pipe 68 is supplied to the inside of the hydrophobizing agent valve 57. Thereby, the hydrophobizing agent valve 57 is opened. Meanwhile, in a state where the hydrophobizing agent valve 57 is closed and when the first leak valve is opened and the first air supply valve 69 is closed, supply of the air to the inside of the hydrophobizing agent valve 57 is stopped, and the air in the hydrophobizing agent valve 57 is discharged to the atmosphere through the first leak pipe. Thereby, the hydrophobizing agent valve 57 is closed.

The first hydrophobizing agent suctioning device 58 formed by the diaphragm type suctioning device is an air-operated suctioning device. A second air supply pipe (first drive source) 70 is connected to the first hydrophobizing agent suctioning device 58, and a second air supply valve (first drive source) 71 arranged to switch opening/closing of the second air supply pipe 70 is interposed in a middle portion of the second air supply pipe 70. The second air supply valve 71 is, for example, a solenoid valve. The one end of a second leak pipe (not shown) arranged to leak the air to the atmosphere from the first hydrophobizing agent suctioning device 58 is connected to a middle portion of the second air supply pipe 70 on the downstream side of the second air supply valve 71. A second leak valve (not shown) is interposed in a middle portion of the second leak pipe.

In a state where the second air supply valve 71 is opened and the second leak valve is closed, the air flowing through the second air supply pipe 70 is supplied to the inside of the first hydrophobizing agent suctioning device 58. In this state, due to the shape of the diaphragm, the volume in the head is small. Therefore, the hydrophobizing agent existing in a portion of the second air supply pipe 70 on the downstream side of the first hydrophobizing agent suctioning device 58 is not drawn into the head. That is, in this state, a function of the first hydrophobizing agent suctioning device 58 is disabled.

From this state, when the second leak valve is opened and the second air supply valve 71 is closed, supply of the air to the inside of the first hydrophobizing agent suctioning device 58 is stopped, and the air is discharged to the atmosphere through the second leak pipe. Thereby, the shape of the diaphragm is changed, and the volume in the head is increased. As a result, the hydrophobizing agent existing in the portion of the second air supply pipe 70 on the downstream side of the first hydrophobizing agent suctioning device 58 is drawn into the head, and the inside of the portion on the downstream side is suctioned. In other words, according to an input of a discharge stop signal for the second air supply valve 71, the liquid (processing liquid) is suctioned into the head. Thereby, the function of the first hydrophobizing agent suctioning device 58 is enabled.

Meanwhile, in a state where a function of the first hydrophobizing agent suctioning device 58 is enabled and when the second air supply valve 71 is opened and the second leak valve is closed, the air flowing through the second air supply pipe 70 is supplied to the inside of the first hydrophobizing agent suctioning device 58. Thereby, the shape of the diaphragm is changed and the volume in the head is decreased. Thus, the liquid (processing liquid) that has been suctioned into the head is pushed out. That is, according to an input of a discharge start signal for the second air supply valve 71, the liquid (processing liquid) in the head is pushed out. As a result, the function of the first hydrophobizing agent suctioning device 58 is disabled.

A flow regulation unit arranged to adjust a flow rate of the hydrophobizing agent flowing through the hydrophobizing agent drain pipe 53 is interposed in the hydrophobizing agent drain pipe 53. In the present preferred embodiment, the flow regulation unit is an orifice 72. Size of the orifice 72 is set so that a pressure loss when the liquid flows through the hydrophobizing agent pipe 51 is equal to a pressure loss when the liquid flows through the hydrophobizing agent drain pipe 53.

A first flowmeter 73 that detects a flow rate of the first hydrophobizing agent base liquid flowing in the first hydrophobizing agent supply pipe 54 is further interposed in the first hydrophobizing agent supply pipe 54 on the downstream side of the first hydrophobizing agent supply valve 60.

A second flowmeter 74 that detects a flow rate of the second hydrophobizing agent base liquid flowing in the second hydrophobizing agent supply pipe 55 is further interposed in the second hydrophobizing agent supply pipe 55 on the downstream side of the second hydrophobizing agent supply valve 61. A second sensor 77 arranged to detect the flow rate of the hydrophobizing agent (hydrophobizing agent base liquid) supplied to the hydrophobizing agent supply pipe 54, 55 in a charging step T3 is formed by the first flowmeter 73 and the second flowmeter 74.

In the example of FIG. 6, the case where the two pipes of the first hydrophobizing agent supply pipe 54 and the second hydrophobizing agent supply pipe 55 are provided as the hydrophobizing agent supply pipe is taken as an example. However, only one hydrophobizing agent supply pipe may be provided as the hydrophobizing agent supply pipe. In this case, a hydrophobizing agent (not a base liquid but the hydrophobizing agent after producing (mixing)) is supplied to the hydrophobizing agent supply pipe. In this case, a flowmeter is interposed in this hydrophobizing agent supply pipe.

The second hydrophobizing agent suctioning device 63 formed by the ejector type suctioning device includes a fluid supply pipe 75 and a fluid supply valve 76 arranged to switch opening/closing of the fluid supply pipe 75. The fluid supply valve 76 is, for example, a solenoid valve. By opening of the fluid supply valve 76 and flowing of a fluid in the fluid supply pipe 75 in an energized state of the second hydrophobizing agent suctioning device 63, the inside of the second hydrophobizing agent suctioning device 63 is depressurized. Thereby, the inside of the hydrophobizing agent suction pipe (suction pipe) is suctioned. That is, the function of the second hydrophobizing agent suctioning device 63 is enabled.

Although details will not be described, the organic solvent supplying unit 11 has similar arrangements to the hydrophobizing agent supplying unit 10. That is, in relation to a pipe wall of the second right/left direction portion 81*b* of the organic solvent pipe 81, a first sensor is disposed. The organic solvent valve 87 is an air-operated on-off valve. The organic solvent valve 87 is opened by opening a first air supply valve, and the organic solvent valve 87 is closed by opening the first leak valve. The first organic solvent suctioning device 88 is an air-operated suctioning device. A function of the first organic solvent suctioning device 88 is enabled by opening a second air supply valve, and the function of the first organic solvent suctioning device 88 is disabled by opening the second leak valve.

Figure 7A:
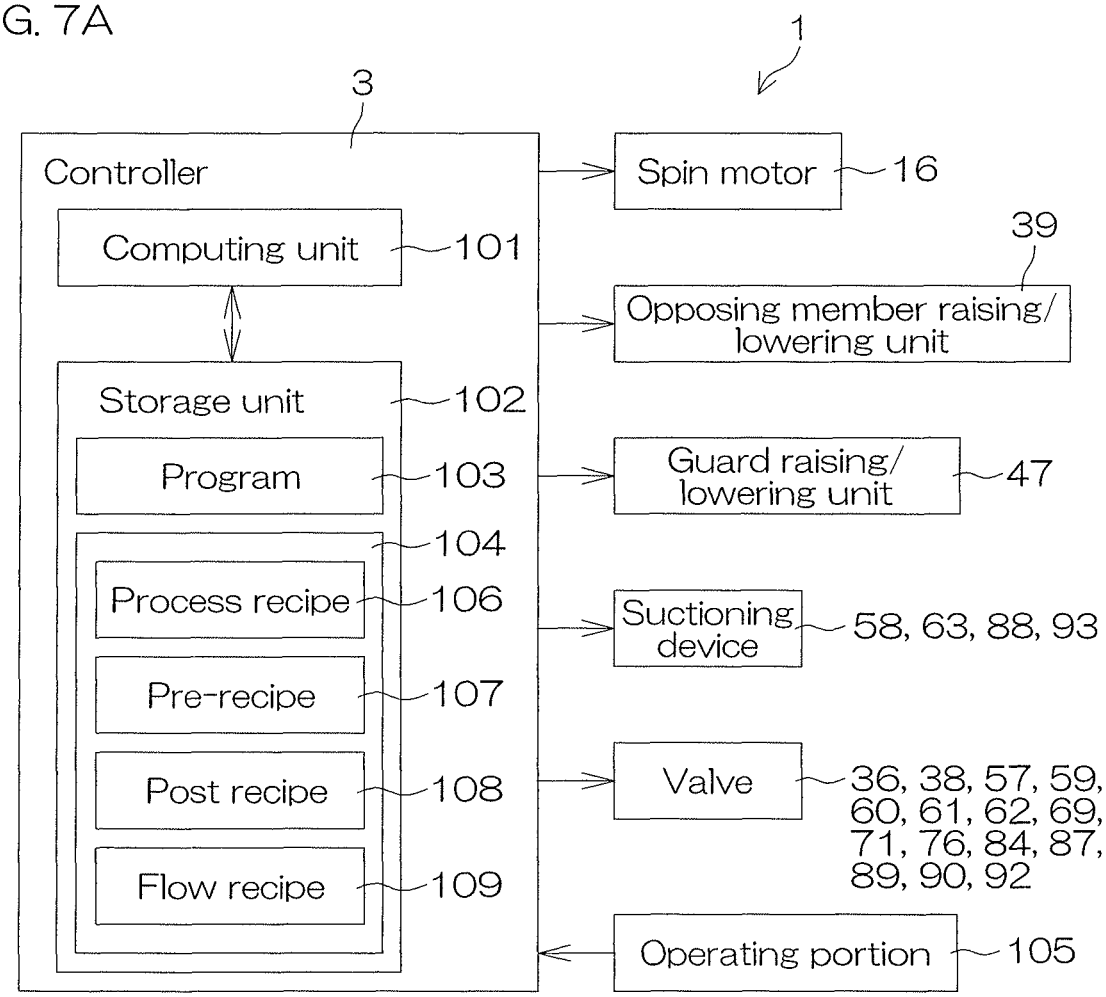
FIG. 7A is a block diagram for describing an electrical configuration of a main portion of the substrate processing apparatus.

FIG. 7A is a block diagram for describing an electrical configuration of a main portion of the substrate processing apparatus 1.

The controller 3 is constructed using, for example, a microcomputer. The controller 3 has a computing unit 101 such as a CPU, a storage unit 102 such as a fixed memory device and a hard disk drive, and an input/output unit (not shown). A program 103 to be executed by the computing unit 101 is stored in the storage unit 102.

The storage unit 102 includes a recipe storing portion 104 that stores recipes regulating the contents of each of the processing to be performed on the substrate W. The recipe storing portion 104 is formed by a non-volatile memory in which data is electrically rewritable. A process recipe 106, a pre-recipe 107, a post recipe 108, and flow recipes 109 prepared by operation of an operating portion 105 are stored in the recipe storing portion 104. The process recipe 106 is to set the contents of the processing to be performed on the substrate W (including procedures and conditions; the same applies to the following description). The pre-recipe 107 is an example of a preliminary action recipe, to set the contents of a preliminarily set preprocessing. The post recipe 108 is an example of the preliminary action recipe, to set the contents of a preliminarily set post processing. The flow recipes 109 are to set the order of execution and the number of times of execution of control according to the process recipe 106 (process recipe control), control according to the pre-recipe (pre-recipe control), and control according to the post recipe (post recipe control).

The predetermined number of (for example, twenty-five) substrates W forming one lot are carried into the substrate processing apparatus 1 in a state where the substrates are collectively housed in the substrate container C (see FIG. 1). In the substrate processing apparatus 1, one flow recipe 109 is set for each substrate container C.

The spin motor 16, the opposing member raising/lowering unit 39, the guard raising/lowering unit 47, the first hydrophobizing agent suctioning device 58, the second hydrophobizing agent suctioning device 63, the first organic solvent suctioning device 88, the second organic solvent suctioning device 93, etc., are connected to the controller 3 as objects to be controlled. The controller 3 drives the spin motor 16, the opposing member raising/lowering unit 39, the guard raising/lowering unit 47, etc., according to the program which is preliminarily set, and enables functions of the first hydrophobizing agent suctioning device 58, the second hydrophobizing agent suctioning device 63, the first organic solvent suctioning device 88, the second organic solvent suctioning device 93, etc. Further, the controller 3 opens and closes the chemical liquid valve 36, the rinse liquid valve 38, the hydrophobizing agent valve 57, the hydrophobizing agent drain valve 59, the first hydrophobizing agent supply valve 60, the second hydrophobizing agent supply valve 61, the hydrophobizing agent suction valve 62, the first air supply valve 69, the second air supply valve 71, the organic solvent supply pipe 84, the organic solvent valve 87, the organic solvent drain valve 89, the organic solvent suction valve 92, etc.

FIG. 7B is a diagram for describing a hard interlock. In the process of performing a series of substrate processing according to the recipes held in the recipe storing portion 104, the hard interlock is executed at the time of starting each process. FIG. 7B shows only the hard interlock between guard positions and open/close actions of the valves.

In the first guard opposing state, opening actions of the chemical liquid valve 36 and the rinse liquid valve 38 are permitted, whereas opening actions of the first and second hydrophobizing agent supply valves 60, 61 and the organic solvent supply valve 90 are prohibited.

In the second guard opposing state, the opening actions of the first and second hydrophobizing agent supply valves 60, 61 are permitted, whereas the opening actions of the chemical liquid valve 36, the rinse liquid valve 38, and the organic solvent supply valve 90 are prohibited. By such a hard interlock, supply of the organic solvent to the substrate W is prevented in a hydrophobizing agent supplying step E6 (see FIG. 9), and it is possible to reliably prevent contamination between the hydrophobizing agent and the organic solvent in the processing cup 12. There is a concern that particles may occur in accordance with the mixing and the contact between the hydrophobizing agent and the organic solvent. Thus, by preventing such contamination, it is possible to prevent occurrence of particles in advance.

In the third guard opposing state, the opening action of the organic solvent supply valve 90 is permitted, whereas the opening actions of the chemical liquid valve 36, the rinse liquid valve 38, and the first and second hydrophobizing agent supply valves 60, 61 are prohibited. By such a hard interlock, supply of the hydrophobizing agent to the substrate W is prevented in a first organic solvent supplying step E5 (see FIG. 9) and a second organic solvent supplying step E7 (see FIG. 9), and it is possible to reliably prevent the mixing and the contact between the hydrophobizing agent and the organic solvent in the processing cup 12. There is a concern that particles may occur in accordance with the mixing and the contact between the hydrophobizing agent and the organic solvent. Thus, by preventing such contamination, it is possible to prevent occurrence of particles in advance.

Figure 8A:
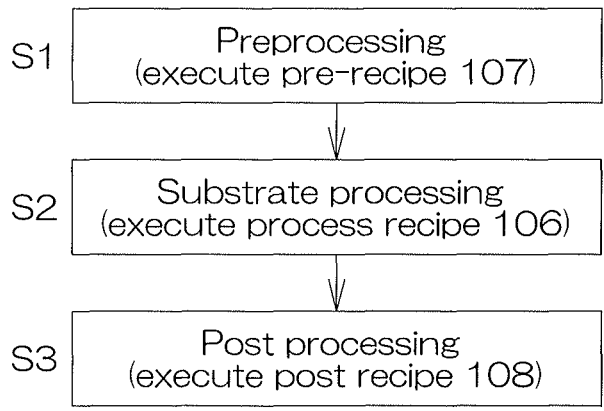
FIG. 8A is a flowchart for describing contents of processing executed in the processing unit.
Figure 8B:
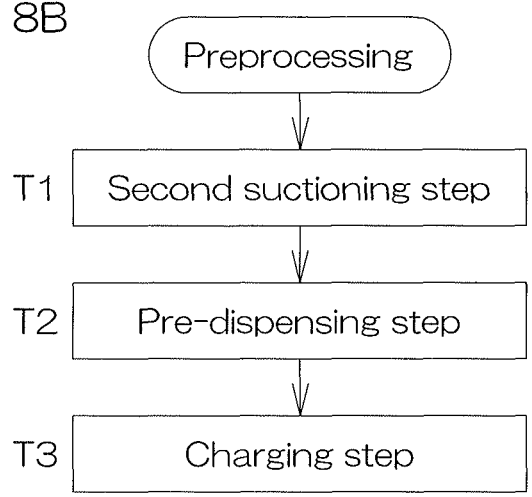
FIG. 8B is a flowchart showing a flow of preprocessing executed according to a pre-recipe in the processing unit.
Figure 18:
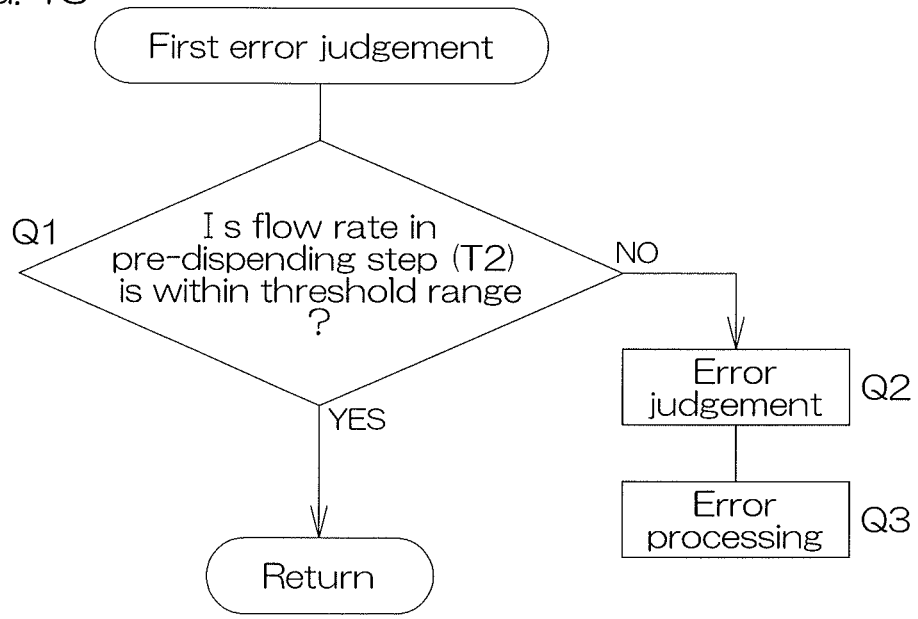
FIG. 18 is a flowchart for describing a first error judgement.
Figure 19:
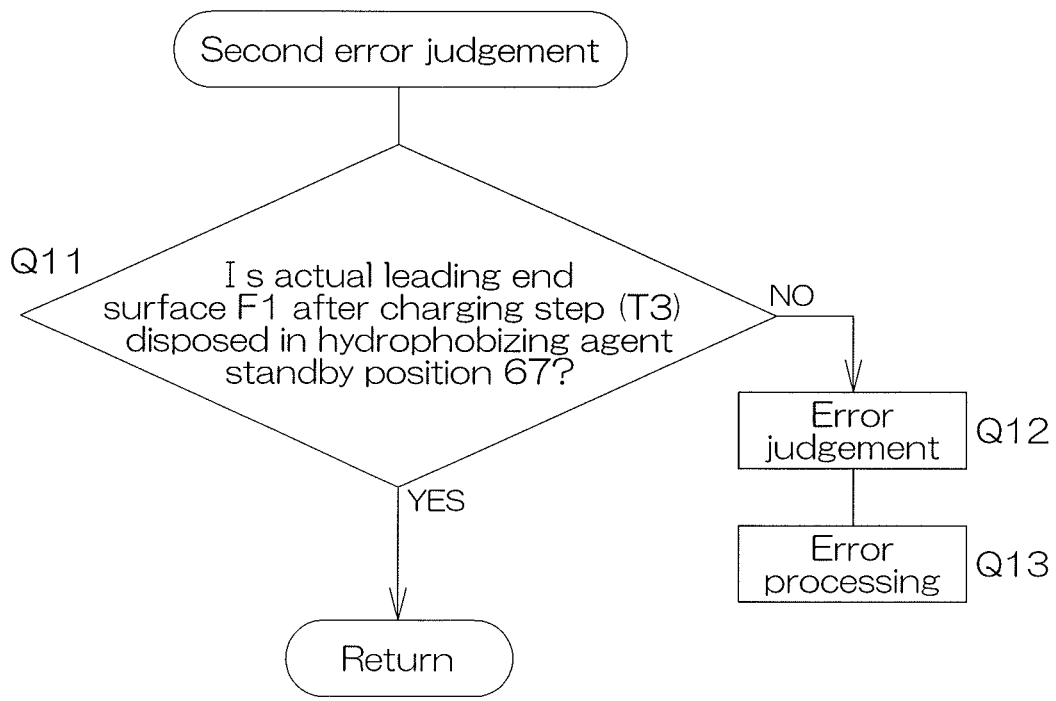
FIG. 19 is a flowchart for describing a second error judgement.

FIG. 8A is a flowchart for describing contents of the processing executed in the processing unit 2. FIG. 8B is a flowchart showing a flow of the preprocessing executed according to the pre-recipe 107 in the processing unit 2. FIG. 9 is a flowchart showing a flow of the substrate processing executed according to the process recipe 106 in the processing unit 2. FIG. 10 is a diagram showing a state of the processing unit 2 before carrying the substrate W into the substrate processing apparatus 1. FIG. 11 is a diagram for describing a discharge suctioning step T1 (second suctioning step). FIG. 12A is a diagram for describing a pre-dispensing step T2. FIG. 12B is a diagram for describing the charging step T3 (standby position disposing step). FIG. 13 is a diagram for describing the first organic solvent supplying step E5. FIG. 14 is a diagram for describing a spinning-off step executed after the first organic solvent supplying step. FIG. 15 is a diagram for describing the hydrophobizing agent supplying step E6. FIG. 16 is a diagram for describing the second organic solvent supplying step E7. FIG. 17 is a diagram for describing a spin drying step E8. FIG. 18 is a flowchart for describing a first error judgement. FIG. 19 is a flowchart for describing a second error judgement.

A substrate processing example to be executed in the processing unit 2 will be described with reference to FIGS. 8A to 9. FIGS. 10 to 19 will be referenced where appropriate. The substrate processing example may also be etching processing or may be cleaning processing.

The processing is performed on plural substrates W included in one lot (plural substrates W housed in one substrate container C (see FIG. 1)) in one or plural processing units 2. When the substrate container C (see FIG. 1) is mounted on the load port LP (see FIG. 1) of the substrate processing apparatus 1, substrate information indicating information of the lot included in the substrate container C is sent from a host computer to the controller 3. The host computer is a computer that collectively controls plural substrate processing apparatuses installed in a semiconductor manufacturing plant. The controller 3 reads out the flow recipes 109 for the lot from the recipe storing portion 104, based on the substrate information sent from the host computer. According to the flow recipes 109, the pre-recipe control, the process recipe control, and the post recipe control are performed in order.

First, in each of the processing units 2 (see FIG. 1), the control according to the pre-recipe 107 is executed, and thereby, preprocessing S1 (see FIG. 8A) is performed.

After that, by repeatedly executing the control according to the process recipe 106, the substrates W housed in one substrate container C are successively and consecutively carried into the processing unit 2, and receive substrate processing S2 (see FIG. 8A) in the processing unit 2.

The control according to the process recipe 106 is executed for the predetermined number of times which is equal to the number of substrates housed in the substrate container C. When the series of processing for the predetermined number of times is ended, by executing the control according to the post recipe 108 in the processing unit 2, post processing S3 (see FIG. 8A) is executed. Description of the post processing S3 will be omitted.

The preprocessing S1 will be described.

After the previous substrate processing S2 (substrate processing S2 performed on the previous substrate W), as shown in FIG. 10, the leading end surface F1 of the hydrophobizing agent is disposed in the hydrophobizing agent standby position (standby position) P1, and the leading end surface F2 of the organic solvent is disposed in an organic solvent standby position (standby position) P2. The organic solvent standby position P2 has a predetermined width in the flowing direction.

In the preprocessing S1, the controller 3 executes the discharge suctioning step T1 (see FIG. 8B).

The discharge suctioning step T1 includes a step of discharging the hydrophobizing agent existing inside the hydrophobizing agent pipe 51 and inside the first connection pipe 52 from the hydrophobizing agent pipe 51 and the first connection pipe 52 (second suctioning step). In a case where a long time period has elapsed after the end of the previous substrate processing S2, there is a concern that the hydrophobizing agent existing inside the hydrophobizing agent pipe 51 and inside the first connection pipe 52 may have been deactivated (deteriorated). Prior to the substrate processing S2, by discharging the hydrophobizing agent existing in the hydrophobizing agent pipe 51 from the hydrophobizing agent pipe 51, the deactivated hydrophobizing agent is not used for the substrate processing S2.

In the discharge suctioning step T1, as shown in FIG. 10, the controller 3 opens the hydrophobizing agent valve 57 and the hydrophobizing agent suction valve 62 in a state where the other valves in the hydrophobizing agent supplying unit 10 are closed. Thereby, the inside of the hydrophobizing agent suction pipe 56 and the inside of the first connection pipe 52 are exhausted, and the hydrophobizing agent remaining inside the hydrophobizing agent pipe 51 is drawn into the hydrophobizing agent suction pipe 56 through the first connection pipe 52. When all the hydrophobizing agent is discharged from the inside of the hydrophobizing agent pipe 51, the inside of the first connection pipe 52, and the inside of the hydrophobizing agent suction pipe 56, the controller 3 closes the hydrophobizing agent suction valve 62 and the hydrophobizing agent valve 57. By the discharge suctioning step T1, the deactivated hydrophobizing agent (due to influences of humidity and oxygen) existing inside the hydrophobizing agent pipe 51 and inside the first connection pipe 52 are discharged from the hydrophobizing agent pipe 51 and the first connection pipe 52. Since the discharge suctioning step T1 is performed by using the second hydrophobizing agent suctioning device 63 formed by the ejector type suctioning device, it is possible to discharge all the hydrophobizing agent from the hydrophobizing agent pipe 51 and the first connection pipe 52, and to perform the discharge action in a short time.

The discharge suctioning step T1 includes a step of discharging the organic solvent existing inside the organic solvent pipe 81 and inside the second connection pipe 82 from the organic solvent pipe 81 and the second connection pipe 82 (second suctioning step). In a case where a long time period has elapsed after the end of the previous substrate processing S2, there is a concern that the organic solvent existing inside the organic solvent pipe 81 and inside the second connection pipe 82 may have been deactivated (deteriorated). Therefore, prior to the substrate processing S2, by discharging the organic solvent existing in the organic solvent pipe 81 from the organic solvent pipe 81, the deactivated organic solvent is not used for the substrate processing S2.

In the discharge suctioning step T1, the controller 3 opens the organic solvent valve 87 and the organic solvent suction valve 92 in a state where the other valves in the organic solvent supplying unit 11 are closed. Thereby, the inside of the organic solvent suction pipe 86 and the inside of the second connection pipe 82 are exhausted, and the organic solvent remaining inside the organic solvent pipe 81 is drawn into the organic solvent suction pipe 86 through the second connection pipe 82. When all the organic solvent is discharged from the inside of the organic solvent pipe 81, the inside of the second connection pipe 82, and the inside of the organic solvent suction pipe 86, the controller 3 closes the organic solvent suction valve 92 and the organic solvent valve 87. By the discharge suctioning step T1, it is possible to discharge the deactivated organic solvent (due to influences of humidity and oxygen) existing inside the organic solvent pipe 81 and inside the second connection pipe 82 from the organic solvent pipe 81 and the second connection pipe 82. Since the discharge suctioning step T1 is performed by using the second organic solvent suctioning device 93 formed by the ejector type suctioning device, it is possible to discharge all the organic solvent from the organic solvent pipe 81 and the second connection pipe 82, and to perform the discharge action in a short time.

The example of FIG. 11 shows the case where suctioning of the hydrophobizing agent from the hydrophobizing agent supply pipe 54 and suctioning of the organic solvent is from the organic solvent supply pipe 84 are performed in parallel to each other. However, the suctioning of the hydrophobizing agent from the hydrophobizing agent supply pipe 54 and the suctioning of the organic solvent from the organic solvent supply pipe 84 may be performed at different timings from each other.

After the end of the discharge suctioning step T1, next in the preprocessing S1, the controller 3 executes the pre-dispensing step T2 (see FIG. 8B).

The pre-dispensing step T2 includes a step of discharging the hydrophobizing agent existing inside the hydrophobizing agent supply pipe (the first hydrophobizing agent supply pipe 54 and the second hydrophobizing agent supply pipe 55) from the hydrophobizing agent supply pipe. In a case where a long time period has elapsed after the end of the previous substrate processing S2, there is a concern that the first hydrophobizing agent base liquid existing inside the first hydrophobizing agent supply pipe 54 may have been deactivated (deteriorated), and there is a concern that the second hydrophobizing agent base liquid existing inside the second hydrophobizing agent supply pipe 55 may have been deactivated (deteriorated). Therefore, prior to the substrate processing S2, by discharging the first hydrophobizing agent base liquid existing inside the first hydrophobizing agent supply pipe 54 and the second hydrophobizing agent base liquid existing inside the second hydrophobizing agent supply pipe 55 to the hydrophobizing agent pipe 51, the deactivated first hydrophobizing agent base liquid and second hydrophobizing agent base liquid are not used for the substrate processing S2.

In the pre-dispensing step T2, as shown in FIG. 12A, the controller 3 opens the hydrophobizing agent drain valve 59 and the hydrophobizing agent supply valve (the first hydrophobizing agent supply valve 60 and the second hydrophobizing agent supply valve 61) in a state where the other valves in the hydrophobizing agent supplying unit 10 are closed. Thereby, the first hydrophobizing agent base liquid existing inside the first hydrophobizing agent supply pipe 54 is supplied to the hydrophobizing agent drain pipe 53. By the pre-dispensing step T2, it is possible to discharge the deactivated first hydrophobizing agent base liquid existing inside the first hydrophobizing agent supply pipe 54 and the deactivated second hydrophobizing agent base liquid existing inside the second hydrophobizing agent supply pipe 55 from the inside of the first hydrophobizing agent supply pipe 54 or the inside of the second hydrophobizing agent supply pipe 55.

In the pre-dispensing step T2, the flow rate of the hydrophobizing agent guided from the hydrophobizing agent supply pipe 54, 55 to the hydrophobizing agent drain pipe 53 is detected by the second sensor 77 (see FIG. 6 together with FIG. 12A). As described above, adjustment is made by the orifice 72 so that the pressure loss of the liquid at the time of flowing through the hydrophobizing agent pipe 51 matches the pressure loss of the liquid at the time of flowing through the hydrophobizing agent drain pipe 53. Thus, in the pre-dispensing step T2, it is possible to accurately acquire the flow rate of the hydrophobizing agent supplied to the hydrophobizing agent pipe 51 in the charging step T3.

The controller 3 determines whether or not the leading end surface F1 of the hydrophobizing agent after the charging step T3 will be disposed in the hydrophobizing agent standby position P1 by detection of the second sensor 77 (first determining step). In a case of determining that the leading end surface F1 of the hydrophobizing agent after the charging step T3 will be not disposed in the hydrophobizing agent standby position P1, the controller 3 judges an error (first error judgement). Specifically, in a case where the flow rate of the hydrophobizing agent detected by the second sensor 77 is out of a predetermined threshold range (NO in Step Q1 of FIG. 18), the controller 3 judges an error (Step Q2 of FIG. 18), and executes error processing after that (Step Q3 of FIG. 18). In a case where the flow rate of the hydrophobizing agent detected by the second sensor 77 is out of the predetermined threshold range (NO in Step Q1), the flow rate of the hydrophobizing agent supplied to the hydrophobizing agent pipe 51 in the charging step T3 is outside of an expected flow rate range. In a case where the flow rate of the hydrophobizing agent detected by the second sensor 77 is within the predetermined threshold range (YES in Step Q1), the processing of FIG. 18 (subroutine processing) is returned back to the caller.

In the charging step T3, when the flow rate of the hydrophobizing agent supplied to the hydrophobizing agent pipe 51 is outside of the expected flow rate range, there is a concern that a position of the leading end surface F1 of the hydrophobizing agent may not be accurately controlled. In this case, in the charging step T3, there is a concern that the hydrophobizing agent may be caused to drip from the discharge port 33a or the leading end surface F1 of the hydrophobizing agent after the charging step T3 cannot be disposed in the hydrophobizing agent standby position P1. Therefore, in a case where such a situation occurs, the charging step T3 is not performed (or in a case where the charging step T3 is already being executed, the charging step T3 is suspended), and the error processing is performed.

The pre-dispending step T2 includes a step of discharging the organic solvent existing inside the organic solvent supply pipe 84 from the organic solvent supply pipe 84. In a case where a long time period has elapsed after the end of the previous substrate processing S2, there is a concern that the organic solvent existing inside the organic solvent supply pipe 84 may have been deactivated (deteriorated). Therefore, prior to the substrate processing S2, by discharging the organic solvent existing in the organic solvent supply pipe 84 from the organic solvent pipe 81, the deactivated organic solvent is not used for the substrate processing S2.

In the pre-dispending step T2, the controller 3 opens the organic solvent drain valve 89 and the organic solvent supply valve 90 in a state where the other valves in the organic solvent supplying unit 11 are closed. Thereby, as shown in FIG. 12A, the organic solvent existing inside the organic solvent supply pipe 84 is supplied to the organic solvent drain pipe 83. By the pre-dispending step T2, it is possible to discharge the deactivated organic solvent existing inside the organic solvent supply pipe 84 from the inside of the organic solvent supply pipe 84. The example of FIG. 12A shows the case where draining of the hydrophobizing agent from the hydrophobizing agent supply pipe 54 and draining of the organic solvent from the organic solvent supply pipe 84 are performed in parallel to each other. However, the draining of the hydrophobizing agent from the hydrophobizing agent supply pipe 54 and the draining of the organic solvent from the organic solvent supply pipe 84 may be performed at different timings from each other.

After the end of the pre-dispensing step T2, next in the preprocessing S1, the controller 3 executes the charging step (standby position disposing step) T3 (see FIG. 8B). The charging step T3 is a step of charging (supplying) the hydrophobizing agent to the hydrophobizing agent pipe 51 and thereby disposing the leading end surface F1 of the hydrophobizing agent in the hydrophobizing agent standby position P1. In the present preferred embodiment, in the charging step T3, the organic solvent is not charged (supplied) to the organic solvent pipe 81.

Specifically, in the charging step T3, the controller 3 opens the hydrophobizing agent valve 57 and the hydrophobizing agent supply valve (the first hydrophobizing agent supply valve 60 and the second hydrophobizing agent supply valve 61) in a state where the other valves in the hydrophobizing agent supplying unit 10 are closed. Thereby, the first hydrophobizing agent base liquid flows into the first connection pipe 52 from the first hydrophobizing agent supply pipe 54, and the second hydrophobizing agent base liquid flows into the first connection pipe 52 from the second hydrophobizing agent supply pipe 55, so that the base liquids are mixed in the first connection pipe 52 and the hydrophobizing agent is produced. The produced hydrophobizing agent is moved toward the downstream side through the hydrophobizing agent pipe 51.

When a predetermined time period elapses after the opening of the hydrophobizing agent supply valve (the first hydrophobizing agent supply valve 60 and the second hydrophobizing agent supply valve 61), the controller 3 closes the hydrophobizing agent supply valve (the first hydrophobizing agent supply valve 60 and the second hydrophobizing agent supply valve 61). Thereby, as shown in FIG. 12B, the leading end surface F1 of the hydrophobizing agent is disposed in the hydrophobizing agent standby position P1.

The controller 3 monitors the position of the leading end surface F1 of the hydrophobizing agent in parallel to the charging step T3. Specifically, in a case where the existence of the hydrophobizing agent at the upper limit position 67a is detected by the first existence/non-existence sensor 65 (first sensor 64) and the non-existence of the hydrophobizing agent at the lower limit position 67b is detected by the second existence/non-existence sensor 66 (first sensor 64), the controller 3 determines that the leading end surface F1 of the hydrophobizing agent is disposed in the hydrophobizing agent standby position P1 (first determining step).

In a case of determining that the leading end surface F1 of the actual hydrophobizing agent after the charging step T3 is not disposed in the hydrophobizing agent standby position P1, the controller 3 judges an error (second error judgement). Specifically, in a case of determining that the leading end surface F1 of the actual hydrophobizing agent after the charging step T3 is not in the hydrophobizing agent standby position P1 by the first sensor 64 (NO in Q11 of FIG. 19), the controller 3 judges an error (Q12 of FIG. 19) and then executes error processing (Q13 of FIG. 19). In a case where the leading end surface F1 of the hydrophobizing agent after the charging step T3 is disposed in the hydrophobizing agent standby position P1 (YES in Q11 of FIG. 19), the processing of FIG. 19 (subroutine processing) is returned back to the caller.

When the charging step T3 ends, the preprocessing S1 is ended.

Next, the substrate processing S2 (see FIG. 8A) will be described. Regarding execution of the substrate processing S2, the process recipe 106 read out from the recipe storing portion 104 (see FIG. 7A) is always referenced.

When the substrate processing S2 is executed, a not-yet-processed substrate W is carried into the chamber 4 (Step E1 of FIG. 9). By bringing a hand H of the transfer robot CR holding the substrate W into the chamber 4, specifically, the substrate W is transferred to the spin chuck 5 in a state where a front surface (device forming surface) of the substrate opposes the upper side. After that, the substrate W is held by the spin chuck 5.

The substrate W is carried into the chamber 4 in a state where the shielding plate 21 is disposed at the retracted position and in a state where the first to third guards 44 to 46 are disposed at the lower position.

After that, the controller 3 controls the spin motor 16 to start rotation of the substrate W (Step E2 of FIG. 9). The substrate W is accelerated to a preliminarily set liquid processing speed (within a range of approximately 10 to 1,200 rpm and, for example, of approximately 1,000 rpm) and maintained at the liquid processing speed. The controller 3 controls the opposing member raising/lowering unit 39 to dispose the shielding plate 21 at the proximity position.

The controller 3 controls the guard raising/lowering unit 47 to raise the first to third guards 44 to 46 to the upper position. Thereby, as shown in FIG. 13, the first guard 44 opposes the peripheral end surface of the substrate W (realizing the first guard opposing state).

After the shielding plate 21 is disposed at the proximity position, next, the controller 3 performs the chemical liquid supplying step E3 (see FIG. 9) of supplying the chemical liquid to the upper surface of the substrate W. The controller 3 opens the chemical liquid valve 36. Thereby, the chemical liquid is discharged from the first discharge port 31a formed in the substrate opposing surface 21a of the shielding plate 21 toward the central portion of the upper surface the substrate W. The chemical liquid supplied to the upper surface of the substrate W receives a centrifugal force due to the rotation of the substrate W and is moved to a peripheral edge portion of the substrate W. Thereby, the entire upper surface of the substrate W is processed by using the chemical liquid.

After start of discharge of the chemical liquid from the first discharge port 31a, when a time period regulated by the process recipe 106 elapses, the controller 3 closes the chemical liquid valve 36.

Next, the controller 3 performs the rinsing step E4 (see FIG. 9) of supplying the rinse liquid to the upper surface of the substrate W. The controller 3 opens the rinse liquid valve 38. Thereby, the rinse liquid is discharged from the second discharge port 32a formed in the substrate opposing surface 21a of the shielding plate 21 toward the central portion of the upper surface of the substrate W. The rinse liquid supplied to the upper surface of the substrate W receives the centrifugal force due to the rotation of the substrate W and is moved to the peripheral edge portion of the substrate W. Thereby, the chemical liquid on the upper surface of the substrate W is replaced with the rinse liquid.

After start of discharge of the rinse liquid from the second discharge port 32a, when a preliminarily set time period elapses, the controller 3 closes the rinse liquid valve 38. Thereby, the discharge of the rinse liquid from the second discharge port 32a is stopped, and the rinsing step E4 ends.

Next, the controller 3 performs the first organic solvent supplying step E5 (see FIG. 9) of replacing the rinse liquid existing on the upper surface of the substrate W with the organic solvent (such as the IPA).

Specifically, the controller 3 controls the guard raising/lowering unit 47 to lower and dispose the first and second guards 44, 45 at the lower position while maintaining the third guard 46 at the upper position. Thereby, as shown in FIG. 13, the third guard 46 opposes the peripheral end surface of the substrate W (realizing the third guard opposing state). At this time, the time required for the raising/lowering action of the guards is, for example, 1.5 seconds.

While maintaining the rotation of the substrate W at the liquid processing speed, the controller 3 opens the organic solvent valve 87 and the organic solvent supply valve 90 and closes the other valves in the organic solvent supplying unit 11. Thereby, as shown in FIG. 13, the organic solvent is discharged from the fourth discharge port 34a formed in the substrate opposing surface 21a of the shielding plate 21 toward the central portion of the upper surface of the substrate W. The organic solvent supplied to the upper surface of the substrate W receives the centrifugal force due to the rotation of the substrate W and is moved to the peripheral edge portion of the substrate W. Thereby, the rinse liquid on the upper surface of the substrate W is replaced with the organic solvent.

In this regard, before discharge of the organic solvent in the first organic solvent supplying step E5 for the substrate processing S2 for the first time (substrate processing S2 performed for the first time to the substrate W which is housed in the common substrate container C (see FIG. 1) in the processing unit 2) (hereinafter, sometimes simply referred to as a "first organic solvent supplying step E5 for the first time"), the organic solvent does not exist inside the organic solvent pipe 81, inside the second connection pipe 82, and inside the organic solvent suction pipe 86. This is because in the discharge suctioning step T1, all the organic solvent is discharged from the inside of the organic solvent pipe 81, the inside of the second connection pipe 82, and the inside of the organic solvent suction pipe 86.

Meanwhile, before discharge of the organic solvent in the first organic solvent supplying step E5 for the substrate processing S2 for the second time or later (hereinafter, sometimes simply referred to as a "first organic solvent supplying step E5 for the second time or later"), the leading end surface F2 of the organic solvent of the organic solvent pipe 81 is disposed in the organic solvent standby position P2. Therefore, at the time of starting the first organic solvent supplying step E5, a time period from opening of the organic solvent supply valve 90 (and the organic solvent valve 87) to discharge of the organic solvent from the fourth discharge port 34a is different between the first organic solvent supplying step E5 for the first time and the first organic solvent supplying step E5 for the second time or later. Generally, counting of a processing time period of the first organic solvent supplying step E5 is started upon the opening of the organic solvent supply valve 90. Thus, when the time period from the opening of the organic solvent valve 87 to the discharge of the organic solvent from the fourth discharge port 34a is different, an actual time of supplying the organic solvent varies depending on each substrate W. As a result, there is a concern that the processing may vary depending on each substrate W.

In the present preferred embodiment, in order to keep a predetermined actual time of supplying in both the first organic solvent supplying step E5 for the first time and the first organic solvent supplying step E5 for the second time or later, the timing of opening the organic solvent supply valve 90 in the first organic solvent supplying step E5 for the first time is a-few-second (for example, approximately three seconds) earlier than an expected timing (timing of opening the organic solvent supply valve 90 in the first organic solvent supplying step E5 for the first time). That is, in the first organic solvent supplying step E5 for the first time, before starting the first organic solvent supplying step E5 (that is, before changing the height of the guards), the controller 3 opens the organic solvent supply valve 90 (prior provision of the organic solvent).

As described above with reference to FIG. 7B, in the first guard opposing state, the opening actions of the chemical liquid valve 36, the rinse liquid valve 38, the organic solvent supply valve 90, and the first and second hydrophobizing agent supply valves 60, 61 are permitted. Therefore, before starting the first organic solvent supplying step E5 (that is, before changing the height of the guards), it is possible to open the organic solvent supply valve 90 (it is possible to realize the prior provision of the organic solvent).

In a case of the first organic solvent supplying step E5 for the second time or later, the first organic solvent suctioning device 88 is in an enabled state. Therefore, after starting the first organic solvent supplying step E5, the controller 3 opens the second air supply valve (corresponding to the second air supply valve 71) for the first organic solvent suctioning device 88, and closes the second leak valve for the first organic solvent suctioning device 88. Thereby, since the air is supplied into the first organic solvent suctioning device 88, the function of the first organic solvent suctioning device 88 is disabled, and a small amount of the organic solvent that has been suctioned by the first organic solvent suctioning device 88 is discharged to the organic solvent pipe 81.

In the first organic solvent supplying step E5, after start of the discharge of the organic solvent from the fourth discharge port 34a, when a time period regulated by the process recipe 106 elapses, the controller 3 closes the organic solvent valve 87 and the organic solvent supply valve 90. Thereby, as shown in FIG. 14, the discharge of the organic solvent from the fourth discharge port 34a is stopped. In a state where the organic solvent valve 87 remains closed, the controller 3 enables the function of the first organic solvent suctioning device 88. The inside of a portion of the organic solvent pipe 81 on the downstream side of a portion where the first organic solvent suctioning device 88 is interposed is exhausted, and as shown in FIG. 14, the organic solvent remaining inside the portion on the downstream side is drawn into the inside of the first organic solvent suctioning device (region expanded by driving the diaphragm). A suction amount of the first organic solvent suctioning device 88 is set so that the leading end surface F2 of the organic solvent is retracted to the predetermined organic solvent standby position P2 set in the second right/left direction portion 81b. The suction amount of the organic solvent at this time is approximately 0.1 to 1 milliliter. When the leading end surface F2 of the organic solvent has been retracted to the organic solvent standby position P2, the controller 3 closes the organic solvent supply valve 90 (and the organic solvent valve 87). Thereby, the leading end surface F2 of the organic solvent is disposed in the organic solvent standby position P2.

Based on stoppage of the discharge of the organic solvent from the fourth discharge port 34a, the first organic solvent supplying step E5 ends.

Next, as shown in FIG. 14, the controller 3 performs a spinning-off step of spinning off the organic solvent existing on the upper surface of the substrate W. Specifically, the controller 3 controls the spin motor 16 to accelerate the substrate W to a spin-off rotation speed (for example, several thousand rpm) which is greater than the rotation speed in the steps from the chemical liquid supplying step E3 to the first organic solvent supplying step E5, and rotate the substrate W at the spinning-off speed. Thereby, a large centrifugal force is added to the liquid on the substrate W, and the liquid adhered to the substrate W is spun off to the periphery of the substrate W. In this way, the organic solvent is removed from the substrate W.

Next, the controller 3 performs the hydrophobizing agent supplying step E6 of replacing the organic solvent existing on the upper surface of the substrate W with the liquid hydrophobizing agent (see FIG. 9). Specifically, the controller 3 controls the guard raising/lowering unit 47 to raise and dispose the second guard 45 at the upper position while maintaining the third guard 46 at the upper position. Thereby, as shown in FIG. 15, the second guard 45 opposes the peripheral end surface of the substrate W (realizing the second guard opposing state). At this time, the time required for the raising/lowering action of the guards is, for example, 1.5 seconds.

While maintaining the shielding plate 21 at the proximity position, the controller 3 opens the hydrophobizing agent supply valve (the first hydrophobizing agent supply valve 60 and the second hydrophobizing agent supply valve 61) and the hydrophobizing agent valve 57 and closes the other valves in the hydrophobizing agent supplying unit 10.

Regardless of whether the previously performed first organic solvent supplying step E5 is the first organic solvent supplying step E5 for the first time or the first organic solvent supplying step E5 for the second time or later, the leading end surface F1 of the hydrophobizing agent is disposed in the hydrophobizing agent standby position P1 before starting the hydrophobizing agent supplying step E6.

In a case of the first organic solvent supplying step E5 for the second time or later, the first hydrophobizing agent suctioning device 58 is in an enabled state. Therefore, after starting the hydrophobizing agent supplying step E6, the controller 3 opens the second air supply valve 71 and closes the second leak valve. Thereby, the air is supplied into the first hydrophobizing agent suctioning device 58. As a result, the function of the first hydrophobizing agent suctioning device 58 is disabled, and a small amount of the hydrophobizing agent that has been suctioned by the first hydrophobizing agent suctioning device 58 is discharged to the hydrophobizing agent pipe 51.

By opening the hydrophobizing agent supply valve (the first hydrophobizing agent supply valve 60 and the second hydrophobizing agent supply valve 61) and the hydrophobizing agent valve 57, the hydrophobizing agent in the hydrophobizing agent supply pipe (the first hydrophobizing agent supply pipe 54 and the second hydrophobizing agent supply pipe 55) is supplied to the hydrophobizing agent pipe 51 via the first connection pipe 52. Thereby, as shown in FIG. 15, the hydrophobizing agent is discharged from the third discharge port 33a formed in the substrate opposing surface 21a of the shielding plate 21 toward the central portion of the upper surface of the substrate W. The hydrophobizing agent supplied to the upper surface of the substrate W receives the centrifugal force due to the rotation of the substrate W and is moved to the peripheral edge portion of the substrate W. Thereby, the organic solvent on the upper surface of the substrate W is replaced with the hydrophobizing agent.

In the hydrophobizing agent supplying step E6, after start of the discharge of the hydrophobizing agent from the third discharge port 33a, when a time period regulated by the process recipe 106 elapses, the controller 3 closes the hydrophobizing agent valve 57, the first hydrophobizing agent supply valve 60, and the second hydrophobizing agent supply valve 61. Thereby, as shown in FIG. 16, the discharge of the hydrophobizing agent from the third discharge port 33a is stopped. In a state where the hydrophobizing agent valve 57 remains closed, the controller 3 opens the first air supply valve 69. Thereby, the inside of a portion of the hydrophobizing agent pipe 51 on the downstream side of a portion where the first hydrophobizing agent suctioning device 58 is interposed is exhausted, and as shown in FIG. 16, the hydrophobizing agent remaining inside the portion on the downstream side is drawn into the inside of the first hydrophobizing agent suctioning device 58 (region expanded by driving the diaphragm). A suction amount of the first hydrophobizing agent suctioning device 58 is set so that the leading end surface F1 of the hydrophobizing agent is retracted to the predetermined hydrophobizing agent standby position P1 set in the first right/left direction portion 51b. The suction amount of the hydrophobizing agent at this time is approximately 0.1 to 1 milliliter. Thereby, the leading end surface F1 of the hydrophobizing agent is disposed in the hydrophobizing agent standby position P1.

Based on stoppage of the discharge of the hydrophobizing agent from the third discharge port 33a, the hydrophobizing agent supplying step E6 ends.

Next, the controller 3 performs the second organic solvent supplying step E7 of replacing the hydrophobizing agent existing on the upper surface of the substrate W with the organic solvent (for example, the IPA) (see FIG. 9).

Specifically, the controller 3 controls the guard raising/lowering unit 47 to lower and dispose the second guard 45 at the lower position while maintaining the third guard 46 at the upper position. Thereby, as shown in FIG. 16, the third guard 46 opposes the peripheral end surface of the substrate W (realizing the third guard opposing state). At this time, the time required for a raising/lowering action of the guards is, for example, 1.5 seconds.

While maintaining the rotation of the substrate W at the liquid processing speed, the controller 3 opens the organic solvent valve 87 and the organic solvent supply valve 90 and closes the other valves in the organic solvent supplying unit 11. Thereby, the organic solvent is discharged from the fourth discharge port 34a formed in the substrate opposing surface 21a of the shielding plate 21 toward the central portion of the upper surface of the substrate W. The organic solvent supplied to the upper surface of the substrate W receives the centrifugal force due to the rotation of the substrate W and is moved to the peripheral edge portion of the substrate W. Thereby, the hydrophobizing agent on the upper surface of the substrate W is replaced with the organic solvent.

After start of the second organic solvent supplying step E7, the controller 3 stops to drive of the first organic solvent suctioning device 88 is stopped. Thereby, a small amount of the organic solvent that has been suctioned by the first organic solvent suctioning device 88 is discharged to the organic solvent pipe 81.

In the second organic solvent supplying step E7, after start of the discharge of the organic solvent from the fourth discharge port 34a, when a time period regulated by the process recipe 106 elapses, the controller 3 closes the organic solvent valve 87 and the organic solvent supply valve 90. Thereby, the discharge of the organic solvent from the fourth discharge port 34a is stopped. In a state where the organic solvent valve 87 remains closed, the controller 3 enables the function of the first organic solvent suctioning device 88. The inside of a portion of the organic solvent pipe 81 on the downstream side of a portion where the first organic solvent suctioning device 88 is interposed is exhausted, and the organic solvent remaining inside the portion on the downstream side is drawn into the inside of the first organic solvent suctioning device 88 (region expanded by driving the diaphragm). A suction amount of the first organic solvent suctioning device 88 is set so that the leading end surface F2 of the organic solvent is retracted to the predetermined organic solvent standby position P2 set in the second right/left direction portion 81b. The suction amount of the organic solvent at this time is approximately 0.1 to 1 milliliter. When the leading end surface F2 of the organic solvent has been retracted to the organic solvent standby position P2, the controller 3 closes the organic solvent supply valve 90 (and the organic solvent valve 87). Thereby, the leading end surface F2 of the organic solvent is disposed in the organic solvent standby position P2.

Based on stoppage of the discharge of the organic solvent from the fourth discharge port 34a, the second organic solvent supplying step E7 ends.

Next, the spin drying step E8 of drying the substrate W (see FIG. 9) is performed. Specifically, in a state where the shielding plate 21 is disposed at the proximity position, the controller 3 controls the spin motor 16 to accelerate the substrate W to a drying rotation speed (for example, several thousand rpm) which is greater than the rotation speed in the steps from the chemical liquid supplying step E3 to the second organic solvent supplying step E7, and rotate the substrate W at the drying rotation speed. Thereby, large centrifugal force is added to the liquid on the substrate W, and the liquid adhered to the substrate W is spun off to the periphery of the substrate W. In this way, the liquid is removed from the substrate W and the substrate W is dried.

When a preliminarily set time period elapses after the acceleration of the substrate W, the controller 3 stops the rotation of the substrate W by the spin chuck 5 by controlling the spin motor 16 (Step E9 of FIG. 9). After that, the controller 3 controls the opposing member raising/lowering unit 39 to raise and dispose the shielding plate 21 at the retracted position. The controller 3 also controls the guard raising/lowering unit 47 to lower the first and second guards 44, 45 and retreat all the guards below the peripheral end surface of the substrate W.

After that, the substrate W is carried out from the inside of the chamber 4 (Step E10 of FIG. 9). Specifically, the controller 3 brings the hand of the transfer robot CR into the chamber 4. The controller 3 makes the hand of the transfer robot CR hold the substrate W on the spin chuck 5. After that, the controller 3 retreats the hand of the transfer robot CR from the inside of the chamber 4. Thereby, the processed substrate W is carried out of the chamber 4.

As described above, according to the present preferred embodiment, the suctioning step includes the step of disposing the leading end surface F1 of the hydrophobizing agent in the hydrophobizing agent standby position P1 (first suctioning step; suctioning for preventing dripping), and the discharge suctioning step T1 of eliminating all the hydrophobizing agent from the inside of the hydrophobizing agent pipe 51, the inside of the first connection pipe 52, and the inside of the hydrophobizing agent suction pipe 56 (of retracting the leading end surface F1 of the hydrophobizing agent at least to the upstream side (hydrophobizing agent suction pipe 56 side) of the upstream end (portion where the hydrophobizing agent suction pipe 56 is connected) of the first connection pipe 52) (second suctioning step). By then supplying the hydrophobizing agent to the hydrophobizing agent suction pipe 56 in the charging step T3 (standby position disposing step) performed after the discharge suctioning step T1, the leading end surface F1 of the hydrophobizing agent is brought forward and the leading end surface F1 of the hydrophobizing agent is disposed in the hydrophobizing agent standby position P1. Therefore, even in a case where either of the suctioning is executed, it is possible to dispose the leading end surface F1 of the hydrophobizing agent in the hydrophobizing agent standby position P1 serving as a common standby position before next discharge of the hydrophobizing agent. Thereby, regardless of the type of the suctioning step of suctioning the inside of the hydrophobizing agent suction pipe 56, it is possible to discharge the hydrophobizing agent from the third discharge port 33a at a common timing after the hydrophobizing agent valve 57 and the hydrophobizing agent supply valve are opened. Therefore, it is possible to perform uniform processing by using the hydrophobizing agent on the substrate W.

In particular, in the hydrophobizing agent supplying step E6 according to the present preferred embodiment, when supply of the hydrophobizing agent to the upper surface (front surface) of the substrate W is interrupted, drying progresses on the upper surface (front surface) of the substrate W, and as a result, there is a concern that pattern may collapse occur. However, in the present preferred embodiment, in the hydrophobizing agent supplying step E6 of discharging the hydrophobizing agent from the third discharge port 33a at a common timing, there is almost no time period when the hydrophobizing agent is not supplied. Therefore, it is possible to suppress the pattern collapse based on promotion of drying of the upper surface (front surface) of the substrate W in the hydrophobizing agent supplying step E6.

In the hydrophobizing agent supplying step E6, the second guard opposing state is also realized. In the second guard opposing state, the opening actions of the first and second hydrophobizing agent supply valves 60, 61 are permitted, whereas the opening actions of the chemical liquid valve 36, the rinse liquid valve 38, and the organic solvent supply valve 90 are prohibited. By such a hard interlock, it is possible to reliably prevent the mixing and the contact between the hydrophobizing agent and the organic solvent in the processing cup 12. Therefore, it is possible to prevent the occurrence of particles in advance.

In particular, in the present preferred embodiment, as described above with reference to FIG. 7B, in the third guard opposing state, the opening actions of the first and second hydrophobizing agent supply valves 60, 61 are prohibited. Therefore, it is not possible to open the first and second hydrophobizing agent supply valves 60, 61 before starting the hydrophobizing agent supplying step E6 (that is, before changing the height of the guards). That is, it is not possible to perform prior provision of the processing liquid (prior provision of the hydrophobizing agent) as performed in the first organic solvent supplying step E5.

Even in a case where such a hard interlock effectively functions, by executing the charging step T3 after the discharge suctioning step T1 in the preprocessing S1, it is possible to dispose the leading end surface F1 of the hydrophobizing agent in the hydrophobizing agent standby position P1 before starting the hydrophobizing agent supplying step E6.

In parallel to the charging step T3, whether or not the leading end surface F1 of the hydrophobizing agent is disposed in the hydrophobizing agent standby position P1 is detected by the first sensor 64. By actually detecting the position of the leading end surface F1 of the hydrophobizing agent by the first sensor 64 in parallel to the charging step T3, it is possible to accurately detect whether or not the leading end surface F1 of the hydrophobizing agent after the charging step T3 is in the hydrophobizing agent standby position P1.

The second sensor 77 arranged to detect the flow rate of the hydrophobizing agent (hydrophobizing agent base liquid) supplied to the hydrophobizing agent supply pipe 54, 55 in the charging step T3 is provided. The adjustment is made by the orifice 72 so that the pressure loss of the liquid at the time of flowing through the hydrophobizing agent pipe 51 matches the pressure loss of the liquid at the time of flowing through the hydrophobizing agent drain pipe 53. Thus, in the pre-dispensing step T2, by detecting the flow rate of the hydrophobizing agent guided to the hydrophobizing agent drain pipe 53 from the hydrophobizing agent supply pipe 54, 55 by the second sensor 77, it is possible to accurately acquire the flow rate of the hydrophobizing agent supplied to the hydrophobizing agent supply pipes 54, 55 in the charging step T3. When it is possible to accurately grasp the flow rate of the hydrophobizing agent in the charging step T3, by managing a time of charging the hydrophobizing agent in the charging step T3, it is possible to accurately control the leading end surface F1 of the hydrophobizing agent after the charging step T3. Thereby, it is possible to accurately detect whether or not the leading end surface F1 of the hydrophobizing agent after the charging step T3 is in the hydrophobizing agent standby position P1.

Figure 22:
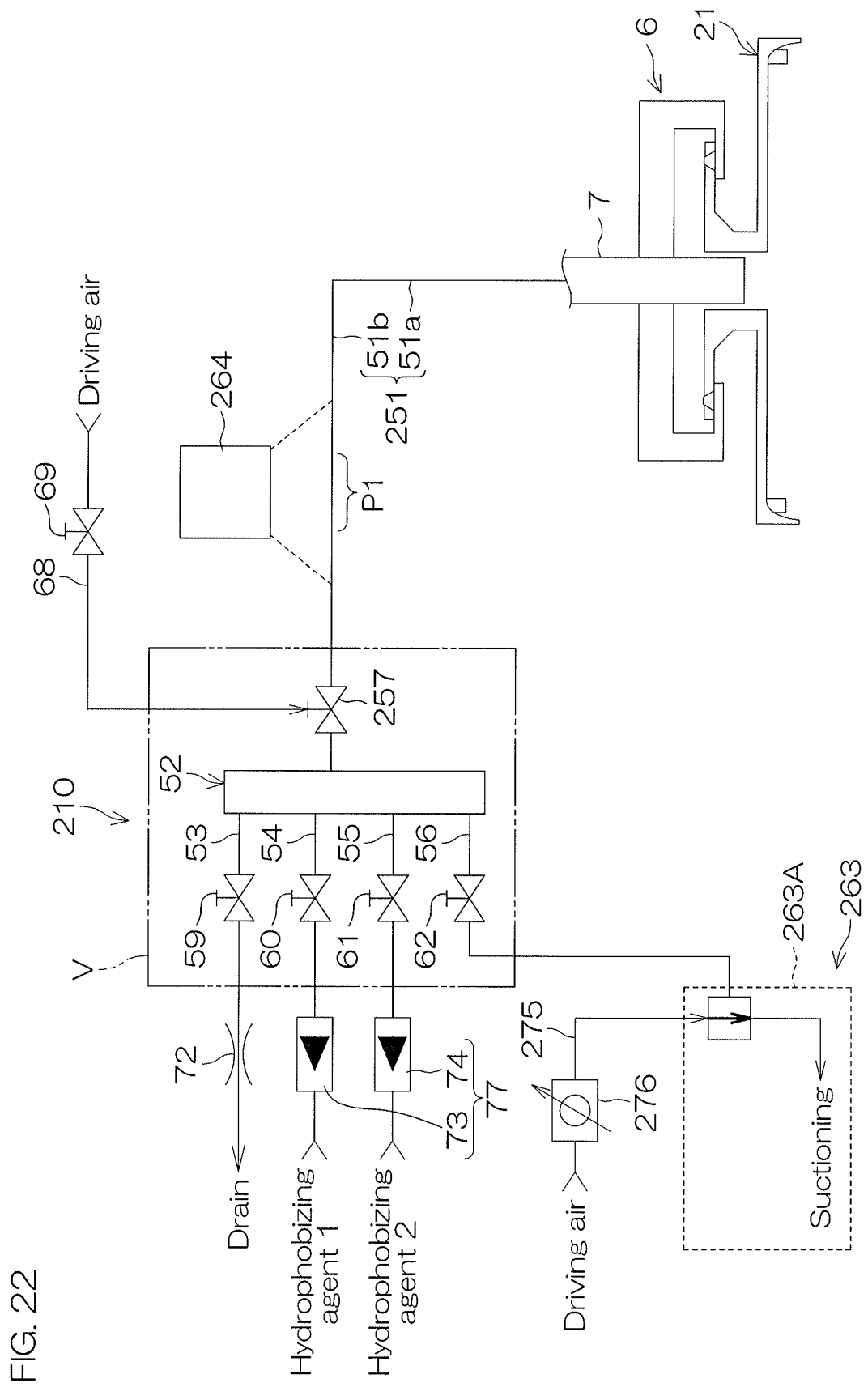
FIG. 22 is a diagram for describing a detailed arrangement of a hydrophobizing agent supplying unit according to a second preferred embodiment of the present invention.

FIG. 22 is a diagram for describing a detailed arrangement of a hydrophobizing agent supplying unit 210 according to a second preferred embodiment of the present invention.

In the second preferred embodiment, portions common to the first preferred embodiment described above will be given the same reference numerals as in the case of FIGS. 1 to 19 and description thereof will be omitted.

A first point of difference of the hydrophobizing agent supplying unit 210 according to the second preferred embodiment from the hydrophobizing agent supplying unit 10 (see FIG. 6) according to the first preferred embodiment is the point that the first hydrophobizing agent suctioning device 58 formed by the diaphragm type suctioning device is removed. In addition, the hydrophobizing agent supplying unit 210 includes a second hydrophobizing agent suctioning device 263 with adjustable suction force as a second hydrophobizing agent suctioning device in place of the second hydrophobizing agent suctioning device 63 with non-adjustable suction force.

The hydrophobizing agent supplying unit 210 includes a hydrophobizing agent pipe (processing liquid pipe) 251 connected to a third nozzle pipe 33, a hydrophobizing agent valve 257 arranged to open and close the hydrophobizing agent pipe 251, and a first connection pipe 52. The hydrophobizing agent pipe 251 is different from the hydrophobizing agent pipe 51 (see FIG. 6) in the point that at least a portion of a first right/left direction portion 5ib around a hydrophobizing agent standby position P1 has transparency, and common to the hydrophobizing agent pipe 51 in the other points.

The hydrophobizing agent supplying unit 210 includes a hydrophobizing agent drain valve 59, a first hydrophobizing agent supply valve 60, a second hydrophobizing agent supply valve 61, and a hydrophobizing agent suction valve 62. A valve unit V is formed by the first connection pipe 52, the hydrophobizing agent valve 257, the hydrophobizing agent drain valve 59, the first hydrophobizing agent supply valve 60, the second hydrophobizing agent supply valve 61, and the hydrophobizing agent suction valve 62.

Except the hydrophobizing agent drain valve 59 included in the hydrophobizing agent supplying unit 210, a valve (including a needle valve) arranged to open and close the hydrophobizing agent pipe 251 is not interposed in the hydrophobizing agent valve 257. As described above, the first hydrophobizing agent suctioning device 58 is not interposed in the hydrophobizing agent pipe 251. That is, in a portion of the hydrophobizing agent pipe 251 between the valve unit V and a central axis nozzle 7, no valve or diaphragm type suctioning device exists. When a valve and a diaphragm type suctioning device exist in the portion of the hydrophobizing agent pipe 251 between the valve unit V and the central axis nozzle 7, a problem to be described next occurs. That is, there is a concern that a liquid-tight state of a processing liquid (hydrophobizing agent) may be interrupted in an internal flow passage of the valve and an internal flow passage of the diaphragm type suctioning device. In that case, there is a case where the liquid remains in the internal flow passages. Therefore, even after suctioning of the processing liquid inside the hydrophobizing agent pipe 251, there is a concern that the liquid may remain inside (that is, in an internal flow passage of) the hydrophobizing agent pipe 251.

However, in the present preferred embodiment, in the portion of the hydrophobizing agent pipe 251 between the valve unit V and the central axis nozzle 7, no valve or diaphragm type suctioning device exists. Therefore, after suctioning the processing liquid inside the hydrophobizing agent pipe 251, it is possible to reliably prevent the liquid from remaining inside (that is, in the internal flow passage of) the hydrophobizing agent pipe 251.

The second hydrophobizing agent suctioning device 263 is an ejector type suctioning device. The second hydrophobizing agent suctioning device 263 includes a depressurized state generator (vacuum generator) 263A that generates a depressurized state by supplying a compressed fluid, a fluid supply pipe 275 through which the compressed fluid is supplied to the depressurized state generator 263A, and an electropneumatic regulator 276 arranged to open and close a pipe passage of the fluid supply pipe 275 and change an opening degree of the pipe passage. By opening of the electropneumatic regulator 276 and flowing of the fluid in the fluid supply pipe 275 in an energized state of the second hydrophobizing agent suctioning device 263, the inside of the second hydrophobizing agent suctioning device 263 is depressurized. Thereby, the inside of a hydrophobizing agent suction pipe (suction pipe) 56 is suctioned. That is, a function of the second hydrophobizing agent suctioning device 263 is enabled.

By adjusting the opening degree of the fluid supply pipe 275 by the electropneumatic regulator 276, a degree of depressurization generated by the depressurized state generator 263A (degree of depressurization inside the second hydrophobizing agent suctioning device 263) is adjusted. Specifically, when the opening degree of the fluid supply pipe 275 is large, the degree of depressurization generated by the depressurized state generator 263A is increased. Therefore, by adjusting the opening degree of the fluid supply pipe 275 by the electropneumatic regulator 276, the degree of depressurization generated by the depressurized state generator 263A is adjusted. The electropneumatic regulator 276 can steplessly adjust the opening degree of the fluid supply pipe 275. Therefore, the degree of depressurization generated by the depressurized state generator 263A is steplessly adjusted.

A controller 3 further controls drive of the depressurized state generator 263A according to a preliminarily set program. The controller 3 also controls opening/closing and an opening degree of the electropneumatic regulator 276.

In a discharge suctioning step T1 (see FIG. 11), the controller 3 opens the electropneumatic regulator 276, and sets the opening degree of the electropneumatic regulator to a large first opening degree. Thereby, a large flow rate of the compressed fluid is supplied to the depressurized state generator 263A. As a result, the degree of depressurization inside the second hydrophobizing agent suctioning device 263 is large. In this state, while closing the other valves in the hydrophobizing agent supplying unit 10, the controller 3 opens the hydrophobizing agent valve 257 and the hydrophobizing agent suction valve 62. Thereby, the inside of the hydrophobizing agent suction pipe 56 and the inside of the first connection pipe 52 are exhausted in a large scale, and large suction force acts on the hydrophobizing agent remaining inside the hydrophobizing agent pipe 251, so that the hydrophobizing agent is drawn into the hydrophobizing agent suction pipe 56 through the first connection pipe 52. After all the hydrophobizing agent is discharged from the inside of the hydrophobizing agent pipe 251, the inside of the first connection pipe 52, and the inside of the hydrophobizing agent suction pipe 56, the controller 3 closes the hydrophobizing agent suction valve 62 and the hydrophobizing agent valve 257.

At the time of the end of a hydrophobizing agent supplying step E6 (see FIG. 15), the hydrophobizing agent valve 257, the first hydrophobizing agent supply valve 60, and the second hydrophobizing agent supply valve 61 are closed. Thereby, discharge of the hydrophobizing agent from a third discharge port 33a is stopped. At this time, the controller 3 opens the electropneumatic regulator 276, and sets the opening degree of the electropneumatic regulator to a second opening degree which is smaller than the first opening degree. Thereby, a small flow rate of the compressed fluid is supplied to the depressurized state generator 263A. As a result, the degree of depressurization inside the second hydrophobizing agent suctioning device 263 is small. In this state, while closing the other valves in the hydrophobizing agent supplying unit 10, the controller 3 opens the hydrophobizing agent valve 257 and the hydrophobizing agent suction valve 62. Thereby, the inside of the hydrophobizing agent suction pipe 56 and the inside of the first connection pipe 52 are exhausted in a small scale, and small suction force acts on the hydrophobizing agent remaining inside the hydrophobizing agent pipe 251, so that the hydrophobizing agent is drawn into the hydrophobizing agent suction pipe 56 through the first connection pipe 52. When a leading end surface F1 of the hydrophobizing agent has been retracted to the predetermined hydrophobizing agent standby position P1 set in the first right/left direction portion 51b, the controller 3 closes the hydrophobizing agent suction valve 62 and the hydrophobizing agent valve 257. Thereby, the leading end surface F1 of the hydrophobizing agent is disposed in the hydrophobizing agent standby position P1 (see FIG. 15).

In a charging step T3 (see FIG. 12B), the controller 3 opens the electropneumatic regulator 276 and sets the opening degree of the electropneumatic regulator to a third opening degree between the first opening degree and the second opening degree. Thereby, a medium flow rate of the compressed fluid is supplied to the depressurized state generator 263A. As a result, the inside of the second hydrophobizing agent suctioning device 263 is depressurized moderately. In this state, while closing the other valves in the hydrophobizing agent supplying unit 10, the controller 3 opens the hydrophobizing agent valve 257 and the hydrophobizing agent suction valve 62. Thereby, the inside of the hydrophobizing agent suction pipe 56 and the inside of the first connection pipe 52 are exhausted moderately, and a moderate suction force (which is smaller than the suction force in the discharge suctioning step T1 and larger than the suction force at the end of the hydrophobizing agent supplying step E6) acts on the hydrophobizing agent remaining inside the hydrophobizing agent pipe 251.

That is, in parallel to the charging step T3, the inside of the hydrophobizing agent pipe 251 is suctioned (parallel suctioning step). The hydrophobizing agent supplied (charged) to the hydrophobizing agent pipe 251 receives predetermined supply pressure. The suction force acts on the hydrophobizing agent that moves toward the third discharge port 33a in the hydrophobizing agent pipe 251 in the opposite direction to the moving direction of the hydrophobizing agent. Since the suction force acting on the inside of the hydrophobizing agent suction pipe 56 is relatively large, it is thereby possible to sufficiently decelerate the hydrophobizing agent moved in the hydrophobizing agent pipe 251.

In this case, the third opening degree of the electropneumatic regulator 276 may be set so that the suction force acting on the hydrophobizing agent and the supply pressure are balanced in a state where the leading end surface F1 of the hydrophobizing agent is placed in the hydrophobizing agent standby position P1. In this case, in the charging step T3, it is possible to automatically stop the leading end surface F1 of the hydrophobizing agent in the hydrophobizing agent standby position P1.

Stoppage of the leading end surface F1 of the hydrophobizing agent in the hydrophobizing agent standby position P1 in the charging step T3 is not limited to automatic stoppage. Regarding the hydrophobizing agent decelerated in accordance with suctioning of the inside of the hydrophobizing agent pipe 251, by managing a charging time or detecting the leading end surface F1 by a sensor provided in relation to the hydrophobizing agent standby position P1, the leading end surface F1 may be stopped in the hydrophobizing agent standby position P1.

A second point of difference of the hydrophobizing agent supplying unit 210 according to the second preferred embodiment from the hydrophobizing agent supplying unit 10 according to the first preferred embodiment (see FIG. 6) is the point that the first sensor 64 arranged to detect the leading end surface of the hydrophobizing agent (processing liquid) is removed, and a camera 264 is provided instead.

The camera 264 includes a lens that forms an optical image of the hydrophobizing agent standby position P1 and a periphery of the position in the hydrophobizing agent pipe 251, an imaging device that converts the optical image formed by the lens into an electric signal, and an imaging circuit that generates an image signal based on the converted electric signal and sends the signal to the controller 3. Since at least a portion of the hydrophobizing agent pipe 251 around the hydrophobizing agent standby position P1 has transparency, it is possible to favorably take an image of the leading end surface F1 of the hydrophobizing agent around the hydrophobizing agent standby position P1.

The imaging device includes a CCD image sensor and a CMOS image sensor. The camera 264 may be a general camera capable of imaging at a speed of approximately 10 to 100 images per second. However, the camera 264 may be a high-speed camera capable of imaging at a speed of several thousand to several tens of thousands of images per second.

The controller 3 inspects the leading end surface F1 of the hydrophobizing agent based on the image signal given from the imaging circuit of the camera 264.

In the charging step T3, an image of the leading end surface F1 of the hydrophobizing agent is taken by the camera 264. By an imaging result by the camera 264, whether or not the leading end surface F1 of the hydrophobizing agent is in the hydrophobizing agent standby position P1 is determined. Thereby, it is possible to accurately detect that the leading end surface F1 of the hydrophobizing agent is disposed in the hydrophobizing agent standby position P1.

The second preferred embodiment describes the case where the point that the suctioning device formed by the diaphragm type suctioning device (first hydrophobizing agent suctioning device 58) is removed and the suctioning device with adjustable suction force (second hydrophobizing agent suctioning device 263) is provided instead, and the point that the sensor arranged to detect the leading end surface of the processing liquid (hydrophobizing agent) (first sensor 64) is removed and the camera (camera 264) is provided instead apply to the hydrophobizing agent supplying unit 210. However, these characteristics may apply to the organic solvent supplying unit 11.

Not both but one of the point that the suctioning device formed by the diaphragm type suctioning device is removed and the suctioning device with the adjustable suction force is provided instead, and the point that the sensor arranged to detect the leading end surface of the processing liquid is removed and the camera is provided instead may apply.

Figure 24:
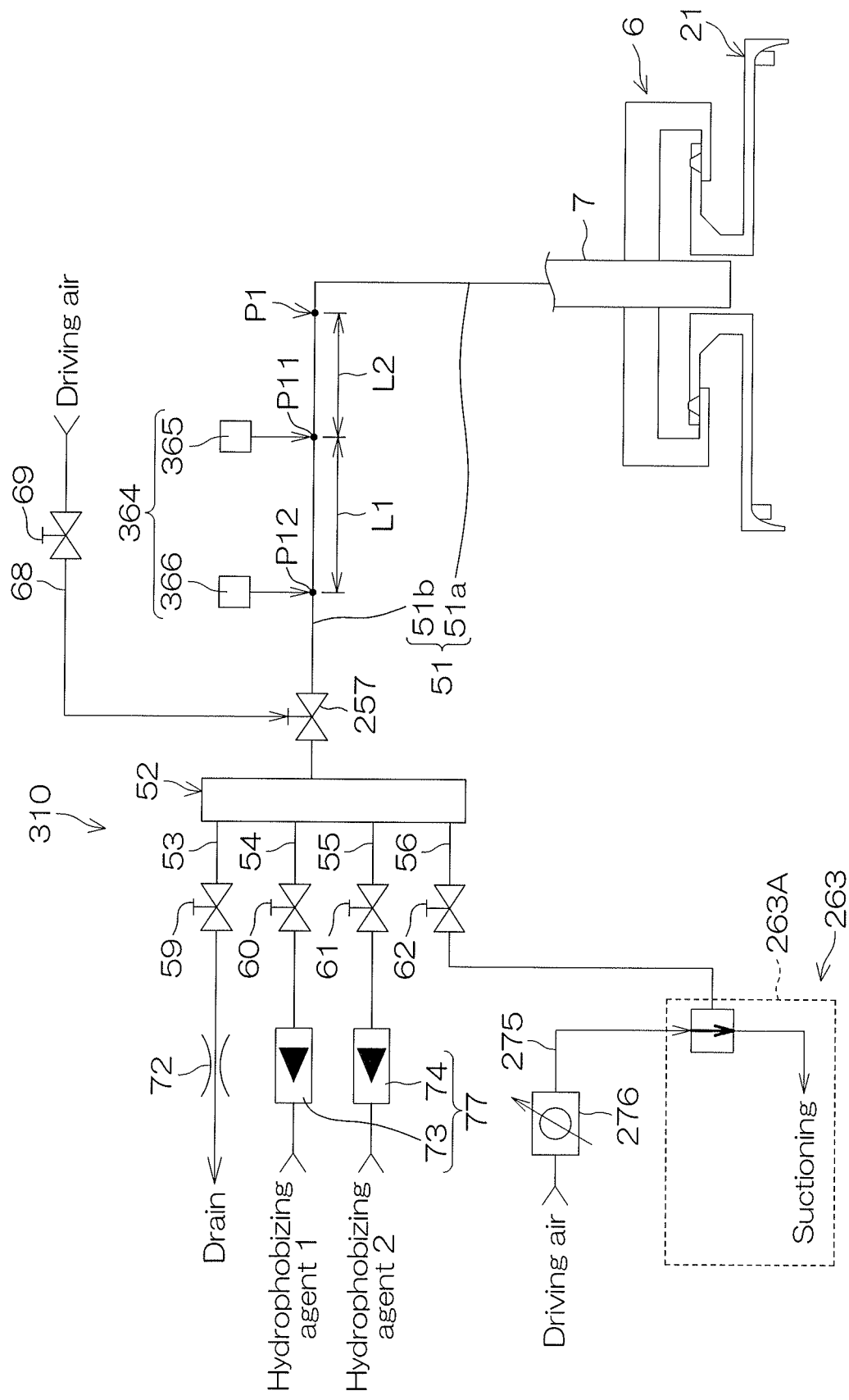
FIG. 24 is a diagram for describing a detailed arrangement of a hydrophobizing agent supplying unit 310 according to a third preferred embodiment of the present invention.

FIG. 24 is a diagram for describing a detailed arrangement of a hydrophobizing agent supplying unit 310 according to a third preferred embodiment of the present invention.

Figure 23:
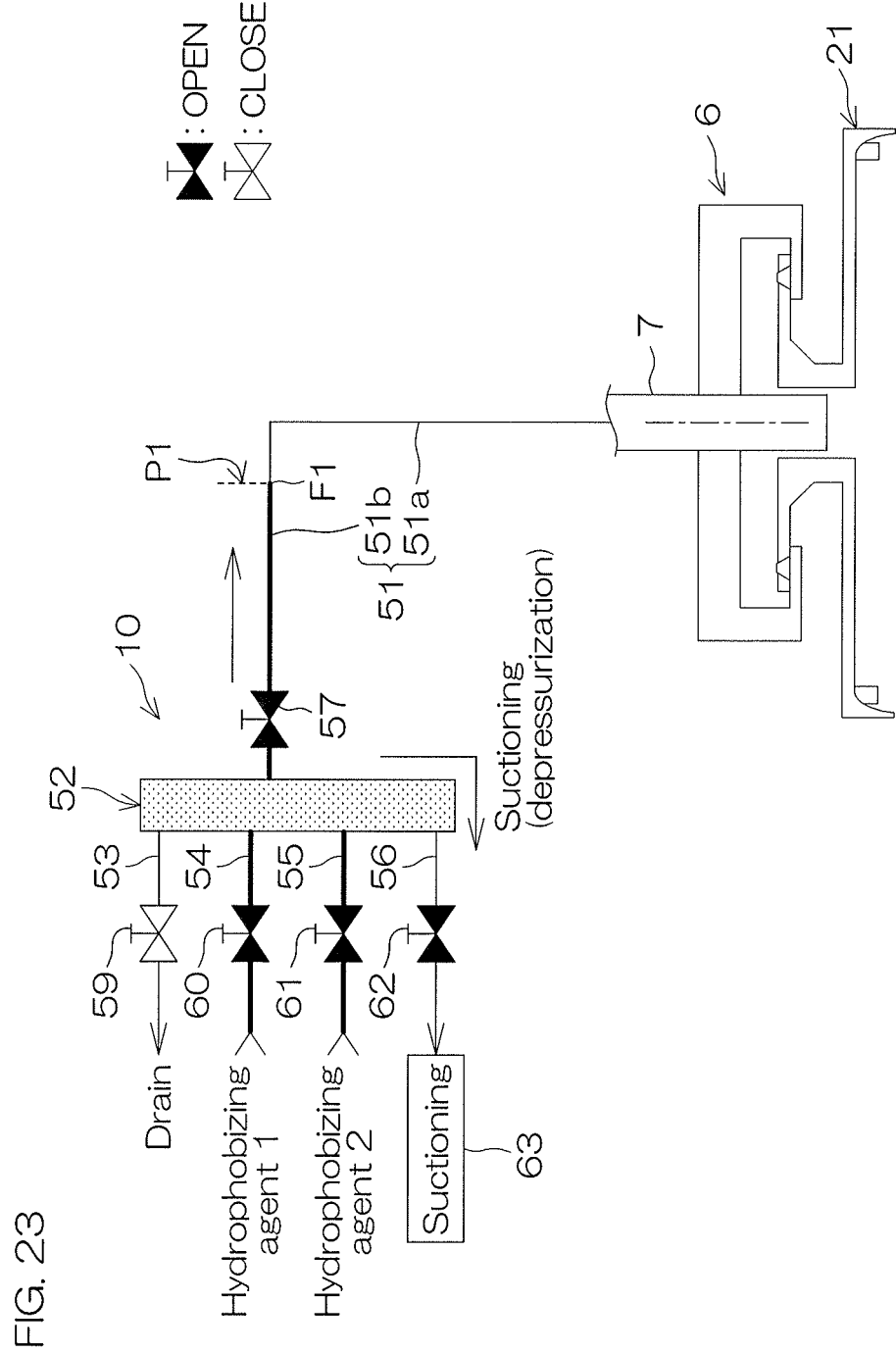
FIG. 23 is a diagram for describing a charging step executed in the hydrophobizing agent supplying unit.

In the third preferred embodiment, portions common to the first and second preferred embodiments described above will be given the same reference numerals as in the case of FIGS. 1 to 19 and the case of FIGS. 22 and 23, and description thereof will be omitted.

A first point of difference of the hydrophobizing agent supplying unit 310 according to the third preferred embodiment from the hydrophobizing agent supplying unit 10 according to the first preferred embodiment (see FIG. 6) is the point that the first hydrophobizing agent suctioning device 58 formed by the diaphragm type suctioning device is removed. In addition, the hydrophobizing agent supplying unit 310 includes a second hydrophobizing agent suctioning device 263 with adjustable suction force as a second hydrophobizing agent suctioning device in place of the second hydrophobizing agent suctioning device 63 with non-adjustable suction force. Since this point is common to the hydrophobizing agent supplying unit 210 according to the second preferred embodiment (see FIG. 22), description thereof will be omitted.

A second point of difference of the hydrophobizing agent supplying unit 310 according to the third preferred embodiment from the hydrophobizing agent supplying unit 10 according to the first preferred embodiment (see FIG. 6) is the point that the first sensor 64 arranged to detect the leading end surface of the hydrophobizing agent (processing liquid) is removed, and a third sensor 364 arranged to detect a hydrophobizing agent (processing liquid) is provided instead.

The third sensor 364 is disposed in relation to a pipe wall of a first right/left direction portion 51b of a hydrophobizing agent pipe 51. The third sensor 364 includes a first liquid surface sensor 365 disposed on the downstream side and a second liquid surface sensor 366 disposed on the upstream side. The first liquid surface sensor 365 and the second liquid surface sensor 366 are set on the upstream side of a hydrophobizing agent standby position P1.

In the present preferred embodiment, the hydrophobizing agent standby position P1 is set close to a downstream end of the first right/left direction portion 51b. The hydrophobizing agent standby position P1 is set at such a position for the following reason. That is, when a gap between the hydrophobizing agent standby position P1 and a third discharge port 33a is large, it is highly probable that the space between the hydrophobizing agent standby position P1 and the third discharge port 33a contains grit and dust. Therefore, the gap between the hydrophobizing agent standby position P1 and the third discharge port 33a is preferably as short as possible.

Meanwhile, in a case where the hydrophobizing agent standby position P1 is set close to the downstream end of the first right/left direction portion 51b, and when a leading end surface of the hydrophobizing agent overruns the hydrophobizing agent standby position P1, there is a concern that the leading end surface of the hydrophobizing agent may reach a first up/down direction portion 51a. In this case, there is a possibility that the hydrophobizing agent drops down (so-called dripping) from the third discharge port 33a. In order to set a short gap between the hydrophobizing agent standby position P1 and the third discharge port 33a while preventing such dripping of the hydrophobizing agent, there is a need for accurately disposing the leading end surface of the hydrophobizing agent in the hydrophobizing agent standby position P1.

The first liquid surface sensor 365 and the second liquid surface sensor 366 are disposed with a distance L1 in between in the flowing direction of a hydrophobizing agent pipe 51. The first liquid surface sensor 365 is disposed with a distance L2 from the hydrophobizing agent standby position P1 in the flowing direction of the hydrophobizing agent pipe 51.

The first liquid surface sensor 365 detects whether or not there is the hydrophobizing agent at a first detection position P11 set on the downstream side. The second liquid surface sensor 366 detects whether or not there is the hydrophobizing agent at a second detection position P12 set on the upstream side. The first liquid surface sensor 365 and the second liquid surface sensor 366 are, for example, fiber sensors for liquid detection. The first liquid surface sensor 365 and the second liquid surface sensor 366 are disposed directly attached or disposed closely to an outer peripheral wall of the hydrophobizing agent pipe 51. The first liquid surface sensor 365 and the second liquid surface sensor 366 may be formed by, for example, capacitive sensors.

In the charging step T3 (see FIG. 12B), in accordance with charging (supply) of the hydrophobizing agent, the leading end surface of the hydrophobizing agent inside the hydrophobizing agent pipe 51 is moved from the upstream side to the downstream side. In this case, in a case where the leading end surface of the hydrophobizing agent is retracted to the upstream side of the second detection position P12, neither the first liquid surface sensor 365 nor the second liquid surface sensor 366 detects the hydrophobizing agent. In a case where the hydrophobizing agent is brought forward and the leading end surface of the hydrophobizing agent reaches the second detection position P12, the first liquid surface sensor 365 does not detect the hydrophobizing agent but the second liquid surface sensor 366 detects the hydrophobizing agent. In a case where the hydrophobizing agent is brought forward and the leading end surface of the hydrophobizing agent reaches the first detection position P11, both the first liquid surface sensor 365 and the second liquid surface sensor 366 detect the hydrophobizing agent. The first liquid surface sensor 365 and the second liquid surface sensor 366 send detection outputs thereof to a controller 3.

In the charging step T3 (see FIG. 12B), the controller 3 monitors the detection outputs of the first liquid surface sensor 365 and the second liquid surface sensor 366.

When the detection output of the second liquid surface sensor 366 is brought from an off-state to an on-state, the controller 3 stores a timing of that time. That is, the controller 3 stores a timing when the leading end surface of the hydrophobizing agent has passed through the second detection position P12 on the downstream side.

When the detection output of the first liquid surface sensor 365 is brought from an off-state to an on-state (timing when the leading end surface of the hydrophobizing agent has passed through the first detection position P11), the controller 3 determines the speed of the leading end surface of the hydrophobizing agent passing through the first detection position P11 by computation. Specifically, the controller 3 makes computation of the speed of the leading end surface of the hydrophobizing agent passing through the first detection position P11 based on a time required for moving the leading end surface of the hydrophobizing agent from the second detection position P12 to the first detection position P11 and a distance (distance L1) between the second detection position P12 and the first detection position P11. Based on the computation result, the controller 3 also calculates a timing when the leading end surface of the hydrophobizing agent reaches the hydrophobizing agent standby position P1 placed on the forward side of the first detection position P11 by the distance L2. The controller 3 stops the hydrophobizing agent valve 57 (and/or a first hydrophobizing agent supply valve 60 and a second hydrophobizing agent supply valve 61) at the calculated timing.

According to the third preferred embodiment, based on the timing when the leading end surface of the hydrophobizing agent passes through the first detection position P11 and the speed at which the leading end surface of the hydrophobizing agent passes through the first detection position P11, the leading end surface of the hydrophobizing agent is disposed in the hydrophobizing agent standby position P1. Therefore, it is possible to accurately dispose the leading end surface of the hydrophobizing agent in the hydrophobizing agent standby position P1. Thus, while preventing the hydrophobizing agent from dripping, it is possible to set a short gap between the hydrophobizing agent standby position P1 and the third discharge port 33a. Thereby, it is possible to favorably suppress or prevent mixing of grit and dust into the hydrophobizing agent to be supplied to the substrate W.

Since the leading end surface of the hydrophobizing agent can be accurately disposed in the hydrophobizing agent standby position P1, it is possible to optimize an amount of the hydrophobizing agent to be supplied to the substrate W.

Therefore, it is possible to favorably perform hydrophobizing processing on the substrate W, and to suppress variation of the hydrophobizing processing between the substrates W.

In the third preferred embodiment, a speed detecting unit is formed by the controller 3, the first liquid surface sensor 365, and the second liquid surface sensor 366. The speed of the leading end surface of the hydrophobizing agent passing through the first detection position P11 is detected based on the timing of the leading end surface of the hydrophobizing agent passing through the first detection position P11 (first passing through timing) and the timing of the leading end surface of the hydrophobizing agent passing through the second detection position P12 (second passing through timing). Thereby, it is possible to detect the speed of the leading end surface of the hydrophobizing agent passing through the first detection position P11 with a simple arrangement without providing a speed sensor, etc.

However, a speed sensor arranged to detect the speed of the leading end surface of the hydrophobizing agent passing through the first detection position P11 may be separately provided.

The third preferred embodiment describes the case where the suctioning device formed by the diaphragm type suctioning device (first hydrophobizing agent suctioning device 58) is removed and the suctioning device with adjustable suction force (second hydrophobizing agent suctioning device 263) is provided instead as an example. However, as in the first preferred embodiment, a suctioning device formed by a diaphragm type suctioning device (first hydrophobizing agent suctioning device 58) may be provided.

The third preferred embodiment describes the case where this characteristic applies to the hydrophobizing agent supplying unit 310. However, the characteristic may apply to an organic solvent supplying unit 11.

The three preferred embodiments of the present invention are described above. However, the present invention can also be implemented in other modes.

For example, the above preferred embodiments describe that adjustment by the orifice 72 serving as the flow regulation unit provides setting so that the pressure loss when the liquid flows through the hydrophobizing agent pipe 51 is equal to the pressure loss when the liquid flows through the hydrophobizing agent drain pipe 53. However, as long as the pressure loss when the liquid flows through the hydrophobizing agent pipe 51 and the pressure loss when the liquid flows through the hydrophobizing agent drain pipe 53 are in a fixed relationship and the relationship is grasped by the controller 3, the pressure loss when the liquid flows through the hydrophobizing agent pipe 51 is not necessarily equal to the pressure loss when the liquid flows through the hydrophobizing agent drain pipe 53.

Figure 20:
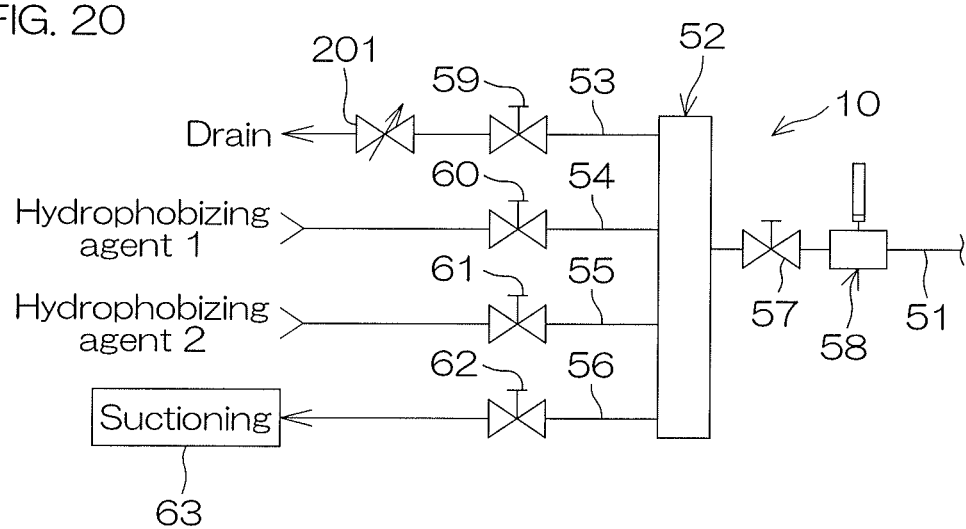
FIG. 20 is a diagram for describing a first modified example.
Figure 21:
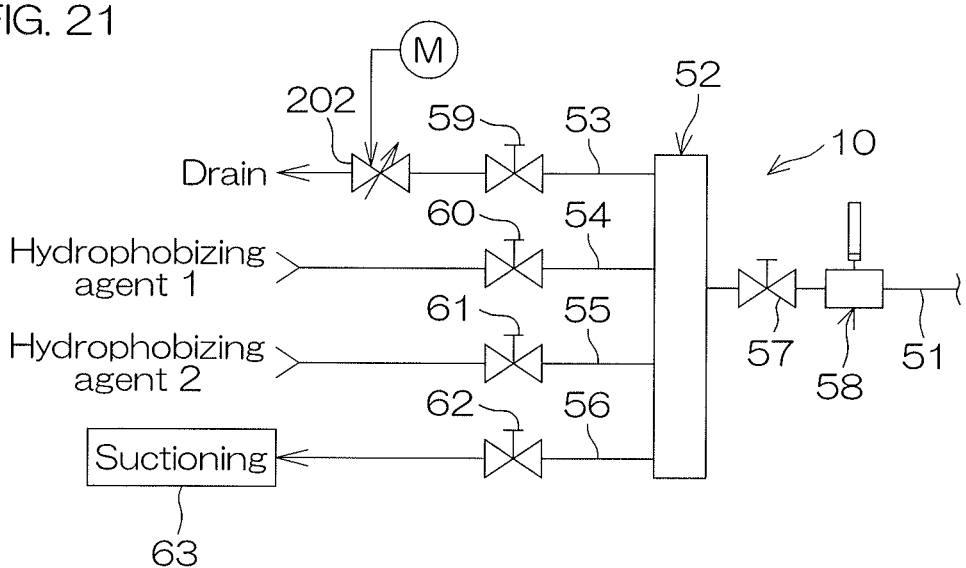
FIG. 21 is a diagram for describing a second modified example.

The above preferred embodiments describe the case where the flow regulation unit is the orifice 72 as an example. However, the flow regulation unit may be a fixed needle 201 as shown in FIG. 20 or may be a motor needle 202 as shown in FIG. 21.

In the above preferred embodiments, the flow regulation unit is not necessarily interposed in the hydrophobizing agent drain pipe 53 but may be interposed in at least one of the hydrophobizing agent drain pipe 53 and the hydrophobizing agent supply pipe (the first hydrophobizing agent supply pipe 54 and the second hydrophobizing agent supply pipe 55).

The second sensor 77 is not necessarily interposed in the hydrophobizing agent drain supply pipe (the first hydrophobizing agent supply pipe 54 and the second hydrophobizing agent supply pipe 55) but may be interposed in at least one of the hydrophobizing agent drain pipe 53 and the hydrophobizing agent drain supply pipe.

The above preferred embodiments describe the example in which the first sensor 64 includes the two sensors of the first existence/non-existence sensor 65 and the second existence/non-existence sensor 66. However, the first sensor 64 may be a liquid surface sensor that detects the position of the leading end surface F1 of the hydrophobizing agent.

The above preferred embodiments describe, as an example, the case where the controller 3 executes both the step of determining whether or not the leading end surface F1 of the hydrophobizing agent is in the hydrophobizing agent standby position P1 by the first sensor 64 (first determining step) in parallel to the charging step T3, and the step of determining whether or not the leading end surface F1 of the hydrophobizing agent after the charging step T3 is disposed in the hydrophobizing agent standby position P1 based on the detection result of the second sensor 77 that detects the flow rate of the hydrophobizing agent supplied to the hydrophobizing agent pipe 51 in the charging step T3 (second determining step). However, at least one of these steps is only required to be executed.

The above preferred embodiments describe that an error is notified and the error processing is performed in a case where the controller 3 determines that the leading end surface F1 of the hydrophobizing agent is not disposed in the hydrophobizing agent standby position P1 after the charging step T3. However, an error may not be notified and the error processing may be not performed but recording to that effect may be made on a log file held in the storage unit 102.

The above preferred embodiments describe that both the discharge suctioning step T1 and the charging step T3 are executed in the preprocessing S1. However, the discharge suctioning step T1 may be executed in the preprocessing S1 and the charging step T3 may be executed in the post processing S3. Alternatively, both the discharge suctioning step T1 and the charging step T3 may be executed in the post processing S3.

The above preferred embodiments describe that the pre-dispensing step T2 is executed between the discharge suctioning step T1 and the charging step T3. However, the pre-dispensing step T2 may be omitted.

The above first preferred embodiment describes the diaphragm type suctioning device as an example of the first hydrophobizing agent suctioning device 58 serving as an example of the first suctioning device. However, in place of this, a siphon type suctioning device may be adopted. The siphon type suctioning device has a pipe and suctions (drains) the hydrophobizing agent inside the hydrophobizing agent pipe 51 by utilizing the siphon principle in a state where the inside of the pipe is filled with a liquid. In the siphon type suctioning device, energy consumption for suctioning is suppressed.

In the first preferred embodiment, in place of the first hydrophobizing agent suctioning device 58 serving as an example of the first suctioning device, a first hydrophobizing agent suctioning device formed by an ejector type suctioning device may be adopted as well as the second hydrophobizing agent suctioning device 63. In this case, by differentiating air pressures and pressure losses of the first hydrophobizing agent suctioning device and the second hydrophobizing agent suctioning device 63 which are both the ejector type suctioning devices, suction force (suction speed) of the first hydrophobizing agent suctioning device is desirably set to be weaker (slower) than suction force (suction speed) of the second hydrophobizing agent suctioning device 63.

In this case, by the ejector type first hydrophobizing agent suctioning device, after stoppage of discharge of the processing liquid, in order to prevent dripping of the processing liquid, the processing liquid is suctioned and the leading end surface F1 of the processing liquid is retracted to the standby position (hydrophobizing agent standby position P1).

In the above preferred embodiments, only one suctioning device may be provided in the hydrophobizing agent supplying unit 10. In this case, for example, the first hydrophobizing agent suctioning device 58 is removed from the hydrophobizing agent supplying unit 10. A flow regulating valve (suction force adjusting unit) arranged to adjust an opening degree of the hydrophobizing agent suction pipe 56 and adjust suction force (suction speed) is interposed in the hydrophobizing agent suction pipe 56. The flow regulating valve may be of an arrangement that includes a valve body inside which a valve seat is provided, a valve element that opens and closes the valve seat, and an actuator that moves the valve element between an opening position and a closing position.

The above preferred embodiments describe that the organic solvent is not charged to the organic solvent pipe 81 in the charging step T3. However, as well as charging (supply) of the hydrophobizing agent to the hydrophobizing agent pipe 51, the organic solvent may be charged (supplied) to the organic solvent pipe 81. Charging of the organic solvent in the charging step T3 is especially useful in a case where the opening action of the organic solvent supply valve 90 is prohibited in the first guard opposing state. This is because when the opening action of the organic solvent supply valve 90 is prohibited in the first guard opposing state, the prior provision of the organic solvent as described in the substrate processing described above cannot be performed.

In the above preferred embodiments, the processing liquid to be supplied or charged to the processing liquid pipe is not limited to the hydrophobizing agent and the organic solvent but may include a chemical liquid and a rinse liquid. That is, the present invention can also apply to the chemical liquid supplying unit 8 and the rinse liquid supplying unit 9.

In the above preferred embodiments, the discharge suctioning step T1 of retracting the leading end surface of the processing liquid (leading end surface F1 of the hydrophobizing agent) to the upstream side (hydrophobizing agent suction pipe 56 side) of the upstream end (portion where the hydrophobizing agent suction pipe 56 is connected) of the connection pipe (first connection pipe 52) is adopted as the second suctioning step. However, it is only required for the second suctioning step that the position of the leading end surface of the processing liquid (leading end surface F1 of the hydrophobizing agent) after suctioning is not in the standby position (hydrophobizing agent standby position P1). The leading end surface of the processing liquid (leading end surface F1 of the hydrophobizing agent) is not necessarily retracted to the upstream side of the upstream end of the connection pipe (first connection pipe 52).

The above preferred embodiments describe the processing liquid pipe in which the discharge port (third discharge port 33a) is formed in the substrate opposing surface 21a. However, a single nozzle not assembled into the shielding plate 21 may also be provided. In this case as well, when a discharge port of the nozzle is immovable in the right/left direction (that is, the direction along the front surface of the substrate W), the present invention can favorably apply to the nozzle.

The above preferred embodiments describe the case where the substrate processing apparatus 1 is an apparatus that processes the disk-shaped substrate W. However, the substrate processing apparatus 1 may be an apparatus that processes a polygonal substrate such as a glass substrate for a liquid crystal display device.

While preferred embodiments of the present invention are described in detail above, these are merely specific examples used to clarify the technical contents of the present invention. The present invention should not be interpreted as being limited to these specific examples and the scope of the present invention is limited only by the appended claims.

The present application respectively corresponds to Japanese Patent Application No. 2017-129539 filed on Jun. 30, 2017 in the Japan Patent Office, Japanese Patent Application No. 2018-114922 filed on Jun. 15, 2018 in the Japan Patent Office, and Japanese Patent Application No. 2018-114923 filed on Jun. 15, 2018 in the Japan Patent Office, and the entire disclosure of these applications is incorporated herein by reference.

REFERENCE SIGNS LIST

1: substrate processing apparatus
2: processing unit
3: controller
4: chamber
5: spin chuck (substrate holding unit)
6: opposing member
10: hydrophobizing agent supplying unit (processing liquid supplying unit)
11: organic solvent supplying unit (processing liquid supplying unit)
21a: substrate opposing surface
33a: third discharge port
34a: fourth discharge port
51: hydrophobizing agent pipe (processing liquid pipe)
56: hydrophobizing agent suction pipe (suction pipe)
58: first hydrophobizing agent suctioning device (first suctioning device)
62: hydrophobizing agent suction valve (suction valve)
63: second hydrophobizing agent suctioning device (second suctioning device)
64: first sensor
65: first existence/non-existence sensor
66: second existence/non-existence sensor
67a: upper limit position
67b: lower limit position
68: first air supply pipe (second drive source)
69: first air supply valve (second drive source)
70: second air supply pipe (first drive source)
71: second air supply valve (first drive source)
72: orifice
73: first flowmeter
74: second flowmeter
77: second sensor
81: organic solvent pipe (processing liquid pipe)
86: organic solvent suction pipe (suction pipe)
88: first organic solvent suctioning device (first suctioning device)
92: organic solvent suction valve (suction valve)
93: second organic solvent suctioning device (second suctioning device)
201: fixed needle
202: motor needle
210: hydrophobizing agent supplying unit (processing liquid supplying unit)
251: hydrophobizing agent pipe (processing liquid pipe)
263: second hydrophobizing agent suctioning device 263A: depressurized state generator
264: camera
276: electropneumatic regulator
310: hydrophobizing agent supplying unit (processing liquid supplying unit)
365: first liquid surface sensor
366: second liquid surface sensor
F1: leading end surface of hydrophobizing agent (leading end surface of processing liquid)
F2: leading end surface of organic solvent (leading end surface of processing liquid)
P1: hydrophobizing agent standby position (standby position)
P11: first detection position
P12: second detection position
P2: organic solvent standby position (standby position)
W: substrate

The invention claimed is:

1. A substrate processing apparatus comprising:
a substrate holding unit that holds a substrate;
a processing liquid pipe that communicates with a discharge port for discharging a processing liquid toward a major surface of the substrate held by the substrate holding unit;
a processing liquid supplying unit for supplying the processing liquid to the processing liquid pipe;
a suctioning unit for suctioning the processing liquid existing inside the processing liquid pipe; and
a controller that controls the processing liquid supplying unit and the suctioning unit, wherein
the controller executes:
a processing liquid supplying step of supplying the processing liquid to the processing liquid pipe by the processing liquid supplying unit in order to discharge the processing liquid from the discharge port; and
a suctioning step of suctioning the processing liquid existing inside the processing liquid pipe by the suctioning unit,
in the suctioning step, the controller selectively executes:
a first suctioning step of retracting a leading end surface of the processing liquid and disposing the leading end surface of the processing liquid after suctioning in a preliminarily set standby position inside the processing liquid pipe such that the leading end surface of the processing liquid is stopped at the standby position; and
a second suctioning step of retracting the leading end surface of the processing liquid further back than the standby position, and
after the second suctioning step, the controller further executes a standby position disposing step of supplying the processing liquid to the processing liquid pipe by the processing liquid supplying unit and disposing the leading end surface of the processing liquid in the standby position such that the leading end surface of the processing liquid is stopped at the standby position,
the substrate processing apparatus further comprising:
a sensor for detecting the processing liquid existing in the processing liquid pipe, wherein
the controller further executes a determining step of determining whether or not the leading end surface of the processing liquid after the standby position disposing step is disposed in the standby position by a detection result by the sensor.

2. The substrate processing apparatus according to claim 1, further comprising:
a connection pipe connected to the processing liquid pipe, wherein
the suctioning unit includes a suction pipe connected to the connection pipe, and a suctioning device connected to the suction pipe, and
in the second suctioning step, the controller executes a step of retracting the leading end surface of the processing liquid to the suctioning device side with respect to the connection position of the suction pipe in the connection pipe by the suctioning device.

3. The substrate processing apparatus according to claim 1, wherein
the discharge port is immovable in the direction along the major surface of the substrate held by the substrate holding unit.

4. The substrate processing apparatus according to claim 3, further comprising:
an opposing member having a substrate opposing surface that opposes the major surface of the substrate held by the substrate holding unit and is immovable in the direction along the major surface of the substrate, wherein
the discharge port is formed in the substrate opposing surface.

5. A substrate processing apparatus comprising:
a substrate holding unit that holds a substrate;
a processing liquid pipe that communicates with a discharge port for discharging a processing liquid toward a major surface of the substrate held by the substrate holding unit;
a processing liquid supplying unit for supplying the processing liquid to the processing liquid pipe;
a suctioning unit for suctioning the processing liquid existing inside the processing liquid pipe; and
a controller that controls the processing liquid supplying unit and the suctioning unit, wherein
the controller executes:
a processing liquid supplying step of supplying the processing liquid to the processing liquid pipe by the processing liquid supplying unit in order to discharge the processing liquid from the discharge port; and
a suctioning step of suctioning the processing liquid existing inside the processing liquid pipe by the suctioning unit,
in the suctioning step, the controller selectively executes:
a first suctioning step of retracting a leading end surface of the processing liquid and disposing the leading end surface of the processing liquid after suctioning in a preliminarily set standby position inside the processing liquid pipe such that the leading end surface of the processing liquid is stopped at the standby position; and
a second suctioning step of retracting the leading end surface of the processing liquid further back than the standby position, and
after the second suctioning step, the controller further executes a standby position disposing step of supplying the processing liquid to the processing liquid pipe by the processing liquid supplying unit and disposing the leading end surface of the processing liquid in the standby position such that the leading end surface of the processing liquid is stopped at the standby position,
the substrate processing apparatus, further comprising:
a first sensor for detecting the leading end surface of the processing liquid existing in the processing liquid pipe, wherein
in the determining step, the controller executes a first determining step of determining whether or not the leading end surface of the processing liquid is in the standby position based on a detection result by the first sensor in parallel to the standby position disposing step.

6. The substrate processing apparatus according to claim 5, wherein
the standby position is an area between a first position and a second position which are determined at a predetermined distance in a flow direction of the processing liquid in the processing liquid pipe, the second position disposed on the discharge port side with respect to the first position, and
the first sensor includes:
a first existence/non-existence sensor for detecting whether or not there is the processing liquid at the first position of the standby position; and
a second existence/non-existence sensor for detecting whether or not there is the processing liquid at the second position of the standby position, and
in the first determining step, the controller determines that the leading end surface of the processing liquid is disposed in the standby position in a case where existence of the processing liquid at the first position is detected by the first existence/non-existence sensor and non-existence of the processing liquid at the second position is detected by the second existence/non-existence sensor.

7. The substrate processing apparatus according to claim 5, wherein
the first sensor includes a camera for taking an image of the leading end surface of the processing liquid existing in the processing liquid pipe, and
in the first determining step, the controller executes a step of making determination based on an imaging result by the camera.

8. A substrate processing apparatus comprising:
a substrate holding unit that holds a substrate;
a processing liquid pipe that communicates with a discharge port for discharging a processing liquid toward a major surface of the substrate held by the substrate holding unit;
a processing liquid supplying unit for supplying the processing liquid to the processing liquid pipe;
a suctioning unit for suctioning the processing liquid existing inside the processing liquid pipe; and
a controller that controls the processing liquid supplying unit and the suctioning unit, wherein
the controller executes:
a processing liquid supplying step of supplying the processing liquid to the processing liquid pipe by the processing liquid supplying unit in order to discharge the processing liquid from the discharge port; and
a suctioning step of suctioning the processing liquid existing inside the processing liquid pipe by the suctioning unit,
in the suctioning step, the controller selectively executes:
a first suctioning step of retracting a leading end surface of the processing liquid and disposing the leading end surface of the processing liquid after suctioning in a preliminarily set standby position inside the processing liquid pipe such that the leading end surface of the processing liquid is stopped at the standby position; and
a second suctioning step of retracting the leading end surface of the processing liquid further back than the standby position, and
after the second suctioning step, the controller further executes a standby position disposing step of supplying the processing liquid to the processing liquid pipe by the processing liquid supplying unit and disposing the leading end surface of the processing liquid in the standby position such that the leading end surface of the processing liquid is stopped at the standby position,
the substrate processing apparatus, further comprising:
a second sensor for detecting a flow rate of the processing liquid flowing through the processing liquid pipe in the standby position disposing step, wherein
the controller further executes a second determining step of determining whether or not the leading end surface of the processing liquid after the standby position disposing step is disposed in the standby position based on a detection result of the second sensor.

9. The substrate processing apparatus according to claim 8, wherein
the processing liquid supplying unit includes:
a processing liquid supply pipe through which the processing liquid is supplied to the processing liquid pipe;
a processing liquid drain pipe to which the processing liquid from the processing liquid supply pipe is supplied selectively with respect to the processing liquid pipe; and
a pipe width adjusting unit for adjusting a width of the processing liquid pipe and/or the processing liquid drain pipe so that a pressure loss of a liquid at the time of flowing through the processing liquid pipe and a pressure loss of the liquid at the time of flowing through the processing liquid drain pipe are in a fixed relationship,
the second sensor is arranged to detect a flow rate of the processing liquid flowing through the processing liquid supply pipe, and
in the second determining step, the controller executes a flow rate acquiring step of, while guiding out the processing liquid from the processing liquid supply pipe not to the processing liquid pipe but to the processing liquid drain pipe, detecting a flow rate of the processing liquid flowing through the processing liquid supply pipe by the second sensor, and acquiring the flow rate of the processing liquid flowing through the processing liquid pipe in the standby position disposing step.

10. The substrate processing apparatus according to claim 9, wherein
the pipe width adjusting unit includes a unit for adjusting the width of the processing liquid pipe and/or the processing liquid drain pipe so that the pressure loss of the liquid at the time of flowing through the processing liquid pipe matches the pressure loss of the liquid at the time of flowing through the processing liquid drain pipe.

11. The substrate processing apparatus according to claim 9, wherein
the pipe width adjusting unit includes an orifice.

12. The substrate processing apparatus according to claim 9, wherein
the pipe width adjusting unit includes a motor needle.

13. The substrate processing apparatus according to claim 9, wherein
the pipe width adjusting unit includes a fixed needle.

14. A substrate processing apparatus comprising:
a substrate holding unit that holds a substrate;
a processing liquid pipe that communicates with a discharge port for discharging a processing liquid toward a major surface of the substrate held by the substrate holding unit;
a processing liquid supplying unit for supplying the processing liquid to the processing liquid pipe;

a suctioning unit for suctioning the processing liquid existing inside the processing liquid pipe; and a controller that controls the processing liquid supplying unit and the suctioning unit, wherein the controller executes:

a processing liquid supplying step of supplying the processing liquid to the processing liquid pipe by the processing liquid supplying unit in order to discharge the processing liquid from the discharge port; and a suctioning step of suctioning the processing liquid existing inside the processing liquid pipe by the suctioning unit, in the suctioning step, the controller selectively executes:

a first suctioning step of retracting a leading end surface of the processing liquid and disposing the leading end surface of the processing liquid after suctioning in a preliminarily set standby position inside the processing liquid pipe such that the leading end surface of the processing liquid is stopped at the standby position; and a second suctioning step of retracting the leading end surface of the processing liquid further back than the standby position, and after the second suctioning step, the controller further executes a standby position disposing step of supplying the processing liquid to the processing liquid pipe by the processing liquid supplying unit and disposing the leading end surface of the processing liquid in the standby position such that the leading end surface of the processing liquid is stopped at the standby position, the substrate processing apparatus, further comprising:

a first liquid surface sensor for detecting that the leading end surface of the processing liquid reaches a predetermined first detection position in the processing liquid pipe; and a speed detecting unit for detecting speed of the processing liquid passing through the processing liquid pipe, wherein in the standby position disposing step, the controller acquires a passing through a timing at which the leading end surface of the processing liquid has passed through the first detection position based on an output of the first liquid surface sensor, and acquires the speed of the leading end surface of the processing liquid detected by the speed detecting unit, and disposes the leading end surface of the processing liquid in the standby position based on the passing through timing and the speed of the processing liquid.

15. The substrate processing apparatus according to claim 14, wherein the speed detecting unit includes a second liquid surface sensor for detecting that the leading end surface of the processing liquid reaches a second detection position set on the downstream side of the first detection position, and the controller detects the speed of the processing liquid passing through the processing liquid pipe based on a first passing through timing at which the leading end surface of the processing liquid has been detected by the first liquid surface sensor, and a second passing through timing at which the leading end surface of the processing liquid has been detected by the second liquid surface sensor.

16. A substrate processing apparatus comprising:

a substrate holding unit that holds a substrate;

a processing liquid pipe that communicates with a discharge port for discharging a processing liquid toward a major surface of the substrate held by the substrate holding unit;

a processing liquid supplying unit for supplying the processing liquid to the processing liquid pipe;

a suctioning unit for suctioning the processing liquid existing inside the processing liquid pipe; and a controller that controls the processing liquid supplying unit and the suctioning unit, wherein the controller executes:

a processing liquid supplying step of supplying the processing liquid to the processing liquid pipe by the processing liquid supplying unit in order to discharge the processing liquid from the discharge port; and a suctioning step of suctioning the processing liquid existing inside the processing liquid pipe by the suctioning unit, in the suctioning step, the controller selectively executes:

a first suctioning step of retracting a leading end surface of the processing liquid and disposing the leading end surface of the processing liquid after suctioning in a preliminarily set standby position inside the processing liquid pipe such that the leading end surface of the processing liquid is stopped at the standby position; and a second suctioning step of retracting the leading end surface of the processing liquid further back than the standby position, and after the second suctioning step, the controller further executes a standby position disposing step of supplying the processing liquid to the processing liquid pipe by the processing liquid supplying unit and disposing the leading end surface of the processing liquid in the standby position such that the leading end surface of the processing liquid is stopped at the standby position, wherein the suctioning unit includes a changeable suctioning unit for suctioning the processing liquid inside the processing liquid pipe with changeable suction force.

17. The substrate processing apparatus according to claim 16, wherein the changeable suctioning unit includes:

a first suctioning device for suctioning the processing liquid inside the processing liquid pipe by a predetermined suction force; and a second suctioning device for suctioning the processing liquid inside the processing liquid pipe by suction force larger than the suction force of the first suctioning device, and the controller executes a switching step of switching a suction source of the processing liquid pipe between the first suctioning device and the second suctioning device.

18. The substrate processing apparatus according to claim 17, wherein the first suctioning device includes a diaphragm type suctioning device.

19. The substrate processing apparatus according to claim 18, further comprising:

a suction pipe connected to the processing liquid pipe, the suction pipe in which the diaphragm type suctioning device is interposed; and an on/off valve for opening and closing the suction pipe, wherein a first drive source for driving the diaphragm type suctioning device and a second drive source for driving the on/off valve are independent of each other.

20. The substrate processing apparatus according to claim 17, wherein
the second suctioning device includes an ejector type suctioning device.

21. The substrate processing apparatus according to claim 16, wherein
the changeable suctioning unit includes an ejector type suctioning device operated by a compressed fluid, and
the suctioning device includes a depressurized state generator to which the compressed fluid is supplied, and an electropneumatic regulator arranged to steplessly change a supply flow rate of the compressed fluid supplied to the depressurized state generator.

22. The substrate processing apparatus according to claim 16, wherein
the controller executes a parallel suctioning step of suctioning the inside of the processing liquid pipe by the changeable suctioning unit in parallel to the standby position disposing step.

23. The substrate processing apparatus according to claim 22, wherein
in the parallel suctioning step, the controller controls the changeable suctioning unit so that suction force to suction the processing liquid pipe by the changeable suctioning unit is larger than suction force by the changeable suctioning unit in the first suctioning step.

24. The substrate processing apparatus according to claim 22, wherein
in the parallel suctioning step, the controller controls the changeable suctioning unit so that the leading end surface of the processing liquid is stopped in the standby position due to balancing between suction force acting on the processing liquid that flows in the processing liquid pipe and supply pressure acting on the processing liquid.

25. A substrate processing apparatus comprising:
a substrate holding unit that holds a substrate;
a processing liquid pipe that communicates with a discharge port for discharging a processing liquid toward a major surface of the substrate held by the substrate holding unit;
a processing liquid supplying unit for supplying the processing liquid to the processing liquid pipe;
a suctioning unit for suctioning the processing liquid existing inside the processing liquid pipe; and
a controller that controls the processing liquid supplying unit and the suctioning unit, wherein
the controller executes:
a processing liquid supplying step of supplying the processing liquid to the processing liquid pipe by the processing liquid supplying unit in order to discharge the processing liquid from the discharge port; and
a suctioning step of suctioning the processing liquid existing inside the processing liquid pipe by the suctioning unit,
in the suctioning step, the controller selectively executes:
a first suctioning step of retracting a leading end surface of the processing liquid and disposing the leading end surface of the processing liquid after suctioning in a preliminarily set standby position inside the processing liquid pipe such that the leading end surface of the processing liquid is stopped at the standby position; and
a second suctioning step of retracting the leading end surface of the processing liquid further back than the standby position, and
after the second suctioning step, the controller further executes a standby position disposing step of supplying the processing liquid to the processing liquid pipe by the processing liquid supplying unit and disposing the leading end surface of the processing liquid in the standby position such that the leading end surface of the processing liquid is stopped at the standby position,
the substrate processing apparatus, further comprising:
a processing unit having the substrate holding unit and a chamber that houses the substrate holding unit, the processing unit being connected to the processing liquid pipe to perform substrate processing on the substrate by using the processing liquid, wherein
the controller executes the standby position disposing step in preprocessing executed before the substrate processing in the processing unit.

26. A substrate processing apparatus comprising:
a substrate holding unit that holds a substrate;
a processing liquid pipe that communicates with a discharge port for discharging a processing liquid toward a major surface of the substrate held by the substrate holding unit;
a processing liquid supplying unit for supplying the processing liquid to the processing liquid pipe;
a suctioning unit for suctioning the processing liquid existing inside the processing liquid pipe; and
a controller that controls the processing liquid supplying unit and the suctioning unit, wherein
the controller executes:
a processing liquid supplying step of supplying the processing liquid to the processing liquid pipe by the processing liquid supplying unit in order to discharge the processing liquid from the discharge port; and
a suctioning step of suctioning the processing liquid existing inside the processing liquid pipe by the suctioning unit,
in the suctioning step, the controller selectively executes:
a first suctioning step of retracting a leading end surface of the processing liquid and disposing the leading end surface of the processing liquid after suctioning in a preliminarily set standby position inside the processing liquid pipe such that the leading end surface of the processing liquid is stopped at the standby position; and
a second suctioning step of retracting the leading end surface of the processing liquid further back than the standby position, and
after the second suctioning step, the controller further executes a standby position disposing step of supplying the processing liquid to the processing liquid pipe by the processing liquid supplying unit and disposing the leading end surface of the processing liquid in the standby position such that the leading end surface of the processing liquid is stopped at the standby position,
the substrate processing apparatus, further comprising:
a processing unit having the substrate holding unit and a chamber that houses the substrate holding unit, the processing unit being connected to the processing liquid pipe to perform substrate processing on the substrate by using the processing liquid, wherein
the controller executes the second suctioning step in preprocessing executed before the substrate processing in the processing unit.

27. A substrate processing apparatus comprising:
a substrate holding unit that holds a substrate;
a processing liquid pipe that communicates with a discharge port for discharging a processing liquid toward a major surface of the substrate held by the substrate holding unit;

a processing liquid supplying unit for supplying the processing liquid to the processing liquid pipe;

a suctioning unit for suctioning the processing liquid existing inside the processing liquid pipe; and a controller that controls the processing liquid supplying unit and the suctioning unit, wherein the controller executes:

a processing liquid supplying step of supplying the processing liquid to the processing liquid pipe by the processing liquid supplying unit in order to discharge the processing liquid from the discharge port; and a suctioning step of suctioning the processing liquid existing inside the processing liquid pipe by the suctioning unit, in the suctioning step, the controller selectively executes:

a first suctioning step of retracting a leading end surface of the processing liquid and disposing the leading end surface of the processing liquid after suctioning in a preliminarily set standby position inside the processing liquid pipe such that the leading end surface of the processing liquid is stopped at the standby position; and a second suctioning step of retracting the leading end surface of the processing liquid further back than the standby position, and after the second suctioning step, the controller further executes a standby position disposing step of supplying the processing liquid to the processing liquid pipe by the processing liquid supplying unit and disposing the leading end surface of the processing liquid in the standby position such that the leading end surface of the processing liquid is stopped at the standby position, the substrate processing apparatus, further comprising:

a processing unit having the substrate holding unit and a chamber that houses the substrate holding unit, the processing unit being connected to the processing liquid pipe to perform substrate processing on the substrate by using the processing liquid, wherein the controller executes the second suctioning step in post processing executed after the substrate processing in the processing unit.

28. A substrate processing apparatus comprising:

a substrate holding unit that holds a substrate;

a processing liquid pipe that communicates with a discharge port for discharging a processing liquid toward a major surface of the substrate held by the substrate holding unit;

a processing liquid supplying unit for supplying the processing liquid to the processing liquid pipe;

a suctioning unit for suctioning the processing liquid existing inside the processing liquid pipe; and a controller that controls the processing liquid supplying unit and the suctioning unit, wherein the controller executes:

a processing liquid supplying step of supplying the processing liquid to the processing liquid pipe by the processing liquid supplying unit in order to discharge the processing liquid from the discharge port; and a suctioning step of suctioning the processing liquid existing inside the processing liquid pipe by the suctioning unit, in the suctioning step, the controller selectively executes:

a first suctioning step of retracting a leading end surface of the processing liquid and disposing the leading end surface of the processing liquid after suctioning in a preliminarily set standby position inside the processing liquid pipe such that the leading end surface of the processing liquid is stopped at the standby position; and a second suctioning step of retracting the leading end surface of the processing liquid further back than the standby position, and after the second suctioning step, the controller further executes a standby position disposing step of supplying the processing liquid to the processing liquid pipe by the processing liquid supplying unit and disposing the leading end surface of the processing liquid in the standby position such that the leading end surface of the processing liquid is stopped at the standby position, the substrate processing apparatus, further comprising:

a processing unit having the substrate holding unit and a chamber that houses the substrate holding unit, the processing unit being connected to the processing liquid pipe to perform substrate processing on the substrate by using the processing liquid, wherein the controller executes the second suctioning step in a case where the substrate processing on a prefixed number of the substrates is ended in the processing unit.

29. The substrate processing apparatus according to claim 1, wherein the controller further executes an error notifying step of notifying of an error in a case where in the determining step, it is determined that the leading end surface of the processing liquid is not disposed in the standby position after the standby position disposing step.

30. The substrate processing apparatus according to claim 1, wherein the controller further executes a step of not executing the standby position disposing step or suspending the standby position disposing step that has already started in a case where in the determining step, it is determined that the leading end surface of the processing liquid is not disposed in the standby position after the standby position disposing step.

\* \* \* \* \*